(12) United States Patent
Watanabe

(10) Patent No.: US 7,932,121 B2
(45) Date of Patent: Apr. 26, 2011

(54) SEMICONDUCTOR DEVICE AND MANUFACTURING METHOD OF THE SAME

(75) Inventor: Naoyuki Watanabe, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 12/749,440

(22) Filed: Mar. 29, 2010

(65) Prior Publication Data

US 2010/0248453 A1    Sep. 30, 2010

Related U.S. Application Data

(62) Division of application No. 11/350,759, filed on Feb. 10, 2006, now Pat. No. 7,719,097.

(30) Foreign Application Priority Data

Nov. 15, 2005 (JP) ................................. 2005-330499

(51) Int. Cl.
   *H01L 21/00* (2006.01)
(52) U.S. Cl. ............. 438/64; 438/68; 438/113; 438/116
(58) Field of Classification Search .................... 438/64, 438/68, 113, 116
   See application file for complete search history.

(56) References Cited

U.S. PATENT DOCUMENTS

| 5,198,685 | A | 3/1993 | Kitani |
|---|---|---|---|
| 6,667,543 | B1 | 12/2003 | Chow |
| 6,825,540 | B2 | 11/2004 | Harazono |
| 7,001,797 | B2 | 2/2006 | Hashimoto |
| 7,095,123 | B2 | 8/2006 | Prior |
| 2002/0131782 | A1 | 9/2002 | Yamaguchi |
| 2003/0098912 | A1 | 5/2003 | Hosokai |
| 2004/0077118 | A1 | 4/2004 | Prior |
| 2004/0161871 | A1* | 8/2004 | Omori ............................ 438/68 |
| 2005/0095835 | A1 | 5/2005 | Humpston |

FOREIGN PATENT DOCUMENTS

| EP | 1 443 755 | 8/2004 |
|---|---|---|
| JP | 62067863 | 3/1987 |
| JP | 10-144898 | 5/1998 |
| JP | 2000-323692 | 11/2000 |
| JP | 2001-85655 | 3/2001 |
| JP | 2001-196487 | 7/2001 |
| JP | 2002-016194 | 1/2002 |
| JP | 2002-329852 | 11/2002 |
| JP | 2003-163342 | 6/2003 |
| JP | 2003-174154 | 6/2003 |

(Continued)

OTHER PUBLICATIONS

Intellectual Property Office, R.O.C., Taiwanese Office Action dated Aug. 27, 2008, issued in corresponding Taiwanese Application No. 94113117. Partial English-language Translation provided.

(Continued)

*Primary Examiner* — Phat X Cao
(74) *Attorney, Agent, or Firm* — Fujitsu Patent Center

(57) ABSTRACT

A semiconductor device includes a semiconductor element, a transparent member separated from the semiconductor element by a designated length and facing the semiconductor element, a sealing member sealing an edge surface of the transparent member and an edge part of the semiconductor element, and a shock-absorbing member provided between the edge surface of the transparent member and the sealing member and easing a stress which the transparent member receives from the sealing member or the semiconductor element.

1 Claim, 46 Drawing Sheets

FOREIGN PATENT DOCUMENTS

| | | |
|---|---|---|
| JP | 2003-197656 | 7/2003 |
| JP | 2003-219284 | 7/2003 |
| JP | 2003179656 | 7/2003 |
| TW | 233685 | 6/2005 |
| TW | 243456 | 11/2005 |
| WO | WO-2005-031875 | 4/2005 |

OTHER PUBLICATIONS

Japan Patent Office, Office Action mailed in connection with corresponding Japanese Patent Application 2005-330499 on Jan. 13, 2008. Partial English-language Translation provided.

SIPO, Office Action issued by the State Intellectual Property Office of the People's Republic of China in connection with corresponding CN patent application No. 2006-100547288 on Jul. 18, 2008. Partial English-language Translation provided.

USPTO, [CAO] "CTFR" Final Rejection mailed Jan. 6, 2009 in §120 parent U.S. Appl. No. 11/350,759.

USPTO, [CAO] "CTNF" Non-Final Rejection mailed Jun. 11, 2008 in §120 parent U.S. Appl. No. 11/350,759.

USPTO, [CAO] "CTNF" Non-Final Rejection mailed Jun. 12, 2009 in §120 parent U.S. Appl. No. 11/350,759.

USPTO, [CAO] "CTRS" Requirement for Restriction/Election mailed Feb. 11, 2008 in §120 parent U.S. Appl. No. 11/350,759.

European Patent Office, Extended Search Report issued in connection with corresponding European Patent Application No. 06002647.3-1528, on Apr. 18, 2008.

Intellectual Property Office, R.O.C., Taiwanese Office Action dated May 28, 2008, issued in corresponding Taiwanese Application No. 95104709. Partial English-language Translation provided.

Japan Patent Office, Office Action mailed in connection with corresponding Japanese Patent Application 2005-330499 on Jan. 13, 2009. Partial English-language Translation provided.

* cited by examiner

SEMICONDUCTOR DEVICE AND MANUFACTURING METHOD OF THE SAME

This application is a divisional application of U.S. patent application Ser. No. 11/350,759, filed Feb. 10, 2006, which claims priority under 35 USC §119 to Japanese Patent Application Serial Number 2005-330499, filed Nov. 15, 2005, the entire contents of each of these applications are expressly incorporated by reference herein.

BACKGROUND OF THE INVENTION

1. Field of the Invention

The present invention generally relates to semiconductor devices and manufacturing methods of the same, and more specifically, to a semiconductor device packaged or forming a module by sealing a semiconductor element and a manufacturing method of the same.

2. Description of the Related Art

A solid-state image sensing device, formed by packaging and modularizing a solid-state image sensor with a transparent member such as glass, a wiring board, a wiring connecting the solid-state image sensor and the wiring board, sealing resin, and others, is well-known. Here, the solid-state image sensing device is, for example, an image sensor such as a Charge Couple Device (CCD), or Complementary Metal Oxide Semiconductor (CMOS).

FIG. 1 is a cross-sectional view of a related art solid-state image sensing device.

Referring to FIG. 1, a solid-state image sensing device 10 has a structure where a solid-state image sensor 8 is mounted on a wiring board 4 having a lower surface where plural bumps 2 are formed, via a die bonding member 6. A large number of micro lenses 9 are provided on an upper surface of the solid-state image sensor 8. The solid-state image sensor 8 is electrically connected to the wiring board 4 by a bonding wire 7.

In addition, a transparent member 1 such as glass is mounted above the solid-state image sensor 8 via a space 3. Parts of the solid-state image sensor 8 and the wiring board 4 where the bonding wires 7 are provided, external circumferential parts of the transparent member 1, and side parts of the spacers 3 are sealed by sealing resin 5.

Thus, the solid-state image sensor 8 is sealed by the transparent member 1 and the sealing resin 5. See Japan Laid-Open Patent Application Publications No. 62-67863, No 2000-323692, and No. 2002-16194.

However, coefficients of thermal expansion of members forming the solid-state image sensing device 10 shown in FIG. 1 are different from each other. For example, the coefficient of thermal expansion of silicon (Si) used as the solid-state image sensor 8 is $3 \times 10^{-6}/°C.$, the coefficient of thermal expansion of glass used as the transparent member 1 is $7 \times 10^{-6}/°C.$, the coefficient of thermal expansion of the sealing resin 5 is $8 \times 10^{-6}/°C.$, and the coefficient of thermal expansion of the wiring board 4 is $16 \times 10^{-6}/°C.$ In addition, for example, the temperature inside of a reflow hearth in a reflow process for mounting a package such as a camera module on the wiring board 4 reaches around 260° C. Heat is applied as a reliability test of the solid-state image sensing device 10. Furthermore, in normal use of the solid-state image sensing device 10, the solid-state image sensing device 10 may be put under atmospheric conditions wherein the temperature in summer may be higher than 80° C.

Accordingly, under the atmospheric conditions wherein such a temperature change is made, the members may expand or contract by heat due to the difference of the coefficients of thermal expansion of the members, so that the transparent member 1 may receive stress from the sealing resin 5 and/or the wiring board 4. As a result of this, an interface of the transparent member 1 and the sealing resin 5, shown by a dotted line in FIG. 1, may peel off, or the transparent member 1 or the solid-state image sensing device 10 may be damaged.

Glass and others used as the transparent member 1 are strong against compression but weak (may be broken) against tension. Therefore, if the transparent member receives tension stress due to the difference of the coefficients of thermal expansion of the sealing resin 5 or the wiring board 4 and the transparent member 1, the transparent member 1 may be broken.

As discussed above, since the coefficient of thermal expansion of the wiring board 4 is greater than the coefficients of thermal expansion of the transparent member 1 and the sealing resin 5, the transparent member 1 and the sealing resin 5 may be pulled (tensioned) due to the thermal expansion of the wiring board 4. As a result of this, the transparent member 4 may be broken.

Because of this, a ceramic board having a smaller coefficient of thermal expansion may be used as the wiring board 4. However, the ceramic board is expensive and use of the ceramic board causes a high price of the solid-state image sensing device 10.

Similarly, in order to prevent the generation of the above-mentioned stress, the wiring board 4 may be formed by the same material as the transparent member 1 such as glass, and the solid-state image sensor 8 may be put between the transparent member 1 such as glass or the wiring board 4 made of glass, so that the members having the same coefficients of thermal expansion may be provided at upper and lower part of the solid-state image sensor 8. However, this structure is not preferable because the wiring board made of glass is also relatively expensive.

In addition, an air part is formed between the transparent member 1 and the solid-state image sensor 8 by the spacers 3 in the solid-state image sensing device 10 shown in FIG. 1. The air part contributes to a light condensing effect by the micro lens 9.

Japan Laid-Open Patent Application Publications No. 2003-197656 and No. 2003-163342 disclose a manufacturing method of the solid-state image sensing device having such an air part. However, in the above-mentioned manufacturing methods, it is necessary to prepare the spacer which fits to the size of the solid-state image sensor, namely a light receiving area. In addition, in the above-mentioned manufacturing methods, in a case where an anti-reflection film (AR coating film) for improving an optical property is provided on the transparent member, it is extremely difficult to form the spacer and a foreign article may become adhered to the transparent member.

SUMMARY OF THE INVENTION

Accordingly, it is a general object of the present invention to provide a novel and useful semiconductor device and manufacturing method of the same.

Another and more specific object of the present invention is to provide a semiconductor device having high reliability whereby destruction of the semiconductor device or members forming the semiconductor device due to the stress generated based on the difference of the coefficients of thermal expansion of the members forming the semiconductor device may be prevented, and a manufacturing method of the semiconductor device.

It is also an object of the present invention to provide a manufacturing method of a semiconductor device whereby the semiconductor device can be easily manufactured without preparing a specific apparatus or member which fits the size of the semiconductor device.

The above object of the present invention is achieved by a semiconductor device, including:

a semiconductor element, a transparent member separated from the semiconductor element by a designated length and facing the semiconductor element, a sealing member sealing an edge surface of the transparent member and an edge part of the semiconductor element, and a shock-absorbing member provided between the edge surface of the transparent member and the sealing member and easing a stress which the transparent member receives from the sealing member or the semiconductor element.

The above object of the present invention is also achieved by a manufacturing method of a semiconductor device, the semiconductor device including a semiconductor element and a transparent member separated from the semiconductor element by a designated length and facing the semiconductor element, the manufacturing method including the steps of:

a) forming a piercing part in the transparent member adhered on an adhesive tape and forming a groove by cutting a part of the adhesive tape corresponding to the piercing part, b) filling in the piercing part and the groove with a material of a shock-absorbing part configured to ease a stress in the transparent member, and curing the material of the shock-absorbing part, c) cutting the material of the shock-absorbing part provided in the piercing part and the groove, and d) peeling off the transparent member from the adhesive tape.

Other objects, features, and advantages of the present invention will be come more apparent from the following detailed description when read in conjunction with the accompanying drawings.

DETAILED DESCRIPTION OF THE PREFERRED EMBODIMENTS

A description is given below, with reference to the FIG. 2 through FIG. 46 of embodiments of the present invention.

For the convenience of explanation, a description of a semiconductor device of an embodiment of the present invention is given with reference to FIG. 2 through FIG. 11, and then a description of a manufacturing method of the semiconductor device of an embodiment of the present invention is given with reference to FIG. 12 through FIG. 46.

[Semiconductor Device]

In the followings, a solid-state image sensing device is explained as an example of a semiconductor device of the present invention.

First, a solid-state image sensing device of a first embodiment of the present invention is discussed with reference to FIG. 2. Here, FIG. 2 is a cross-sectional view of the solid-state image sensing device of the first embodiment of the present invention.

Figure 1:
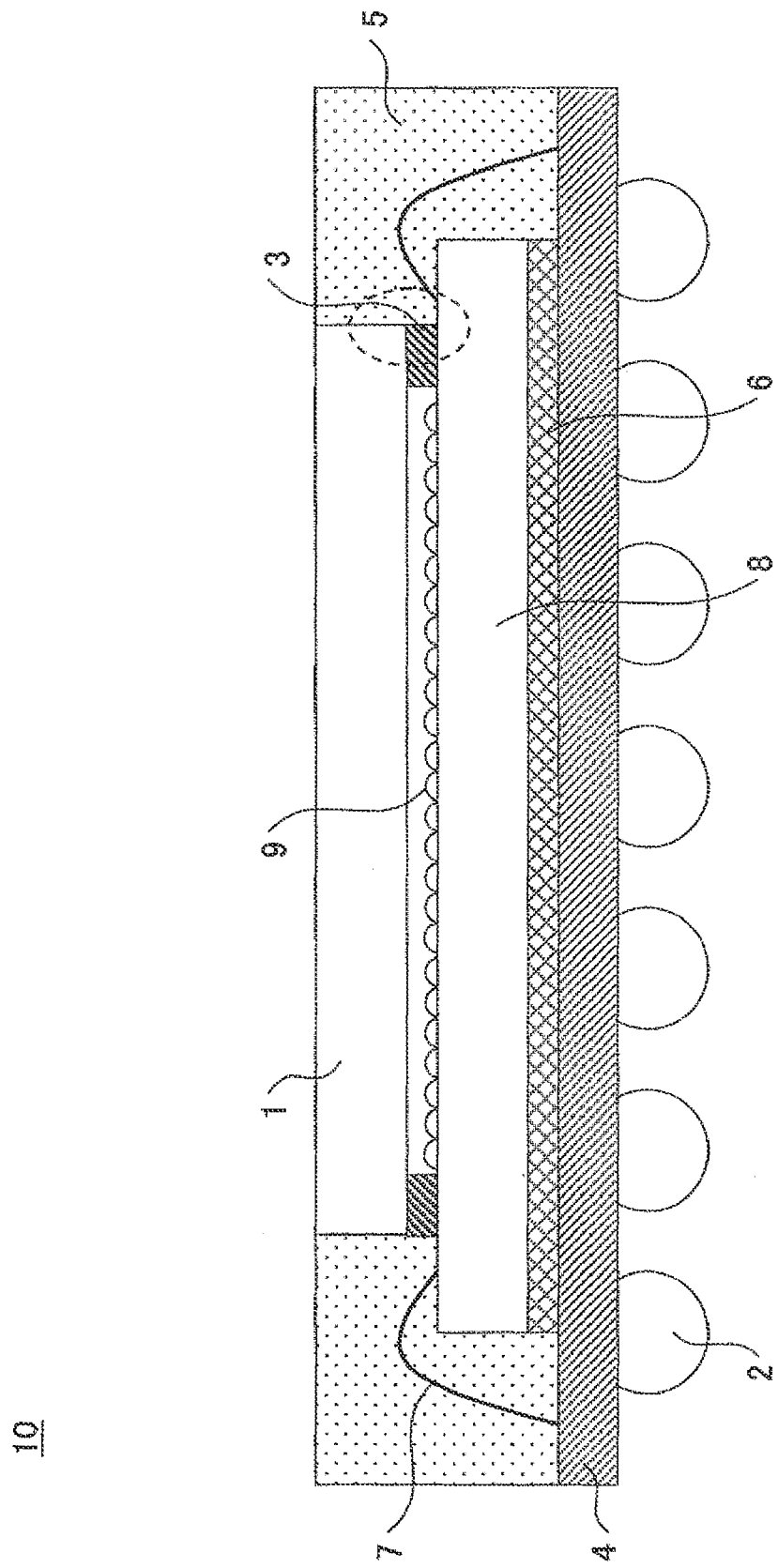
FIG. 1 is a cross-sectional view of a related art solid-state image sensing device.
Figure 2:
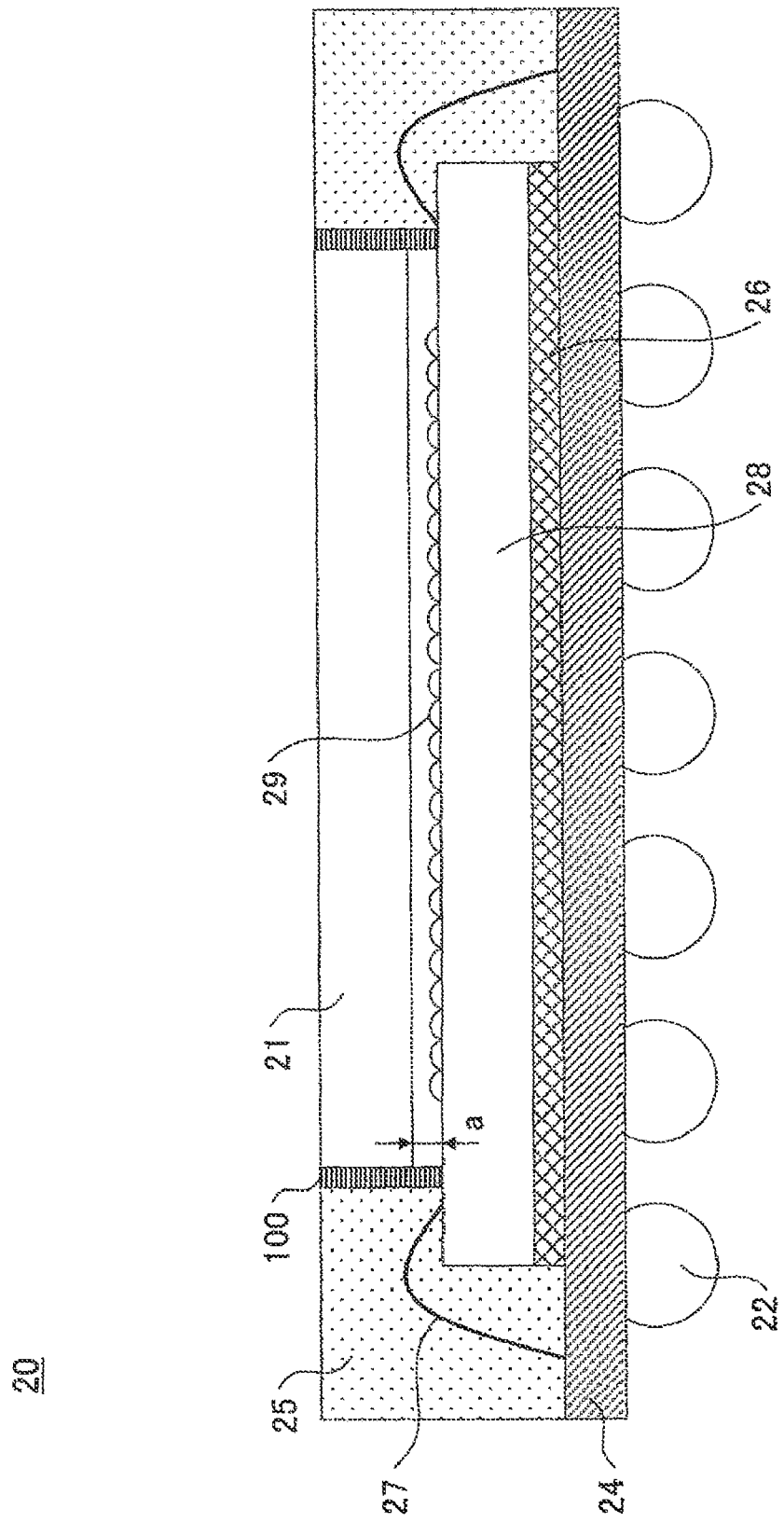
FIG. 2 is a cross-sectional view of a solid-state image sensing device of a first embodiment of the present invention.

Referring to FIG. 2, a solid-state image sensing device 20 has a structure where a solid image sensor 28 as a semiconductor element is packaged (forms a module) with a transparent member 21, a bonding wire 27, a wiring board 24, sealing resin 25, and others. The solid image sensor 28 is sealed by the transparent member 21 and the sealing resin 25. In other words, the solid-state image sensor 28 is mounted on the wiring board 24 having a lower surface where plural outside connection terminals 22 are formed, via a die bonding member 26.

A large number of micro lenses (light receiving lenses) 29 are provided on an upper surface of the solid-state image sensor 28. An electrode of the solid-state image sensor 28 is electrically connected to an electrode of the wiring board 24 by a bonding wire 27.

In addition, the transparent member 21 is provided at an upper part of the solid-state image sensor 28 so as to be separated from the solid-state image sensor 28 at a designated distance "a".

Since the transparent member 21 is separated from the solid-state image sensor 28 at a designated distance "a", an air part is formed between the transparent member 21 and the solid-state image sensor 28.

Because of the difference of indexes of reflection between air and the micro lens 29, light incident through the transparent member 21 is effectively incident on a light receiving element (photo diode) formed on a main surface of the solid-state image sensor 28.

Silicon (Si), for example, can be used as a semiconductor substrate forming the solid-state image sensor 28. Glass, transparent plastic, crystal, quartz, sapphire, or the like can be used as the transparent member 21. However, the present invention is not limited to these examples.

The sealing resin 25 is provided on a part where the bonding wires 27 are provided of the solid-state image sensor 28 and the wiring board 24 so that a top surface of the sealing resin 25 is situated as almost planar with an upper surface of the transparent member 21. Here, the upper surface of the transparent member 21 is opposite to a surface facing the solid-state image sensor 28.

Silicon group resin, acrylic resin, epoxy resin, or the like can be used as the sealing resin 25. However, the present invention is not limited to these examples.

In this embodiment, under this structure, a shock-absorbing member 100 is provided, in an area where the micro lens 29 is not provided on an upper surface of the solid-state image sensor 28, and between the sealing resin 25 and the transparent member 21, that is, between the sealing resin 25 and an external circumferential side surface of the transparent member 21.

A resin material having Young's modulus of approximately 0.1 through 10 GPa, such as epoxy resin, denatured polymer, or denatured silicon, may be used as the shock-absorbing member 100.

When the shock-absorbing member 100 is provided on the external circumferential surface of the transparent member 21, the width (length in upper and lower directions in FIG. 2) of the shock-absorbing member 100 is longer than the width (length in upper and lower directions in FIG. 2) of the transparent member 21 and a designated amount of the shock-absorbing member 100 projects to a side of the solid-state image sensor 28. As a result of this, it is possible to form a distance "a" between the transparent member 21 and the solid-state image sensor 28.

The coefficient of thermal expansion of silicon (Si) used as the solid-state image sensor 28 is $3\times10^{-6}/°$ C., the coefficient of thermal expansion of glass used as the transparent member 21 is $7\times10^{-6}/°$ C., the coefficient of thermal expansion of the sealing resin 25 is $8\times10^{-6}/°$ C., and the coefficient of thermal expansion of the wiring board 24 is $16\times10^{-6}/°$ C.

Although there are differences of the coefficients of thermal expansion as discussed above, a designated stress, given from the sealing resin 25 and the wiring board 24 to the transparent member 21 due to the thermal expansion of the transparent member 21, the sealing resin 25 and the solid-state image sensor 28 and the difference of the coefficients of thermal expansion of the members, can be eased and absorbed by the shock-absorbing member 100.

Accordingly, it is possible to prevent the transparent member 21 or the solid-state image sensing device 20 from being destroyed in a manufacturing process of, a testing step of, or use of the solid-state image sensing device 20. Thus, it is possible to improve the reliability of the solid-state image sensing device 20.

Next, a solid-state image sensing device of a first modified example of the first embodiment of the present invention is discussed with reference to FIG. 3. Here, FIG. 3 is a cross-sectional view of a solid-state image sensing device 30 of the first modified example of the first embodiment of the present invention.

Figure 3:
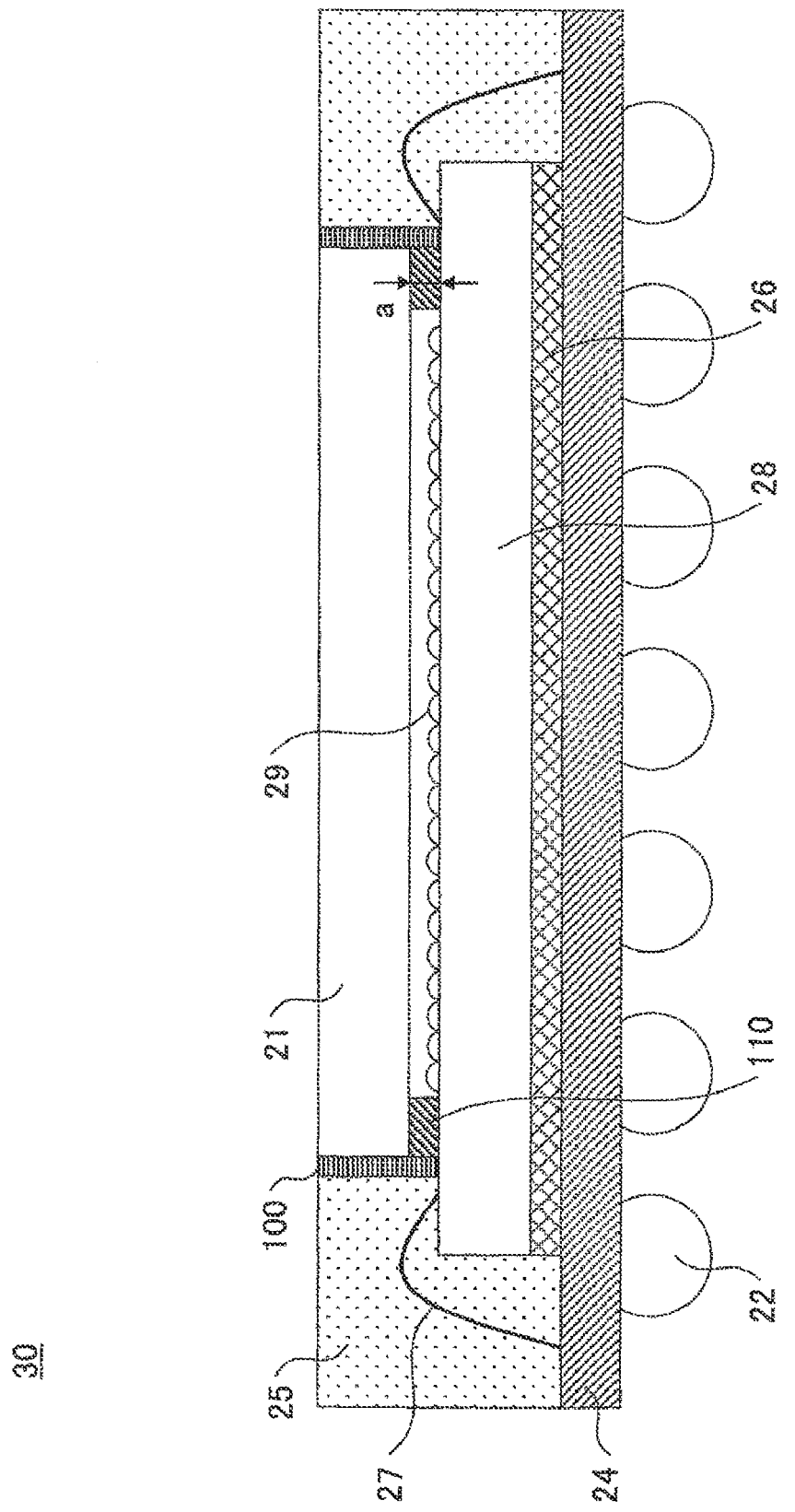
FIG. 3 is a cross-sectional view of a solid-state image sensing device of a first modified example of the first embodiment of the present invention.

Referring to FIG. 3, in the modified example, the shock-absorbing member 100 is provided between the sealing resin 25 and the transparent member 21, that is, between the sealing resin 25 and an external circumferential side surface of the transparent member 21. In addition, a spacer 110 is provided on an area where the micro lens 29 is not provided of an upper surface of the solid-state image sensor 28. The spacer 110 is provided from an inside of a projection part of the shock-absorbing member 100 in a light receiving area direction of the solid-state image sensor 28.

The spacer 110, as well as the projection part of the shock-absorbing member 100, sets a distance "a" between the transparent member 21 and the solid-state image sensor 28, so that an air part can be formed between the transparent member 21 and the solid-state image sensor 28. As a result of this, it is possible to obtain a light condensing effect of the micro lens 29 formed on the solid-state image sensor 28 maximum.

An adhesive layer formed by, for example, epoxy group resin, can be used as the spacer 110. However, the present invention is not limited to this example.

Next, a solid-state image sensing device of a second modified example of the first embodiment of the present invention is discussed with reference to FIG. 4. Here, FIG. 4 is a cross-sectional view of a solid-state image sensing device 40 of the second modified example of the first embodiment of the present invention.

Figure 4:
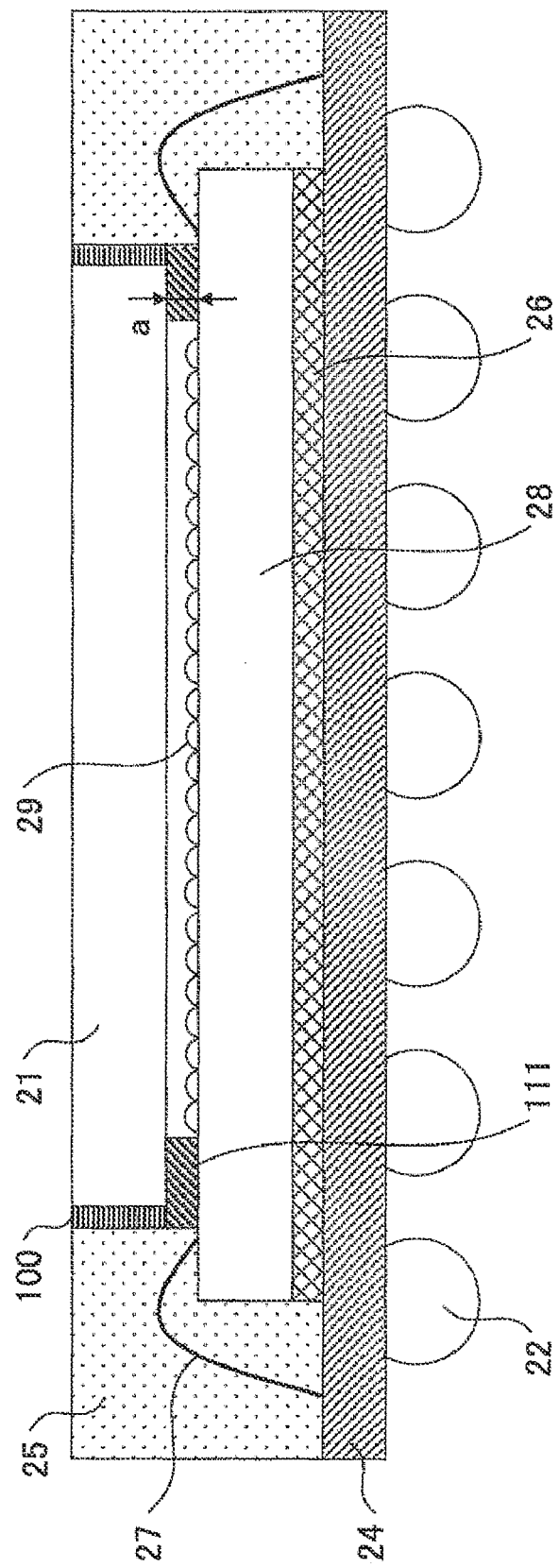
FIG. 4 is a cross-sectional view of a solid-state image sensing device of a second modified example of the first embodiment of the present invention.

Referring to FIG. 4, only a spacer 111 is provided on an area where the micro lens 29 is not provided of an upper surface of the solid-state image sensor 28. In other words, in this modified example, unlike the above-discussed embodiment or the modified example, the shock-absorbing member 100 does not project from the lower surface of the transparent member 21, and the spacer 111 is provided between the transparent member 21 and the solid-state image sensor 28 and between the shock-absorbing member 100 having the same width as the transparent member 21 and the solid-state image sensor 28.

Under this structure, an air part can be formed between the transparent member 21 and the solid-state image sensor 28 by the spacer 111. As a result of this, it is possible to obtain a maximum light condensing effect of the micro lens 29 formed on the solid-state image sensor 28.

Next, a solid-state image sensing device of a third modified example of the first embodiment of the present invention is discussed with reference to FIG. 5. Here, FIG. 5 is a cross-sectional view of a solid-state image sensing device 50 of the third modified example of the first embodiment of the present invention.

Figure 5:
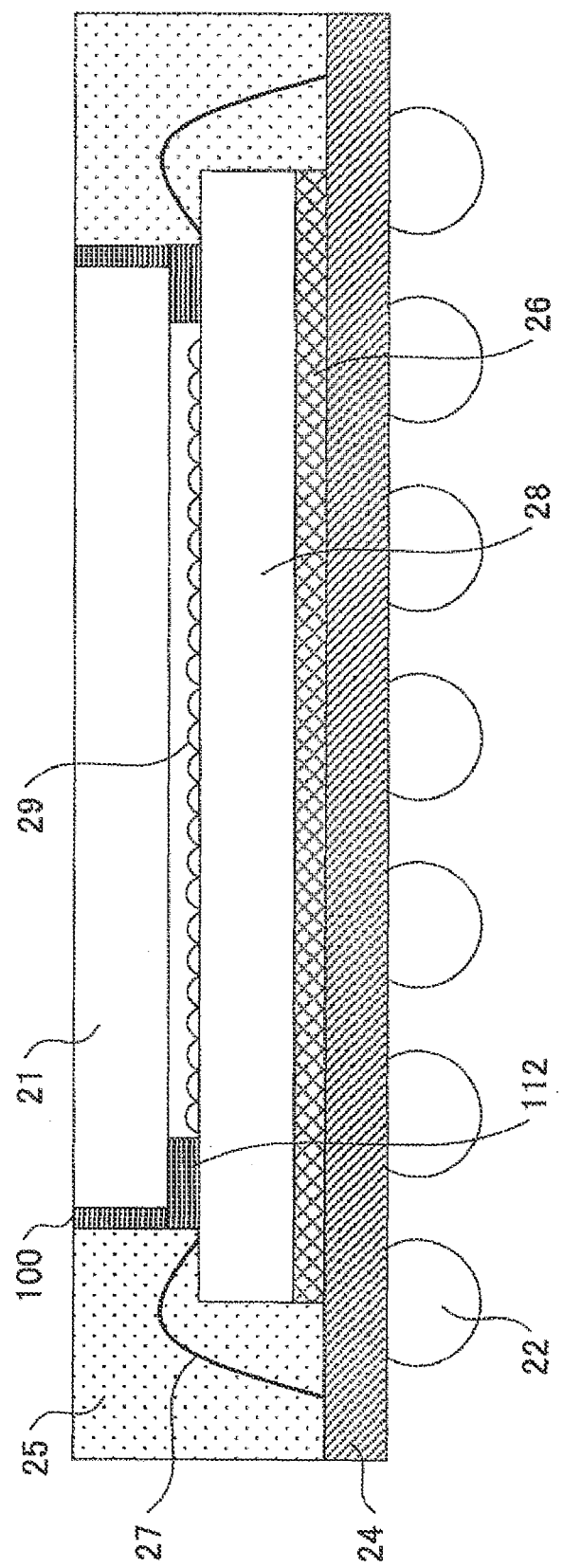
FIG. 5 is a cross-sectional view of a solid-state image sensing device of a third modified example of the first embodiment of the present invention.

Referring to FIG. 5, the same material as the shock-absorbing member 100 is used as the spacer 112. In other words, a member made of a material the same as the shock-absorbing member 100 provided between the sealing resin 25 and a circumferential side surface (edge surface) of the transparent member 21 as the spacer 112 is provided between the transparent member 21 and the solid-state image sensor 20.

As discussed above, there is a difference of the coefficients of thermal expansion between the solid-state image sensor 28 and the transparent member 21. Therefore, stress based on the difference of such coefficient of thermal expansion may be generated between the solid-state image sensor 28 and the transparent member 21.

In this example, since the same material as the shock-absorbing member 100 is used as the spacer 112 forming an air part between the solid-state image sensor 28 and the transparent member 21, it is possible effectively prevent the destruction of the transparent member 21 due to the stress from the solid-state image sensor 28.

Furthermore, since the same material as the shock-absorbing member 100 provided between the circumferential side surface of the transparent member 21 and the sealing resin 25 is used as the spacer 112 provided between the transparent member 21 and the solid-state image sensor 28, it is possible to reduce the manufacturing cost of the solid-state image sensing device 50.

Figure 6:
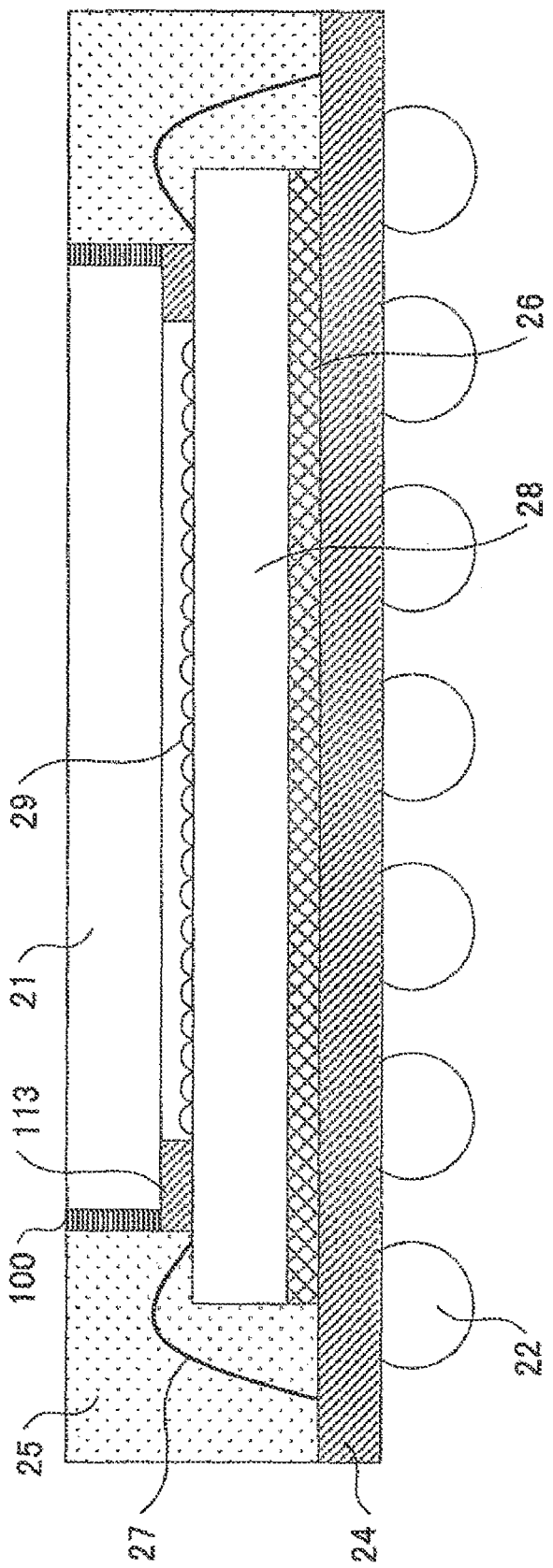
FIG. 6 is a cross-sectional view of a solid-state image sensing device of a fourth modified example of the first embodiment of the present invention.

Next, a solid-state image sensing device of a fourth modified example of the first embodiment of the present invention is discussed with reference to FIG. 6. FIG. 6 is a cross-sectional view of a solid-state image sensing device 60 of the fourth modified example of the first embodiment of the present invention.

Referring to FIG. 6, a spacer 113 is made of a material having a Young's modulus different from that of the shock-absorbing member 100 provided between the circumferential side surface (edge surface) of the transparent member 21 and the sealing resin 25.

As discussed above, the difference of the coefficients of thermal expansion between the solid state image sensor 28 and the transparent member 21 is different from the difference of the coefficients of thermal expansion between the sealing resin 25 and the transparent member 21. Therefore, if the differences of the coefficients of thermal expansion of the members are different from each other, amounts of the stress generated based on the differences of the coefficients of thermal expansion are different.

Thus, in this example, the shock-absorbing member 100 is provided between the edge surface of the transparent member 21 and the sealing resin 25. The spacer 113 forming a space between the solid-state image sensor 28 and the transparent member 21 is made of the material having the different Young's modulus of the shock-absorbing member 100 provided.

Under this structure, even if the difference of the coefficients of thermal expansion between the solid state image sensor 28 and the transparent member 21 is different from the difference of the coefficients of thermal expansion between the sealing resin 25 and the transparent member 21, it is possible to ease and absorb the stress generated due to the difference of the coefficients of thermal expansion between the members so that the destruction of the transparent member 21 and others can be prevented.

Next, a solid-state image sensing device of a second embodiment of the present invention is discussed with reference to FIG. 7. Here, FIG. 7 is a cross-sectional view of a solid-state image sensing device of a fourth modified example of a second embodiment of the present invention.

In the following explanations, parts that are the same as the parts shown in the above-referred drawings are given the same reference numerals, and explanation thereof is omitted.

Figure 7:
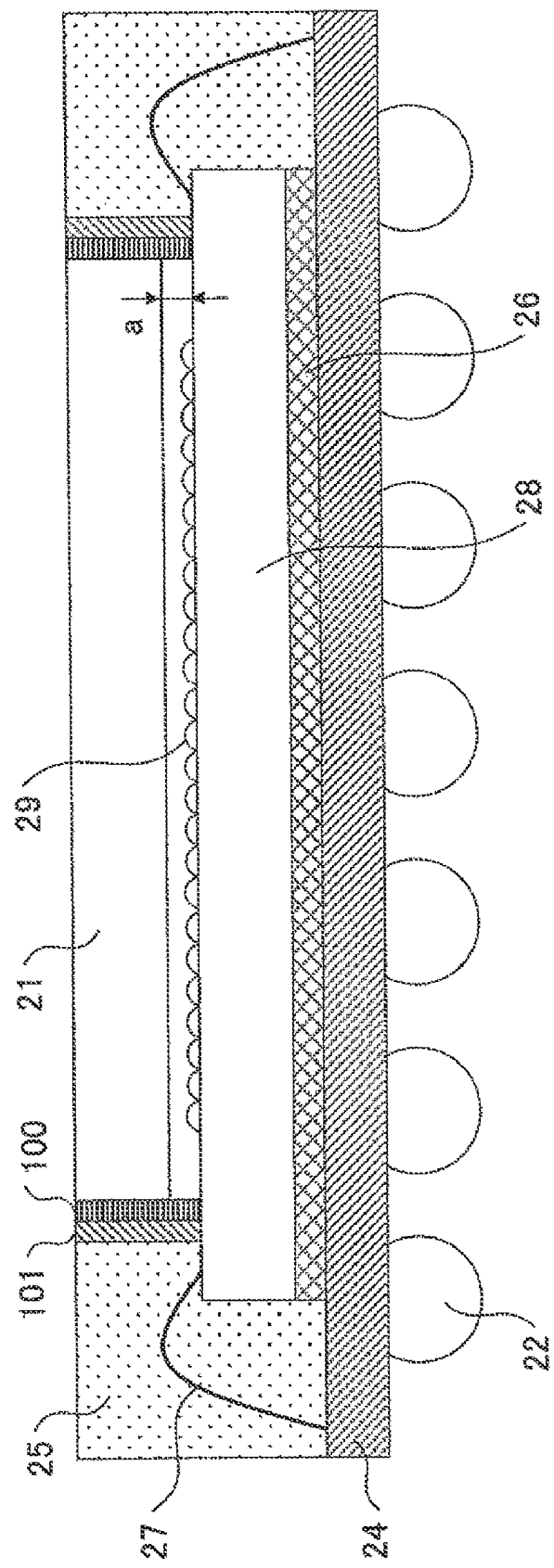
FIG. 7 is a cross-sectional view of a solid-state image sensing device of a second embodiment of the present invention.

Referring to FIG. 7, in the solid-state image sensing device 70 of the second embodiment, a second shock-absorbing member 101 is provided at an external circumferential part of the shock-absorbing member 100 ("the first shock-absorbing member 100" in the following explanation of this embodiment), namely between the sealing resin 25 and a circumferential side surface (edge surface) of the transparent member 21. The Young's modulus of the second shock-absorbing member 101 is different from that of the first shock-absorbing member 100.

When the shock-absorbing members 100 and 101 are provided on the external circumferential surface of the transparent member 21, a width (length in upper and lower directions in FIG. 7) of the shock-absorbing members 100 and 101 is longer than the width (length in upper and lower directions in FIG. 7) of the transparent member 21, and a designated amount of the shock-absorbing members 100 and 101 projects to a side of the solid-state image sensor 28. As a result of this, it is possible to form a distance "a" between the transparent member 21 and the solid-state image sensor 28.

A resin material having Young's modulus of approximately 0.1 through 10 GPa, such as epoxy resin, denatured polymer, or denatured silicon, may be used as the first and second shock-absorbing members 100 and 101. However, in a case where a material having Young's modulus of approximately 1 GPa, such as epoxy resin, is used as the first shock-absorbing members 100, it is preferable to use a resin material having Young's modulus of approximately 0.1 GPa, such as denatured polymer, or denatured silicon, as the second shock-absorbing members 101.

In other words, it is preferable that the Young's modulus of the second shock-absorbing members 101 be less than the Young's modulus of the first shock-absorbing member 100. As discussed above, since the coefficient of thermal expansion of the sealing resin 25 is greater than the coefficient of thermal expansion of the transparent member 21, the vicinity of the interface of the sealing resin 25 and the transparent member 21 may receive a bigger stress. Hence, it is preferable that the second shock-absorbing member 101 which may be easily deformed and has a Young's modulus less than the Young's modulus of the first shock-absorbing member 100 be provided at a side of the sealing resin 25, namely a side where the big stress is generated due to the large coefficient of thermal expansion.

While two kinds of shock-absorbing members, that is the first and second shock-absorbing members 100 and 101, are provided in a structure shown in FIG. 7, a structure of the shock-absorbing members provided between the sealing resin 25 and the transparent member 21 is not limited to this example. It is possible to effectively ease the stress generated based on the difference of the coefficients of thermal expansion of the sealing resin 25 and the transparent member 21 by selecting the kinds and/or the number of the shock-absorbing members provided between the sealing resin 25 and the transparent member 21.

Next, a solid-state image sensing device of a third embodiment of the present invention is discussed with reference to FIG. 8. Here, FIG. 8 is a cross-sectional view of a solid-state image sensing device of the third embodiment of the present invention.

Figure 8:
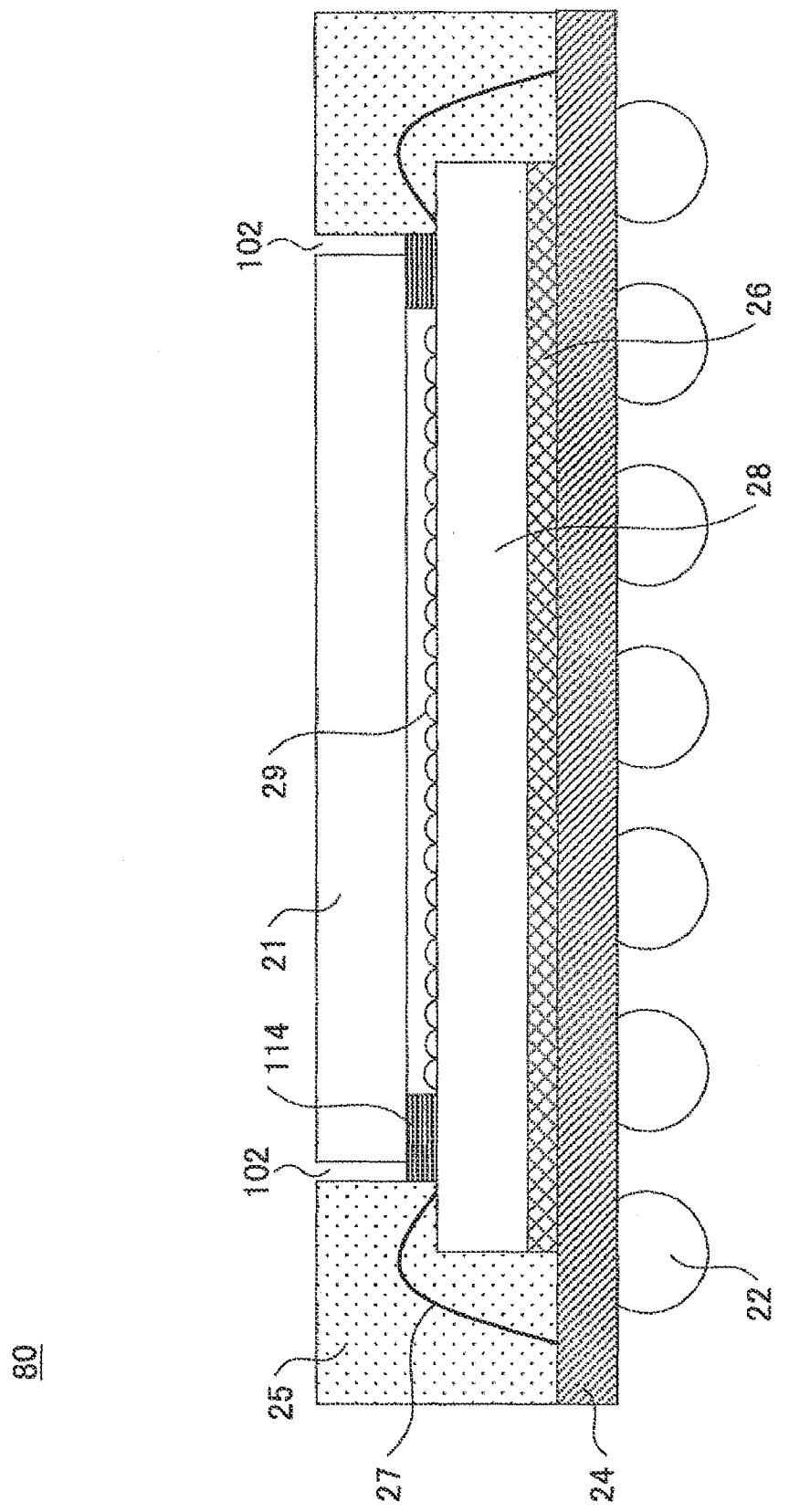
FIG. 8 is a cross-sectional view of a solid-state image sensing device of a third embodiment of the present invention.

Referring to FIG. 8, in the solid-state image sensing device 80 of the third embodiment, the shock-absorbing member 100 is not provided between the sealing resin 25 and the circumferential side surface (edge surface) of the transparent member 21. Instead, an air space 102 is formed along the circumferential side surface (edge surface) of the transparent member 21 between the sealing resin 25 and the circumferential side surface (edge surface) of the transparent member 21.

Since the air space 102 is formed between the sealing resin 25 and the circumferential side surface (edge surface) of the transparent member 21, even if the temperature is changed, it is possible to prevent the generation of the stress due to the difference of the coefficients of thermal expansion of the sealing resin 25 and the transparent member 21. Therefore, it is possible to prevent the destruction of the solid-state image sensing device 80 and avoid the interference between the sealing resin 21 and the transparent member 25 so that reliability of the solid-state image sensing device 80 can be improved. That is, the space 102 functions the same as the shock-absorbing member 100.

On the other hand, a spacer 114 is provided between the transparent member 21 and the solid-state image sensor 28 so that a space is formed between the transparent member 21 and the solid-state image sensor 28 by the spacer 114. As a result of this, it is possible to obtain a light condensing effect of the micro lens 29 formed on the solid-state image sensor 28 maximum by the air in the space.

In addition, it is possible to prevent the generation of the stress based on the difference of the coefficients of thermal expansion of the transparent member 21 and the solid-state image sensor 28 by forming the spacer 114 with the shock-absorbing members. As a result of this, it is possible to avoid the interference between the sealing resin 21 and the solid-state image sensor 28.

Next, a solid-state image sensing device of a fourth embodiment of the present invention is discussed with reference to FIG. 9. Here, FIG. 9 is a cross-sectional view of a solid-state image sensing device of the fourth embodiment of the present invention.

Figure 9:
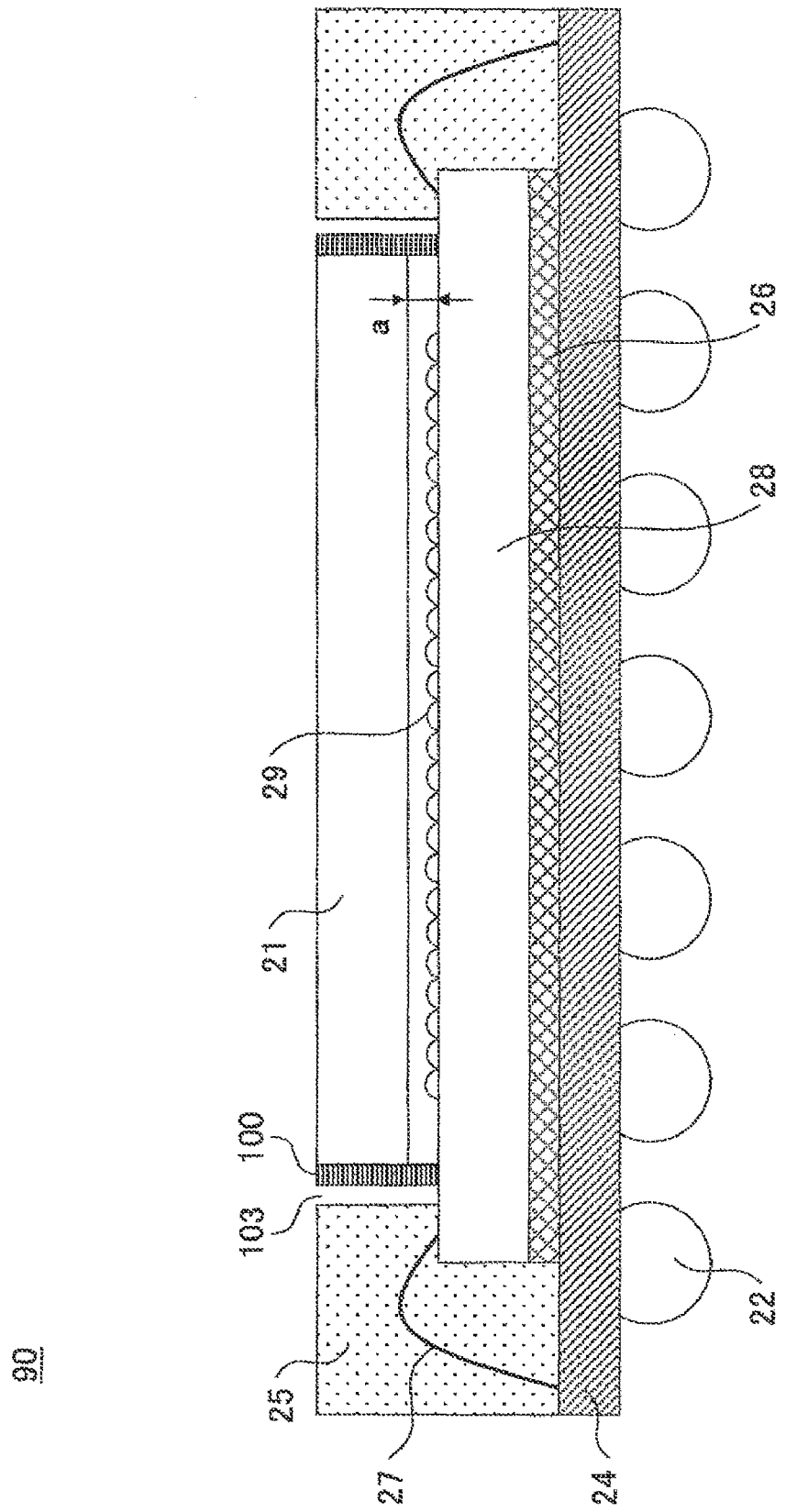
FIG. 9 is a cross-sectional view of a solid-state image sensing device of a fourth embodiment of the present invention.

Referring to FIG. 9, in the solid-state image sensing device 90 of the fourth embodiment, a space 103 having a groove shape is provided between the sealing resin 25 and the shock-absorbing member 100 provided at the circumferential side surface (edge surface) of the transparent member 21.

Because of the above-mentioned space 103, even if the temperature is changed, it is possible to prevent the generation of the stress due to the difference of the coefficients of thermal expansion of the sealing resin 25 and the transparent member 21. Therefore, it is possible to prevent the destruction of the solid-state image sensing device 80 and avoid the interference between the sealing resin 21 and the transparent member 25 so that reliability of the solid-state image sensing device 80 can be improved.

In this embodiment as well as the above-discussed first embodiment, when the shock-absorbing member 100 is provided on the external circumferential surface of the transparent member 21, a width (length in upper and lower directions in FIG. 7) of the shock-absorbing member 100 is longer than the width (length in upper and lower directions in FIG. 7) of the transparent member 21 and a designated amount of the shock-absorbing member 100 projects to a side of the solid-state image sensor 28. As a result of this, it is possible to form a distance "a" between the transparent member 21 and the solid-state image sensor 28.

In addition, by the shock-absorbing member 100, it is possible to avoid the deformation of an image sensor side (lower side) of the transparent member 21 due to the difference of the coefficients of thermal expansion of the solid-state image sensor 28 and the transparent member 21 or the destruction of the transparent member 21 due to the stress from the solid-state image sensor 28.

Next, a solid-state image sensing device of a fifth embodiment of the present invention is discussed with reference to FIG. 10. Here, FIG. 10 is a cross-sectional view of a solid-state image sensing device of the fifth embodiment of the present invention.

Figure 10:
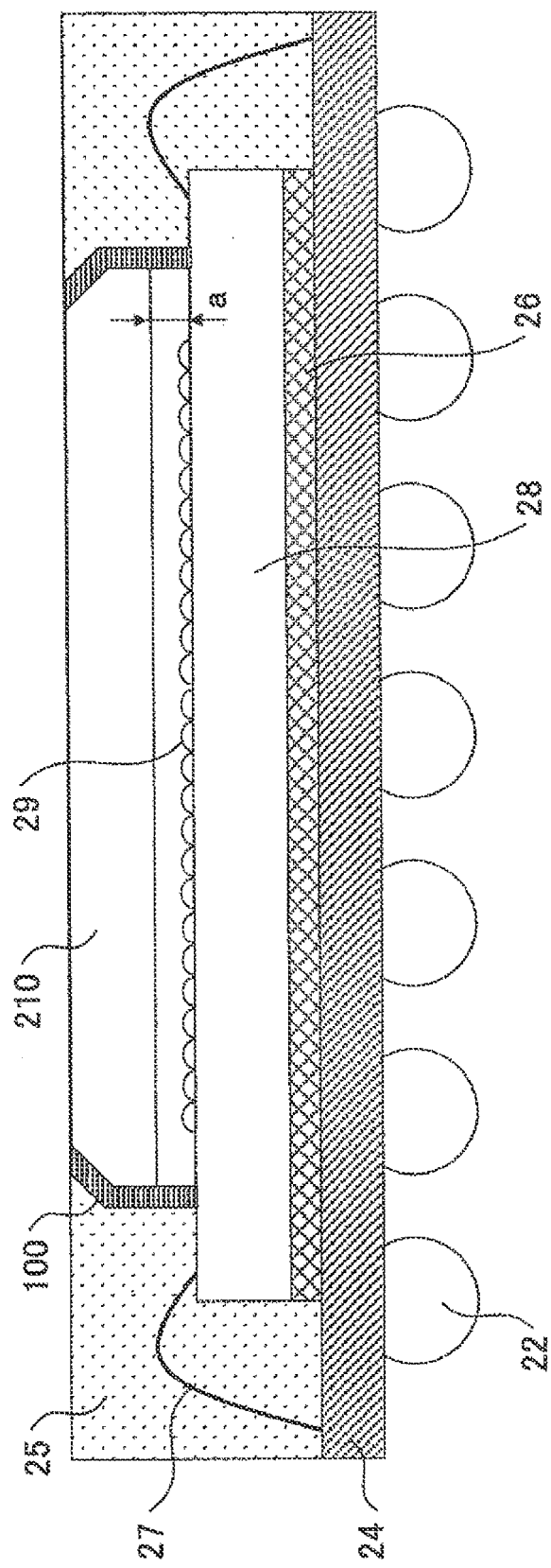
FIG. 10 is a cross-sectional view of a solid-state image sensing device of a fifth embodiment of the present invention.

Referring to FIG. 10, in the solid-state image sensing device 120 of the fourth embodiment, an external circumferential side surface of the transparent member 210 is tilted upward toward the center of the transparent member 210. In addition, the shock-absorbing member 100 is provided along the inclination of the transparent member 210 between the sealing resin 25 and the transparent member 210.

Accordingly, the sealing resin 25 and the transparent member 210 are fixed to each other via the shock-absorbing member 100. The external circumferential side surface of the transparent member 210 is covered with the sealing resin 25 via the shock-absorbing member 100. In other words, the sealing resin 25 covers the external circumferential side surface of the transparent member 210 from an oblique upward side of the transparent member 210.

Therefore, even if pressure is applied to the transparent member 210, it is possible to avoid the transparent member 210 coming out from a designated position. In addition, even if the transparent member 210 receives the stress from the sealing resin 25, it is difficult for the transparent member 210 to be broken. Hence, the reliability of the solid-state image sensing device 120 can be improved.

Furthermore, as discussed above, the external circumferential side surface of the transparent member 210 is tilted upward toward the center of the transparent member 210, and the shock-absorbing member 100 is provided on the circumferential side surface (edge surface) of the transparent member 210 along the inclination of the transparent member 210. Accordingly, a wide space is formed above the electrode part of the wiring board 24 and the solid-state image sensor 28.

Therefore, in assembly of the solid-state image sensing apparatus 120, when the electrode of the solid-state image sensor 28 and the electrode of the wiring board 24 are connected by the bonding wire 27, it is possible to prevent the contact of a bonding capillary and the circumferential side surface (edge surface) of the transparent member 210 so that the bonding process can be implemented properly and efficiently.

Next, a solid-state image sensing device of a sixth embodiment of the present invention is discussed with reference to FIG. 11. Here, FIG. 11 is a cross-sectional view of a solid-state image sensing device of the sixth embodiment of the present invention.

Figure 11:
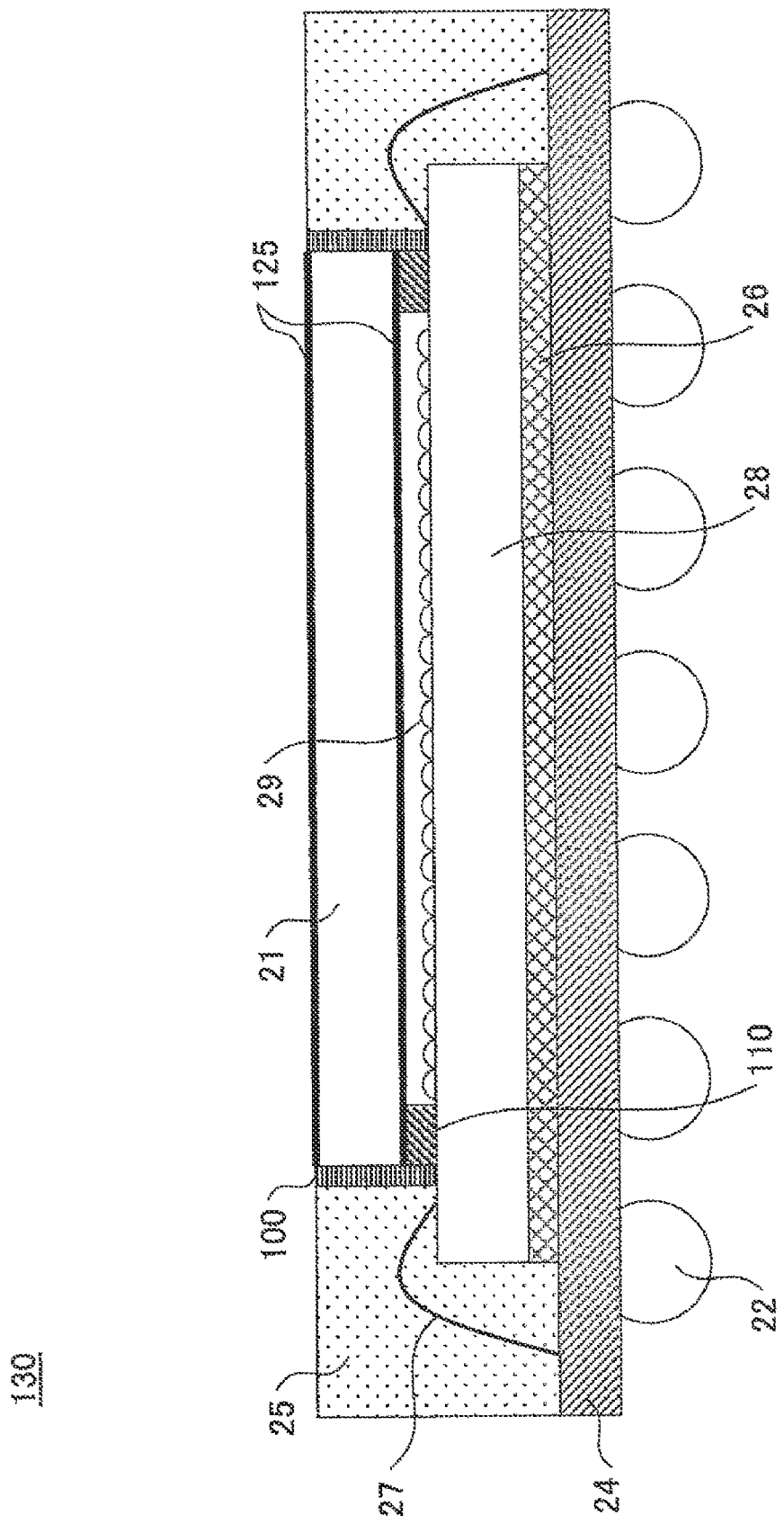
FIG. 11 is a cross-sectional view of a solid-state image sensing device of a sixth embodiment of the present invention.

Referring to FIG. 11, in the solid-state image sensing device 130 of the fourth embodiment, the shock-absorbing member 100 is provided, for example, between the sealing resin 25 and the transparent member 21, that is, between the sealing resin 25 and the external circumferential side surface of the transparent member 21. In addition, a spacer 110 is provided in an area where the micro lens 29 is not provided of an upper surface of the solid-state image sensor 28, in a light receiving area direction of the solid-image sensor 28 from a projection part of the shock-absorbing member 100.

Under the above-mentioned structure, a surface process is performed on both surfaces of the transparent member 21. A covering film 125 such as an infrared (IR) filter, a low pass filter, or an anti-reflection film (AR coating film) is formed on a main surface (a light transmission surface).

It is possible to improve the permeability of the transparent member 21 by providing the covering film 125 on the surface of the transparent member 21, so that an optical property of the solid-state image sensor 130 can be improved.

[Manufacturing Method of Semiconductor Device]

Next, a manufacturing method of the above-discussed solid-state image sensing device as an example of a manufacturing method of a semiconductor device of the present invention is discussed.

First, a manufacturing method of the solid-state image sensing device 20 shown in FIG. 2 is discussed as a seventh embodiment of the present invention with reference to FIG. 12 through FIG. 19. Here, FIG. 12 through FIG. 19 are views (part 1 through part 8) for explaining a manufacturing method of the solid-state image sensing device shown in FIG. 2, of the seventh embodiment of the present invention.

Figure 12:
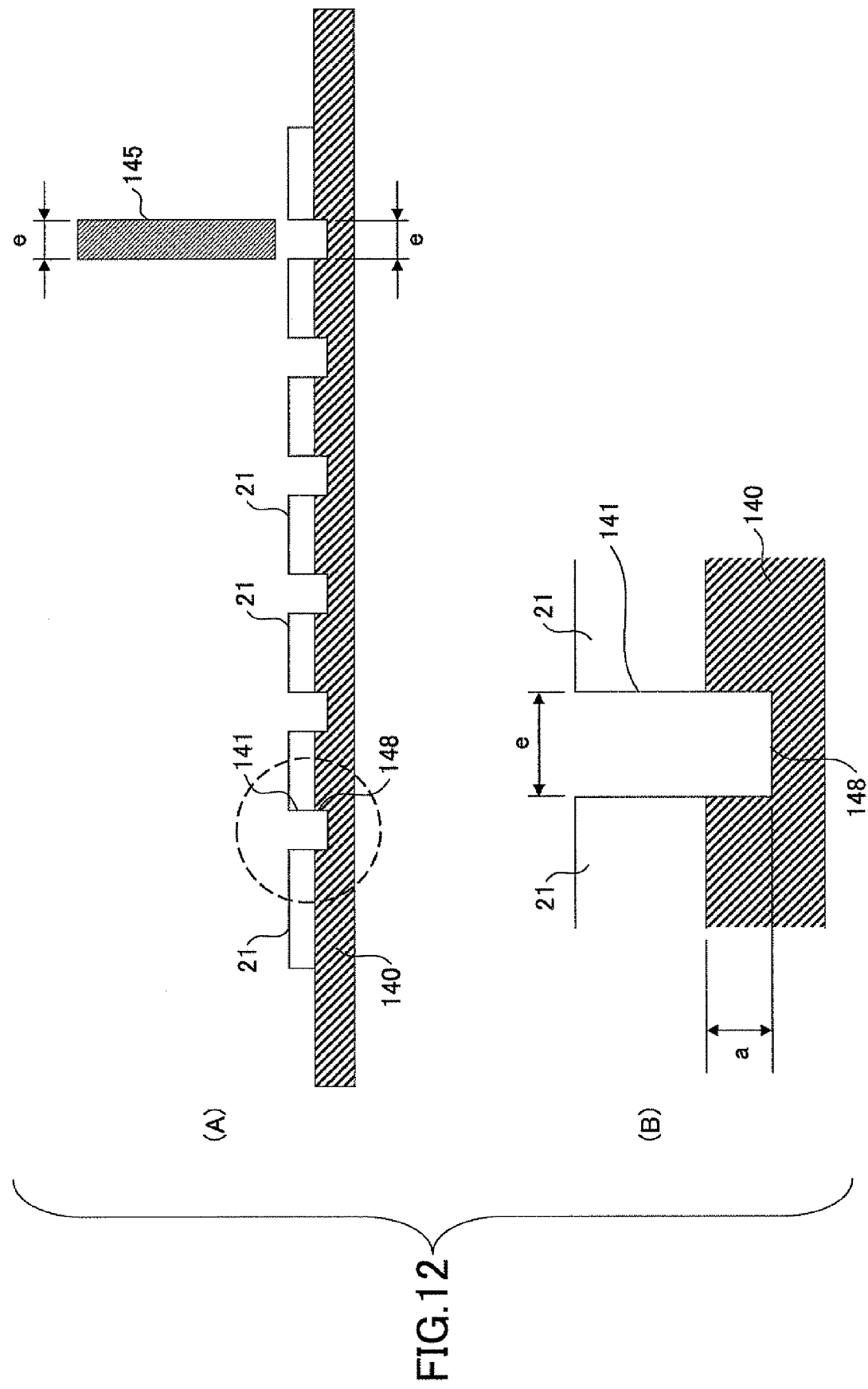
FIG. 12 is a view (part 1) for explaining a manufacturing method of the solid-state image sensing device shown in FIG. 2, of a seventh embodiment of the present invention.

Referring to FIG. 12-(A), a cutting process using a first cutting blade 145 having a cutting edge thickness "e" is applied to a transparent plate adhered on the main surface of a dicing tape 140 and the dicing tape 140, so that the transparent member is divided into plural transparent members 21 by a piercing hole 141 and plural grooves 148 are formed in the dicing tape 140.

FIG. 12-(B) is an enlarged view of a part surrounded by a dotted line in FIG. 12-(A).

An ultraviolet curing type adhesive tape may be used as the dicing tape 140, so that an adhesive force is reduced by irradiation of the ultraviolet rays.

The transparent plate is pierced and cut by the first cutting blade 145 such as a diamond blade (diamond saw) rotated at high speed so that the piercing hole 141 is formed. In addition, the dicing tape 140 is cut to a depth "a" between the transparent member 21 and the solid-state image sensor 28 shown in FIG. 2, namely a height "a" of the space formed between the transparent member 21 and the solid-state image sensor 28, so that the groove 148 is formed.

The transparent member 21 is, for example, made of a glass plate. The transparent plate is cut by the first cutting blade 145 so that the transparent member 21 has a configuration and an area corresponding to a light receiving area of the solid-state image sensor as a semiconductor element.

In a case where a plan configuration of the transparent member 21 is rectangular-shaped, the transparent plate on the dicing tape is cut in directions crossing at right angles to each other, namely X direction and Y direction, by the cutting blade so that plural transparent members 21 are separated in the X direction and Y direction.

The configuration of the transparent member 21 is selected as corresponding to the configuration of the solid-state image sensor 28, the configuration of the light receiving area of the solid-state image sensor 29, the way of use of the semiconductor device 20, or the like. Accordingly, the cutting configuration of the transparent member 21 is selected based on this.

Figure 13:
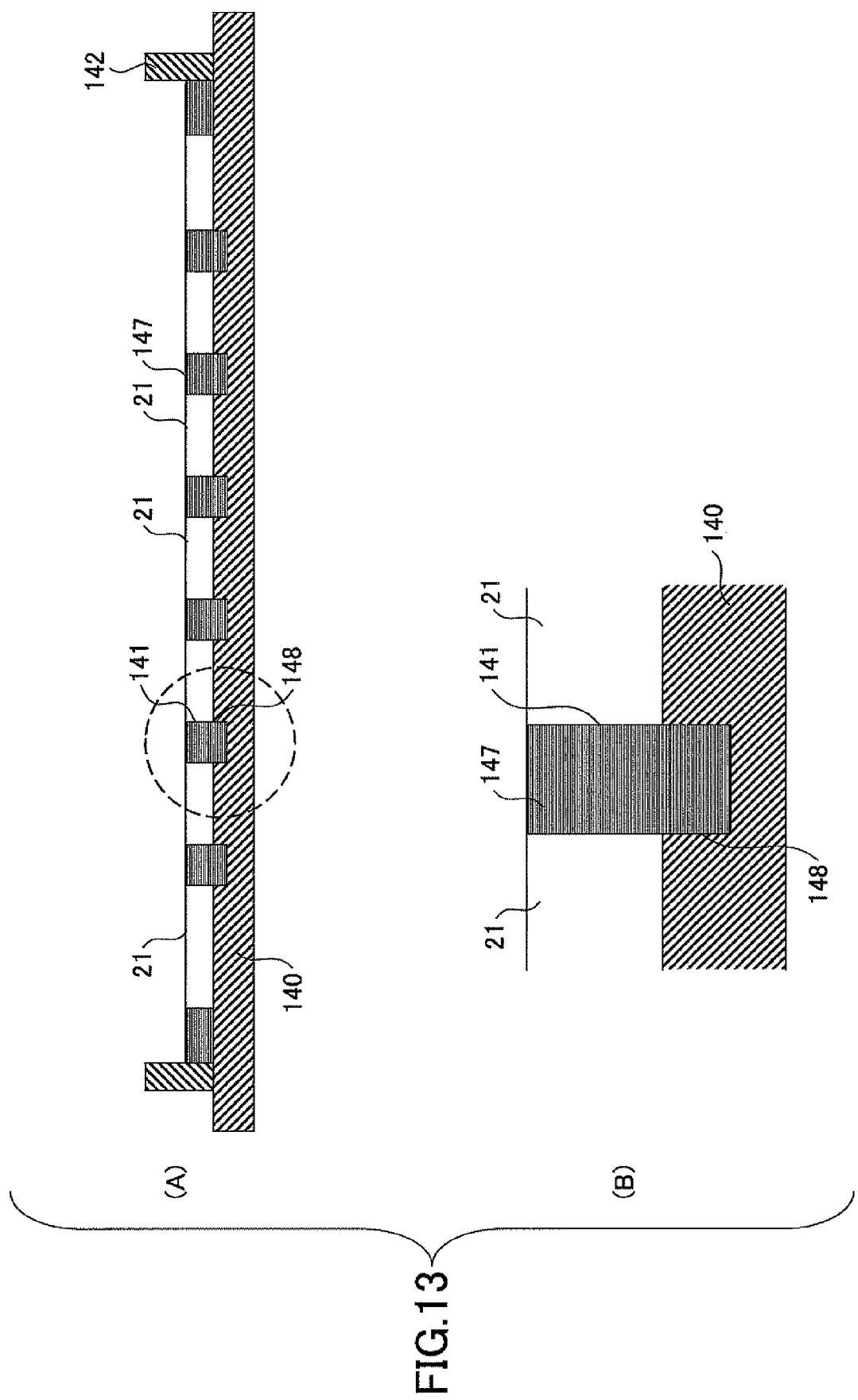
FIG. 13 is a view (part 2) for explaining a manufacturing method of the solid-state image sensing device shown in FIG. 2, of the seventh embodiment of the present invention.

Next, as shown in FIG. 13-(A), the piercing hole 141 and the groove 148 are filled with a material of the shock-absorbing member 100 (hereinafter "shock-absorbing part material") 147.

At this time, a dam 142 is provided on the dicing tape 140 so as to surround the arrangement of the transparent member 21 in advance and therefore the shock-absorbing part material 147 is provided at the circumferential side surface (edge surface) of the transparent member 21 situated at the outermost of the arrangement of the transparent member 21.

After that, the piercing hole 141 and the groove 148 are filled with the shock-absorbing part material 147. Details of the shock-absorbing part material 147 are as discussed above.

FIG. 13-(B) is an enlarged view of a part surrounded by a dotted line in FIG. 13-(A).

Figure 14:
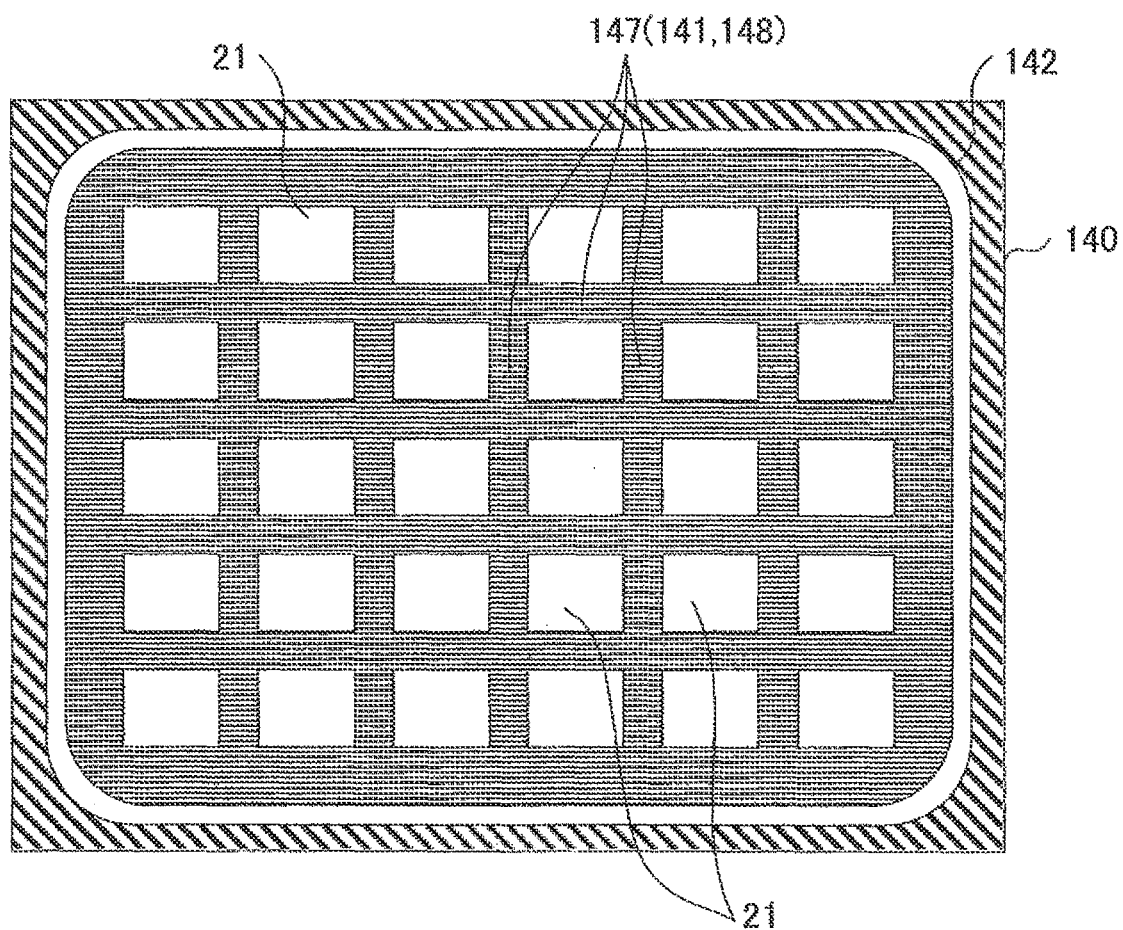
FIG. 14 is a view (part 3) for explaining a manufacturing method of the solid-state image sensing device shown in FIG. 2, of the seventh embodiment of the present invention.

The piercing hole 141 and the groove 148 are filled with the shock-absorbing part material 147, and the shock-absorbing part material 147 is cured. FIG. 14 shows this state. As shown in FIG. 14, at an inside of the dam 142, the surrounding area of the transparent members 21 divided in plural is filled with the shock-absorbing part material 147.

In the meantime, FIG. 13-(A) shows a state where the groove 148 is not formed at a surface side facing the dam 142 of the transparent member 21 situated outermost. This is because it is assumed that the outermost transparent member has a measurement or configuration not being used. If the outermost transparent member has a measurement or configuration capable of being used, groove 148 is formed at a surface side facing the dam 142 of the transparent member 21 situated outermost. This is applied to other embodiment shown in FIG. 24, FIG. 30, FIG. 33, FIG. 37, FIG. 43, or the like.

Figure 15:
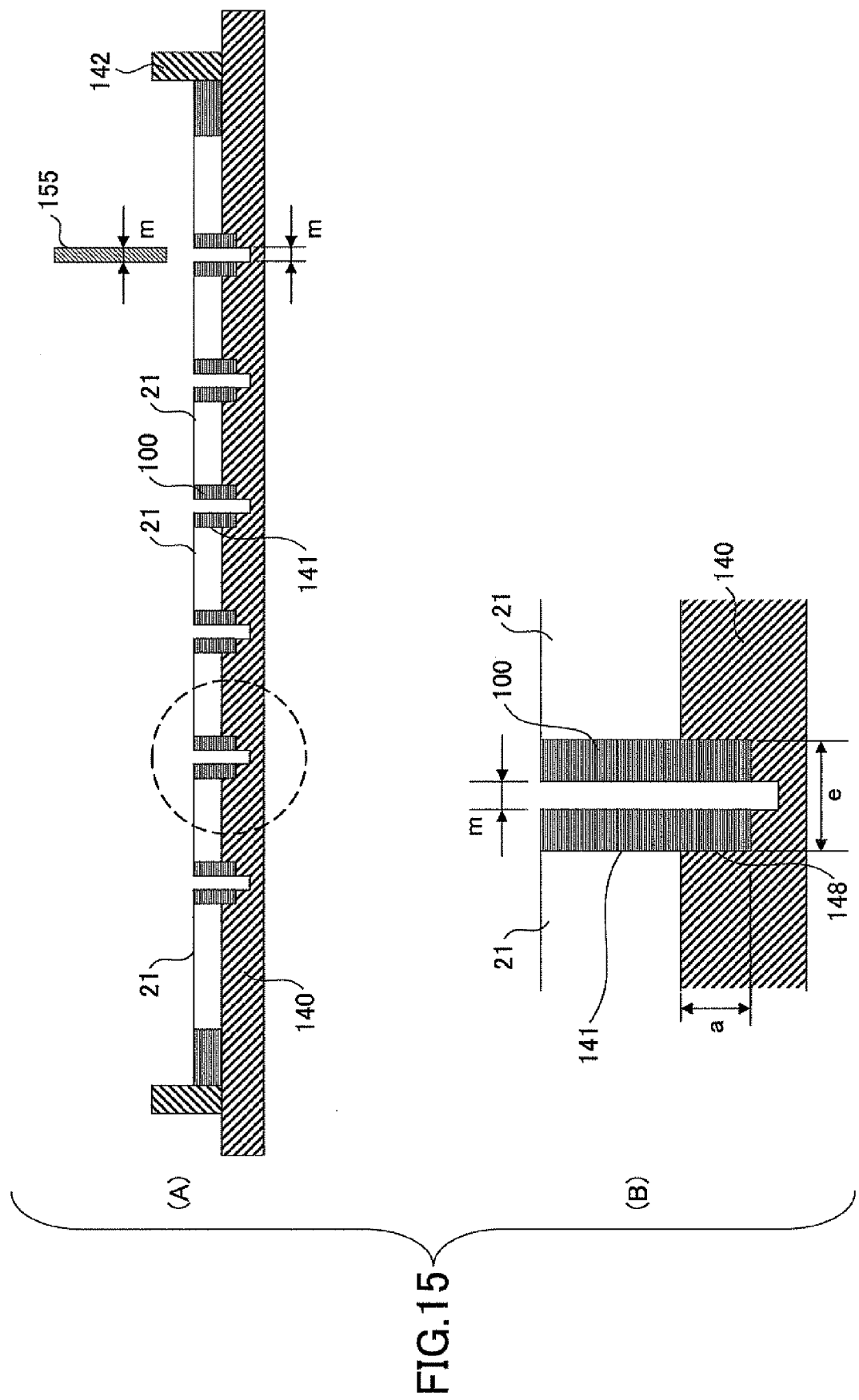
FIG. 15 is a view (part 4) for explaining a manufacturing method of the solid-state image sensing device shown in FIG. 2, of the seventh embodiment of the present invention.

Next, in this embodiment, as shown in FIG. 15-(A), the shock-absorbing part material 147 shown in FIG. 14 is cut by using a second cutting blade 155 having a having a cutting edge thickness "m" less than the first cutting blade 145.

More specifically, as shown in FIG. 15-(B) being an enlarged view of a part surrounded by a dotted line in FIG. 15-(A), the shock-absorbing part material 147 (see FIG. 14) with which the piercing hole 141 and the groove 148 are filled is cut by using the second cutting blade 155, so that the shock-absorbing member 100 is formed at the circumferential side surface of the transparent member 21. At this time, the second cutting blade 155 reaches inside of the dicing tape 140.

Figure 16:
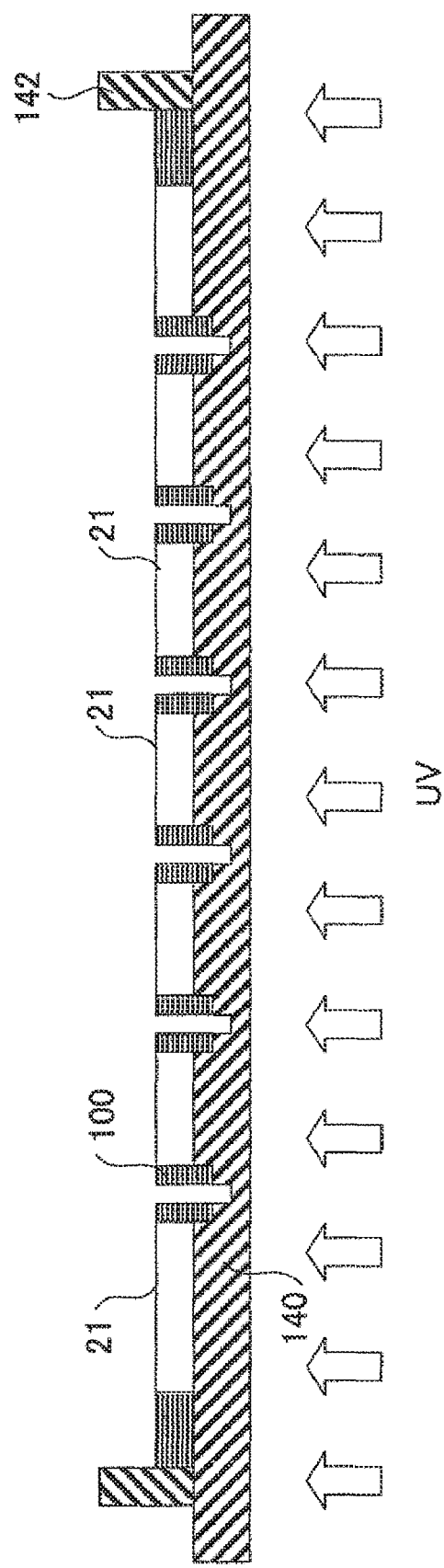
FIG. 16 is a view (part 5) for explaining a manufacturing method of the solid-state image sensing device shown in FIG. 2, of the seventh embodiment of the present invention.

Next, as shown in FIG. 16, ultraviolet rays UV are irradiated from a lower surface side of the dicing tape 140.

As a result of this, the adhesive force of the dicing tape 140 is reduced and therefore the transparent member 21 can b easily peeled off from the dicing tape 140. Thus, plural transparent members 21 having structures shown in FIG. 17 can be obtained.

Figure 17:
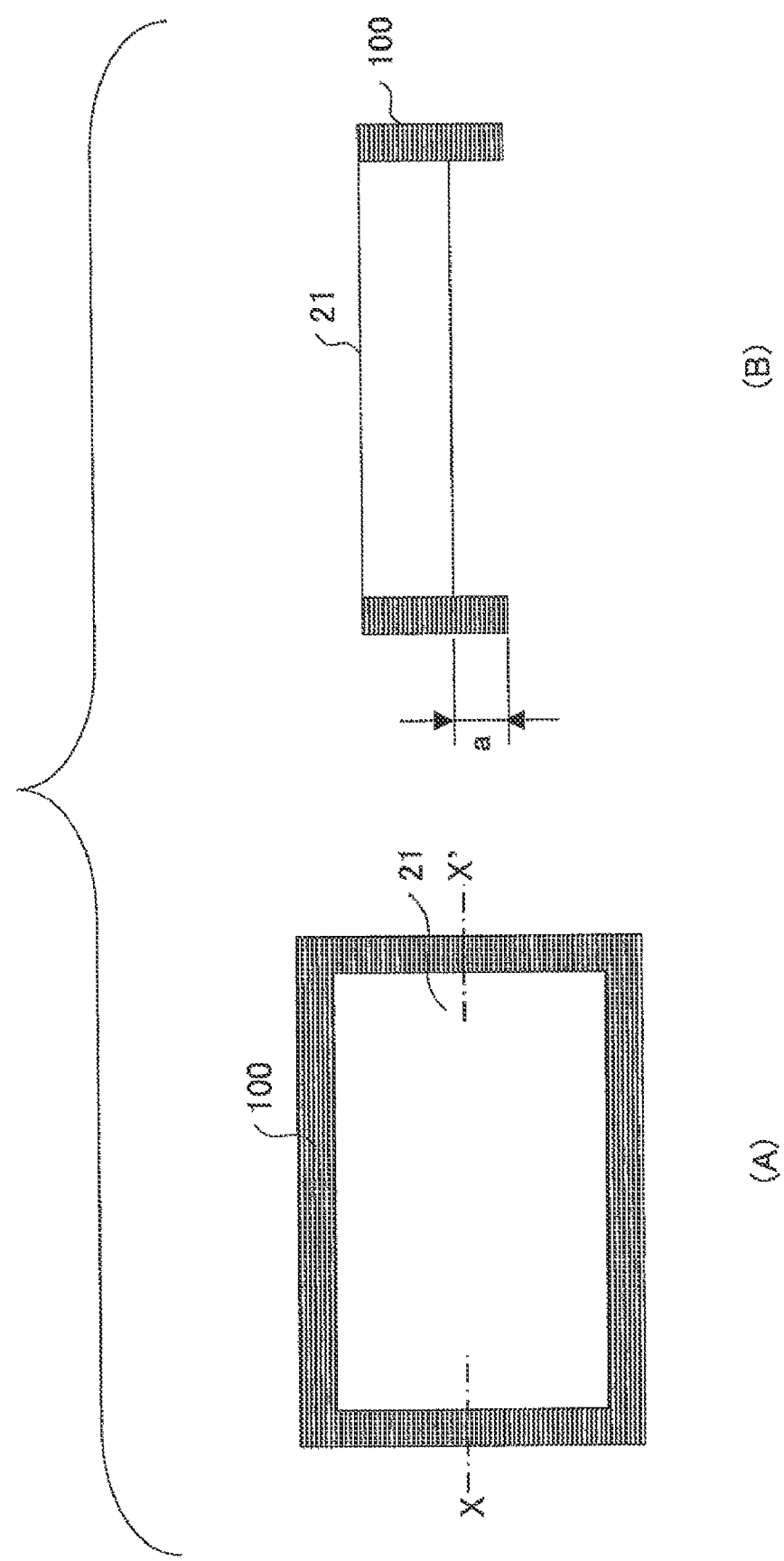
FIG. 17 is a view (part 6) for explaining a manufacturing method of the solid-state image sensing device shown in FIG. 2, of the seventh embodiment of the present invention.

FIG. 17-(A) is a plan view of the transparent member 21 obtained by the processes shown in FIG. 11 through FIG. 16. FIG. 17-(B) is a cross-sectional view taken along line X-X' of FIG. 17-(A).

The circumferential side surface of the transparent member 21 is covered with the shock-absorbing member 100. The shock-absorbing member 100 has a length (thickness) greater than a length (thickness) of the transparent member 21 by a length (thickness) corresponding to the separated length "a" (see FIG. 2) between the transparent member 21 and the solid-state image sensor 28.

Figure 18:
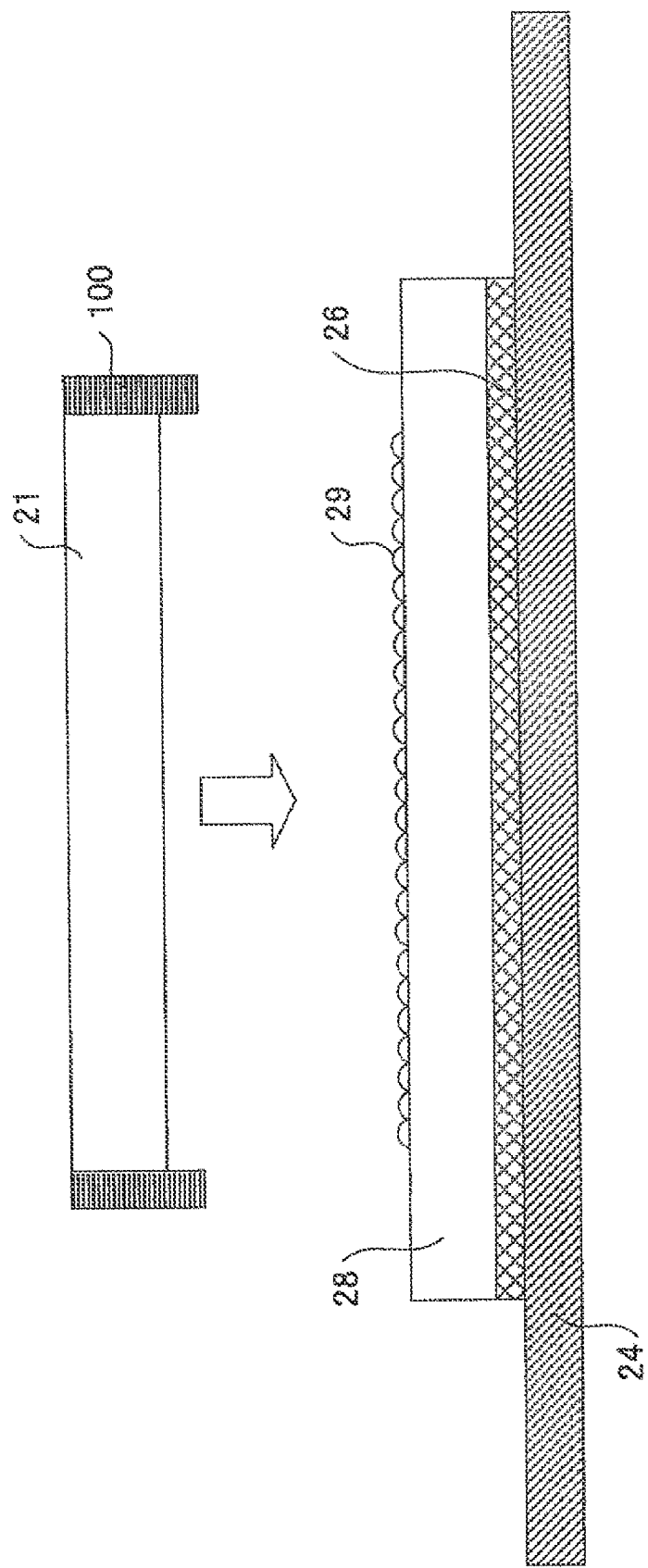
FIG. 18 is a view (part 7) for explaining a manufacturing method of the solid-state image sensing device shown in FIG. 2, of the seventh embodiment of the present invention.

Next, as shown in FIG. 18, the transparent member 21 whose circumferential side surface is covered with the shock-absorbing member 100 is provided and fixed on the light receiving surface of the solid-state image sensor 28 mounted on the wiring board 24. The solid-state image sensor 28 is fixed on the wiring board by the bonding member 26 in advance.

The transparent member 21 is fixed on the light receiving surface of the solid-state image sensor 28 by heating and melting a contact part of the shock-absorbing member 100 and the solid-state image sensor 28 or by applying another epoxy group adhesive to the contact part.

While the transparent member 21 is provided on the solid-state image sensor 28 in an example shown in FIG. 18, the present invention is not limited to this. The transparent member 21 may be provided on the wafer state solid-state image sensor 28.

Figure 19:
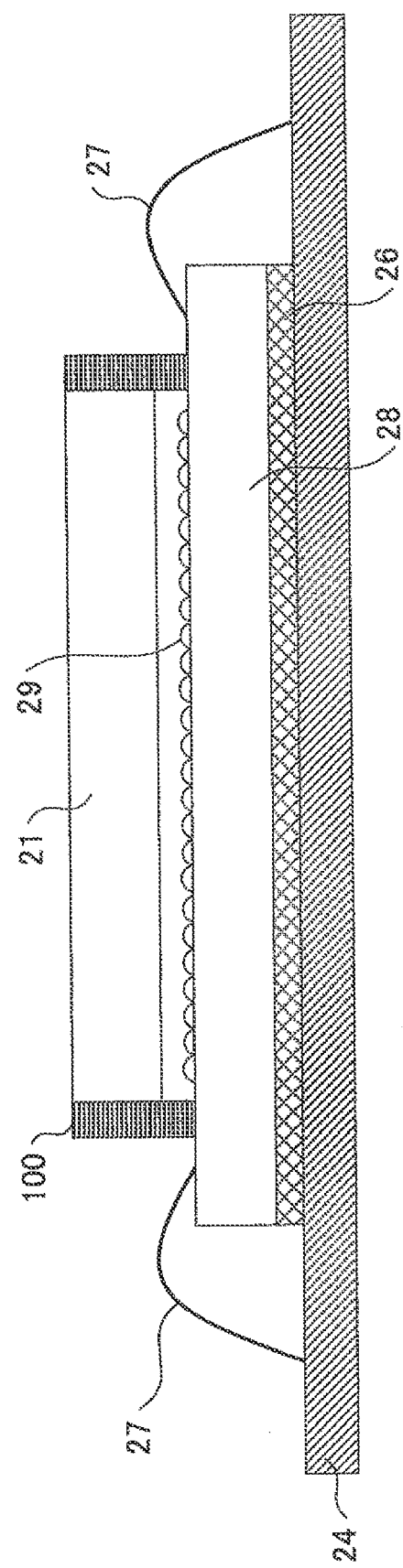
FIG. 19 is a view (part 8) for explaining a manufacturing method of the solid-state image sensing device shown in FIG. 2, of the seventh embodiment of the present invention.

Next, as shown in FIG. 19, an electrode of the solid-state image sensor 29 is connected to an electrode on the wiring board 24 by the bonding wire 27.

After that, the solid-state image sensing device 20 is formed via a sealing process using the sealing resin 25, a process for forming an outside connection terminal on another main surface of the wiring board 24, and a packing process using the sealing resin 25 (not shown).

According to the manufacturing method of the solid-state image sensing device 20 of this embodiment, the degree of freedom to set the length and width (thickness) of the shock-absorbing member 100 is high. That is, the width (thickness) of the shock-absorbing member 100 can be selected by changing a cut amount "a" of the dicing tape 140 by the first cutting blade 145 shown in FIG. 12 in the manufacturing process of the solid state image sensing device 20.

In addition, a covering thickness of the shock-absorbing member 100, that is, a thickness at which the external circumferential side surface of the transparent member 21 is covered, can be selected by changing a cutting edge of the first cutting blade 145 cutting in the dicing tape 140 and/or a cutting edge of the second cutting blade cutting off the dicing tape 140.

Furthermore, even if the configuration or the area of the light receiving area of the solid-state image sensor 28 is changed, it is possible to easily correspond to this by changing a dicing condition, namely, a position where the transparent member 21 and the dicing tape 140 are diced.

If the shock-absorbing member 100 is to be manufactured by using a well-known printing technique, it is necessary to form a printing mask. In addition, it is necessary to form a new printing mask whenever the size of the solid-state image sensor is changed. This causes an increase of the manufacturing cost.

According to the manufacturing method of the solid-state image sensing device 20 of this embodiment, it is possible to easily form the light receiving part proper for various kinds of solid-state image sensors by changing the cutting blade 145 or 155 and/or the dicing condition.

Next, a manufacturing method of the solid-state image sensing device 40 shown in FIG. 4 is discussed as a seventh embodiment of the present invention with reference to FIG. 20 through FIG. 28. Here, FIG. 20 through FIG. 28 are views (part 1 through part 9) for explaining a manufacturing method of the solid-state image sensing device 40 shown in FIG. 4, of the seventh embodiment of the present invention.

Figure 20:
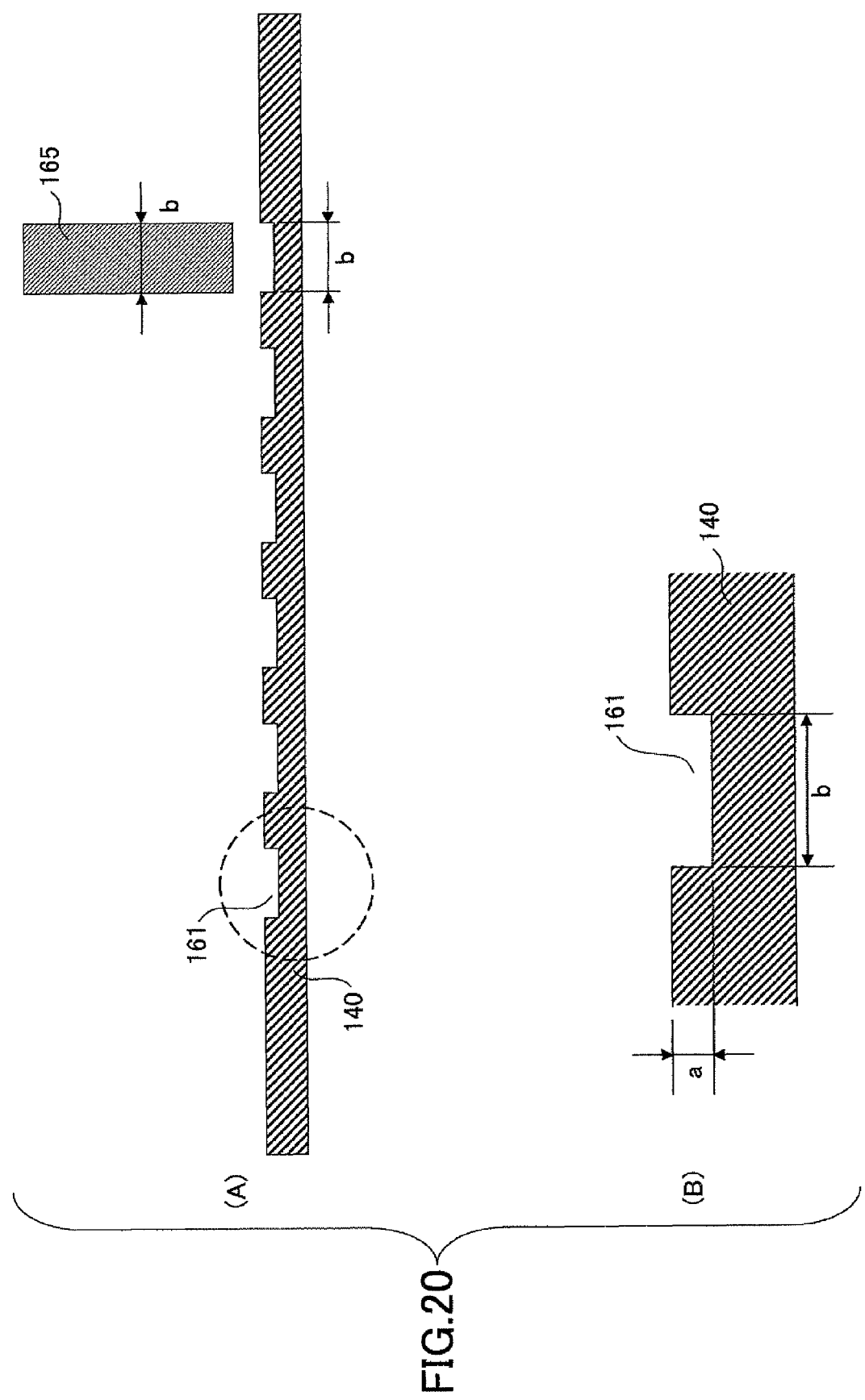
FIG. 20 is a view (part 1) for explaining a manufacturing method of the solid-state image sensing device shown in FIG. 4, of an eighth embodiment of the present invention.

Referring to FIG. 20-(A), the dicing tape 140 same as the tape used in the above-discussed in the seventh embodiment is cut to a designated depth by using a third cutting blade 165 having a cutting edge thickness "b" so that the groove forming parts 161 crossing in the X and Y directions are formed.

FIG. 20-(B) is an enlarged view of a part surrounded by a dotted line in FIG. 20-(A).

Here, a cutting depth of the dicing tape 140 by the third cutting blade 165, namely depth of the groove 161, is the same as a height "a" of the spacer 110 provided between the transparent member 21 and the solid-state image sensor 28, namely a height of a space formed between the transparent member 21 and the solid-state image sensor 28.

Figure 21:
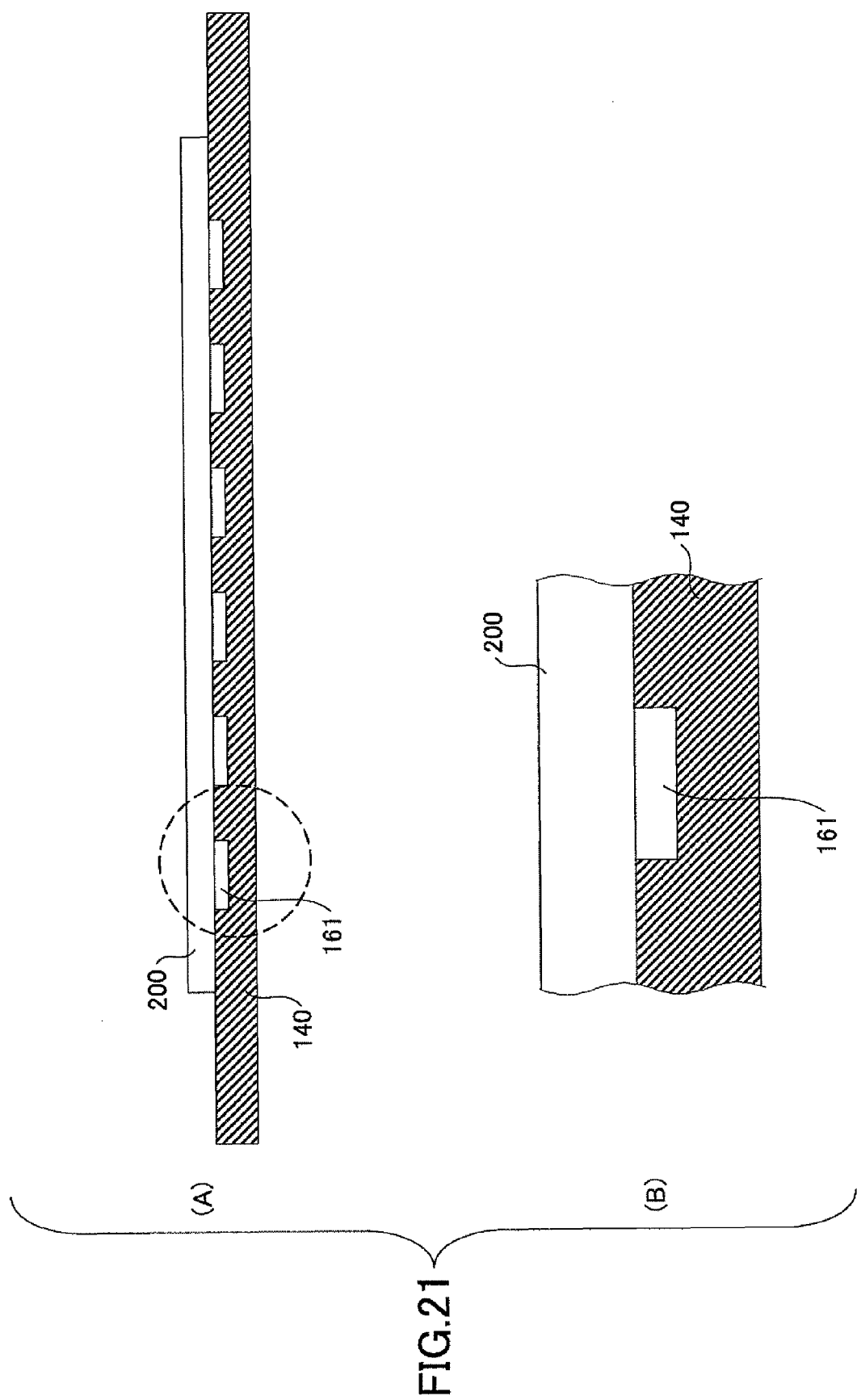
FIG. 21 is a view (part 2) for explaining a manufacturing method of the solid-state image sensing device shown in FIG. 4, of the eighth embodiment of the present invention.

Next, as shown in FIG. 21-(A), the transparent plate 200 is adhered on the dicing tape 140 where the grooves 161 are formed so that the grooves 161 are covered by the transparent plate 200.

FIG. 21-(B) is an enlarged view of a part surrounded by a dotted line in FIG. 21-(A). By the transparent plate 200 being adhered onto the dicing tape 140, parts above the grooves 161 are covered with the dicing tape 140 so that a closed space of the groove 161 is formed.

Figure 22:
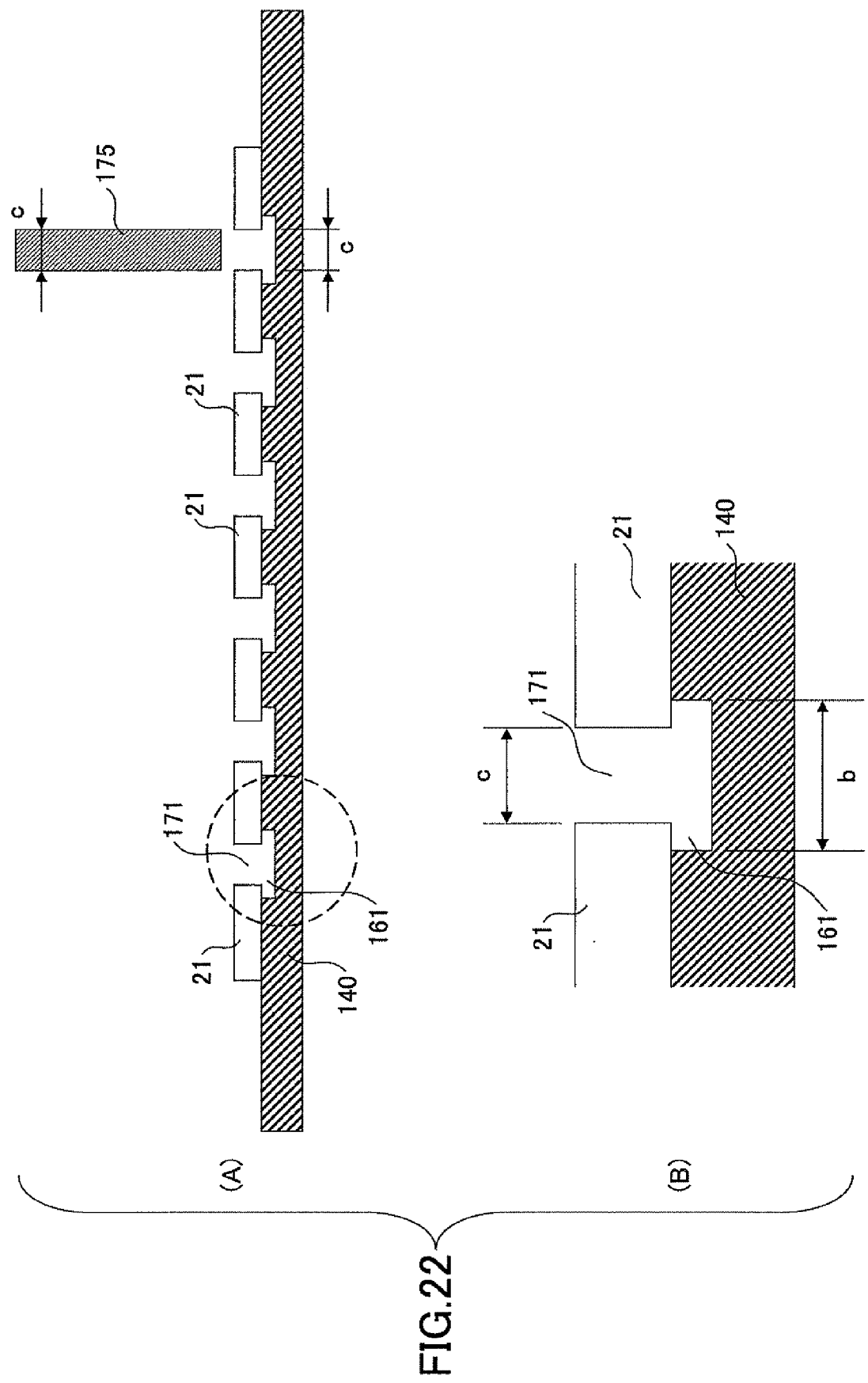
FIG. 22 is a view (part 3) for explaining a manufacturing method of the solid-state image sensing device shown in FIG. 4, of the eighth embodiment of the present invention.

Next, as shown in FIG. 22-(A), the transparent plate 200 is cut, as corresponding to the grooves 161, by using the fourth cutting blade 175 whose cutting edge thickness "c" is less than the cutting edge thickness "b" of the third cutting blade 165.

FIG. 22-(B) is an enlarged view of a part surrounded by a dotted line in FIG. 22-(A).

The transparent plate 200 shown in FIG. 21 is cut and separated by the fourth cutting blade 175 so that plural cutting members 21 are formed. In addition, the piercing holes 171 of the dicing tape 140 are formed above the grooves 161.

Figure 23:
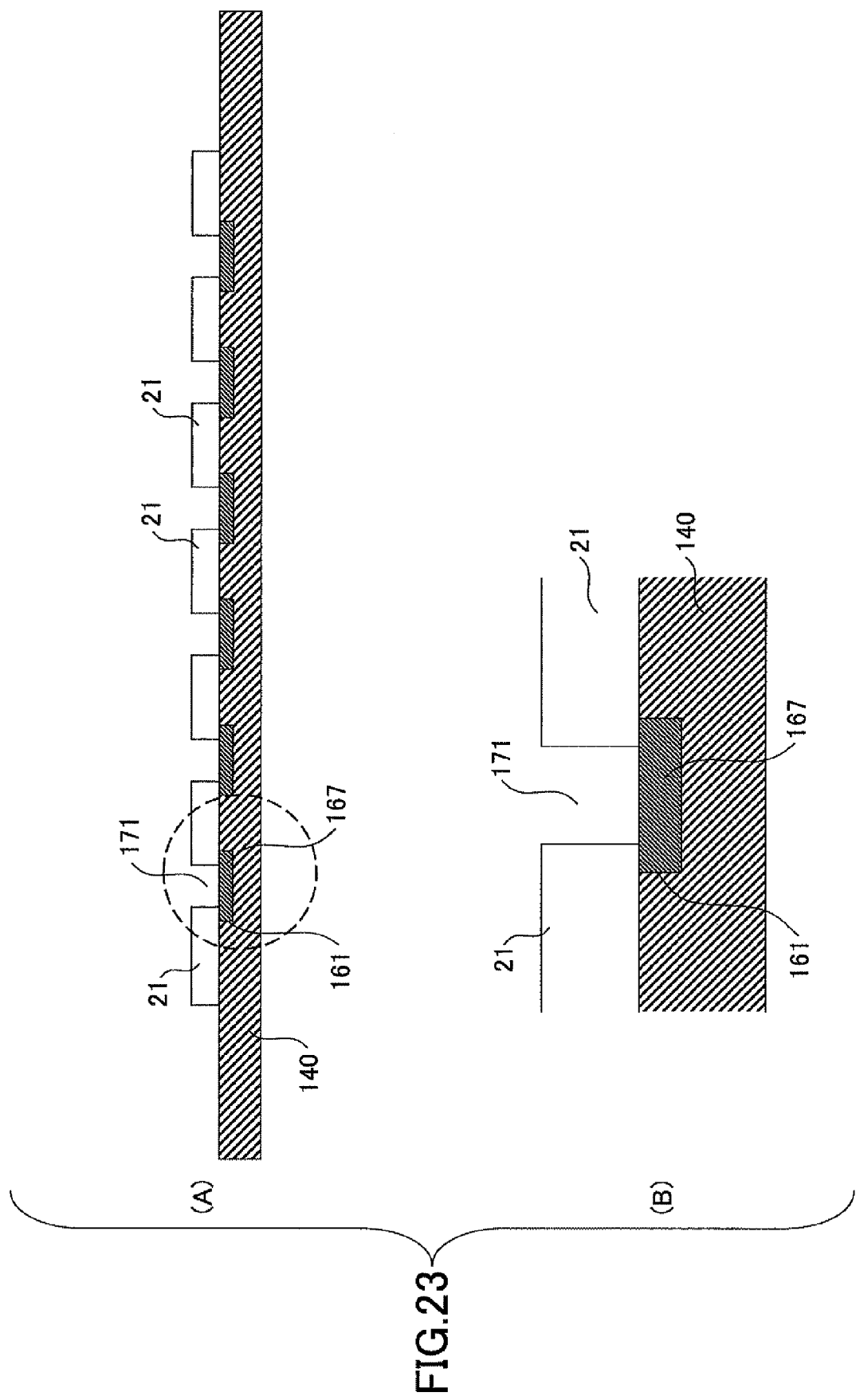
FIG. 23 is a view (part 4) for explaining a manufacturing method of the solid-state image sensing device shown in FIG. 4, of the eighth embodiment of the present invention.

Next, as shown in FIG. 23-(A), the groove 161 is filled with a spacer material 167 forming the spacer 110 and cured. As discussed above, for example, an epoxy group adhesive or the like can be used as the spacer material 167.

FIG. 23-(B) is an enlarged view of a part surrounded by a dotted line in FIG. 23-(A).

While the spacer material 167 fills the groove 161, the spacer material 167 does not fill the piercing hole 171. In other words, a filling amount of the spacer material 167 is selected so that the spacer material 167 fills to a height contacting a lower surface of the transparent member 21.

Figure 24:
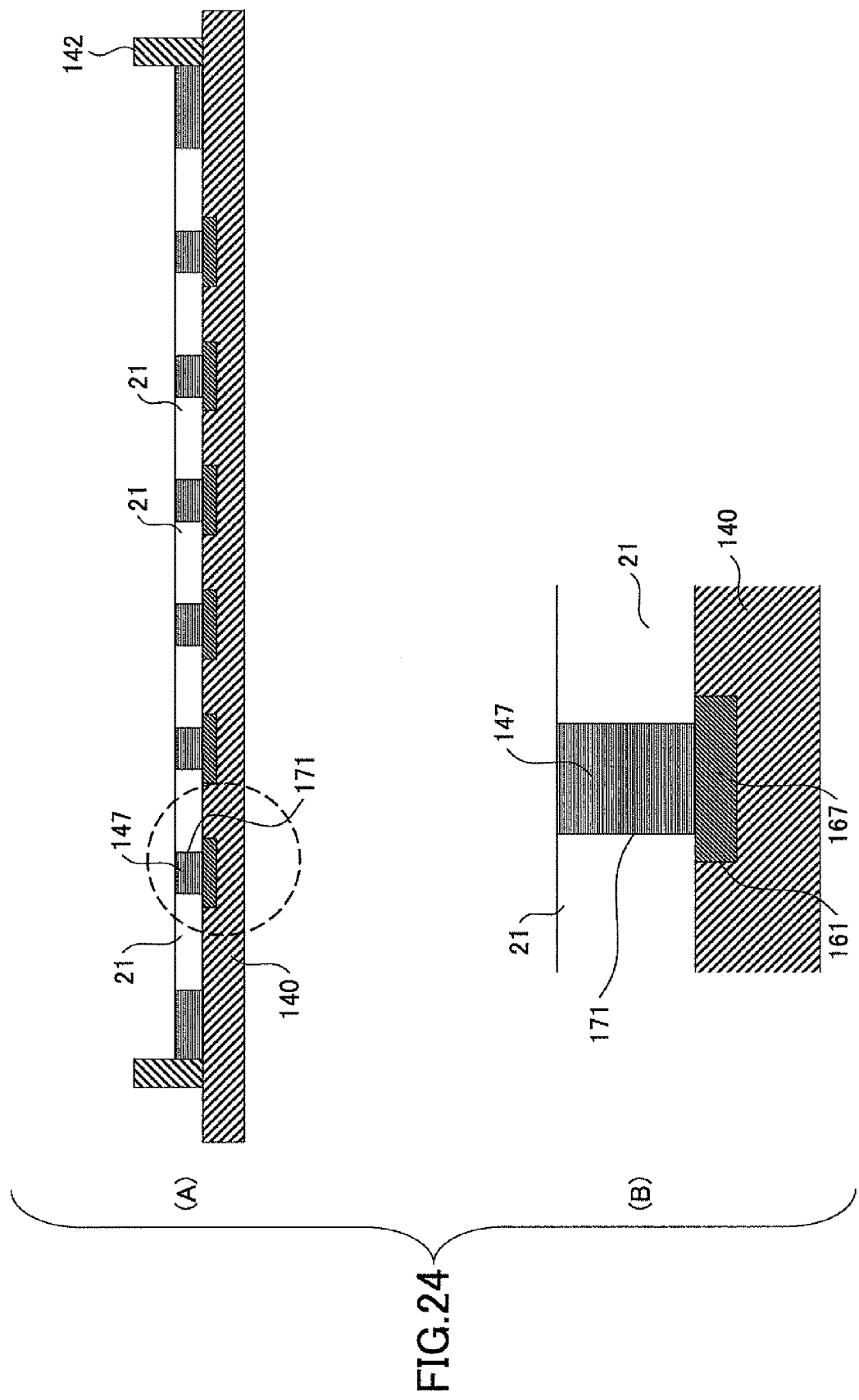
FIG. 24 is a view (part 5) for explaining a manufacturing method of the solid-state image sensing device shown in FIG. 4, of the eighth embodiment of the present invention.

Next, as shown in FIG. 24-(A), the dam 142 for filling the groove 171 with the shock-absorbing part material 147 is provided on the dicing tape and around the arrangement of the transparent member 21. After that, the piercing hole 171 is filled with the shock-absorbing part material 147. Details of the shock-absorbing part material 147 are as discussed above.

FIG. 24-(B) is an enlarged view of a part surrounded by a dotted line in FIG. 24-(A).

As shown in FIG. 24-(B), in the grooves 171, the shock-absorbing part material 147 fills to a height the same as an upper surface of the transparent member 21 and is cured.

Figure 25:
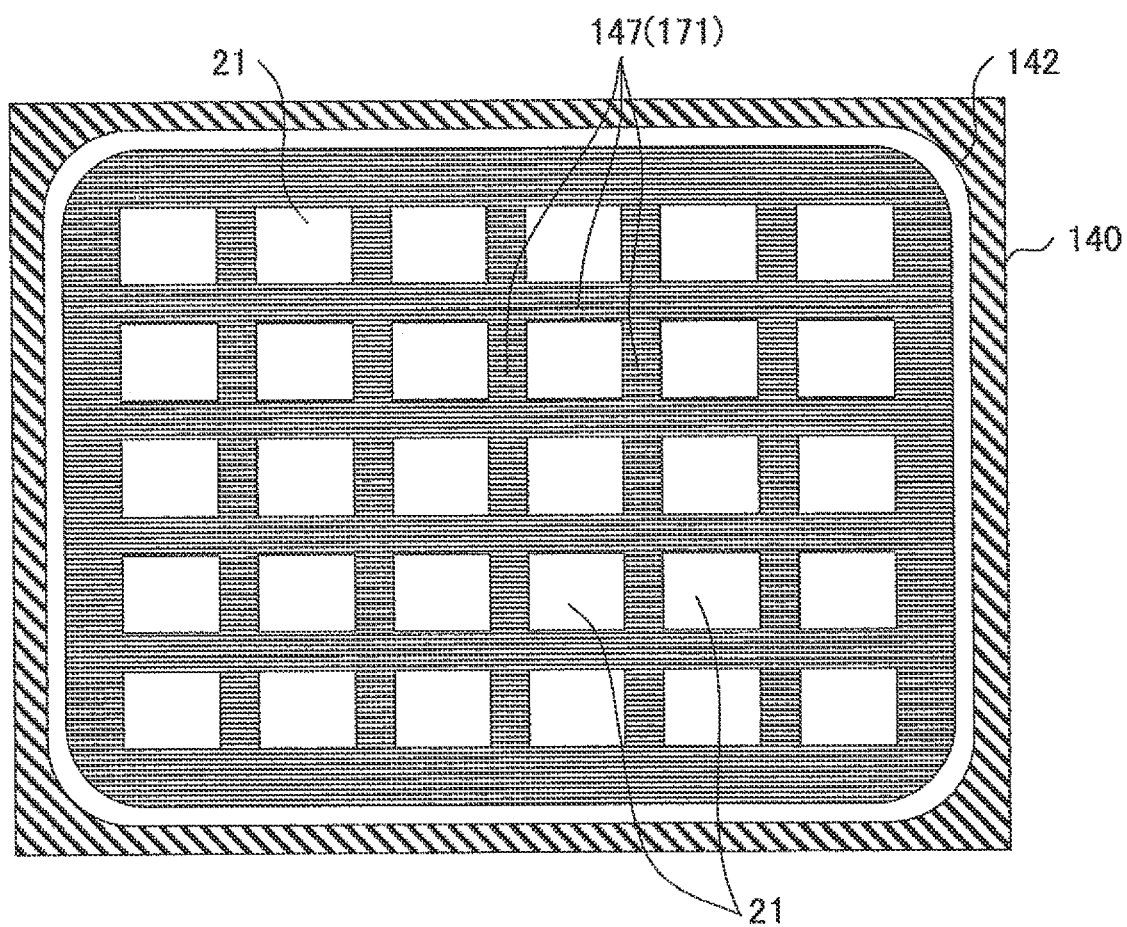
FIG. 25 is a view (part 6) for explaining a manufacturing method of the solid-state image sensing device shown in FIG. 4, of the eighth embodiment of the present invention.

FIG. 25 shows a state where the shock-absorbing part material 147 fills in the grooves 171. In a surface area of the dicing tape defined by the dam 142, the surrounding area of the transparent members 21 separated in X and Y directions are covered with the shock-absorbing part material 147 filling in the groove 171.

Figure 26:
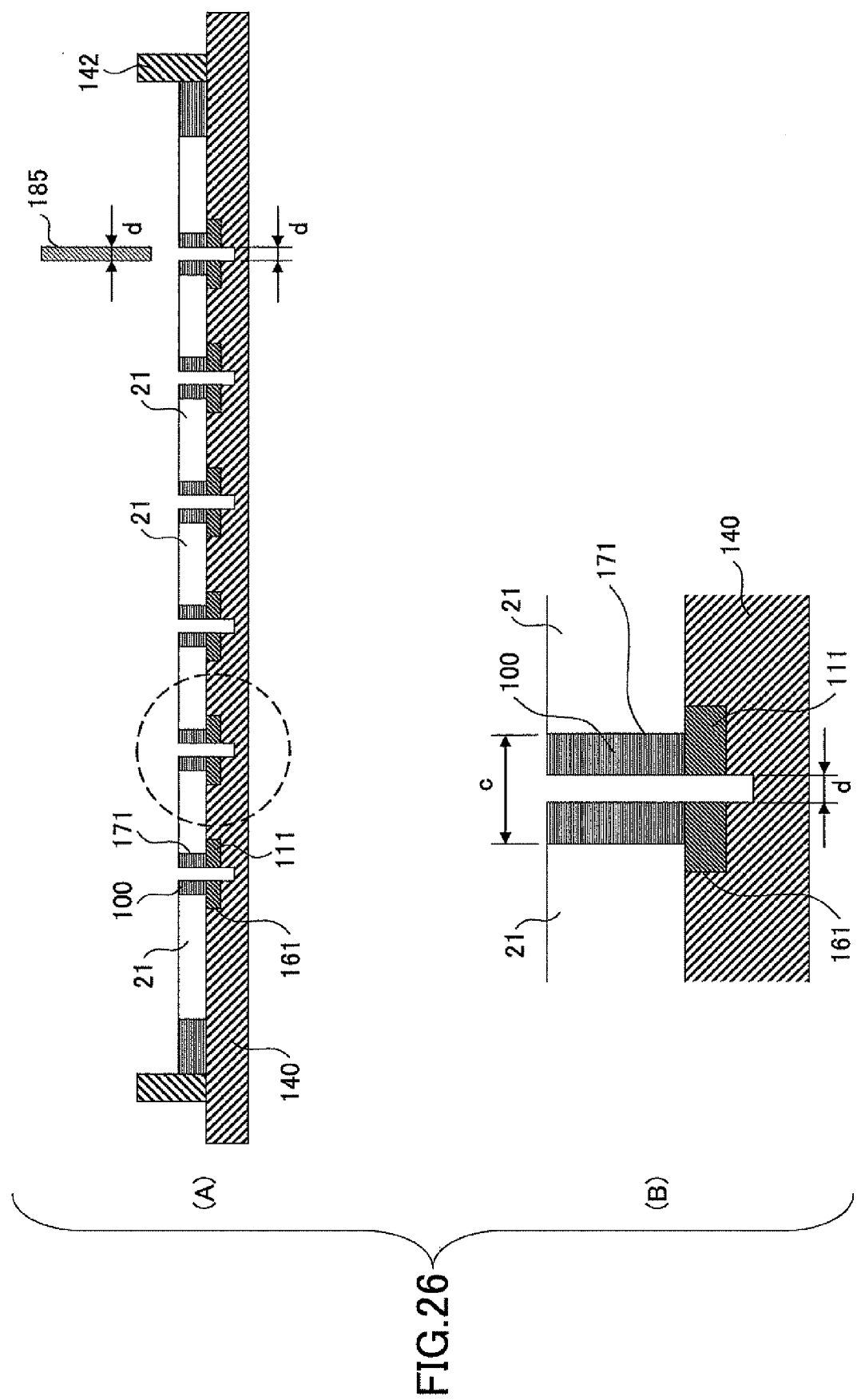
FIG. 26 is a view (part 7) for explaining a manufacturing method of the solid-state image sensing device shown in FIG. 4, of the eighth embodiment of the present invention.

Next, as shown in FIG. 26-(A), the shock-absorbing part material 147 and the spacer member 167 are cut by using the fifth cutting blade 185 whose cutting edge thickness "d" is less than the cutting edge thickness "c" of the fourth cutting blade 175.

FIG. 26-(B) is an enlarged view of a part surrounded by a dotted line in FIG. 26-(A).

A cutting process using the fifth cutting blade 185 is implemented so that the shock-absorbing part material 147 filling in the piercing hole 171 is pierced, the spacer material 167 filling in the groove 161 is pierced, and the dicing tape 140 is cut.

By such a cutting process, the shock-absorbing member 100 is formed on the circumferential side surface of the transparent member 21 and the spacer 11 continuing from the shock-absorbing member 100 is formed.

Figure 27:
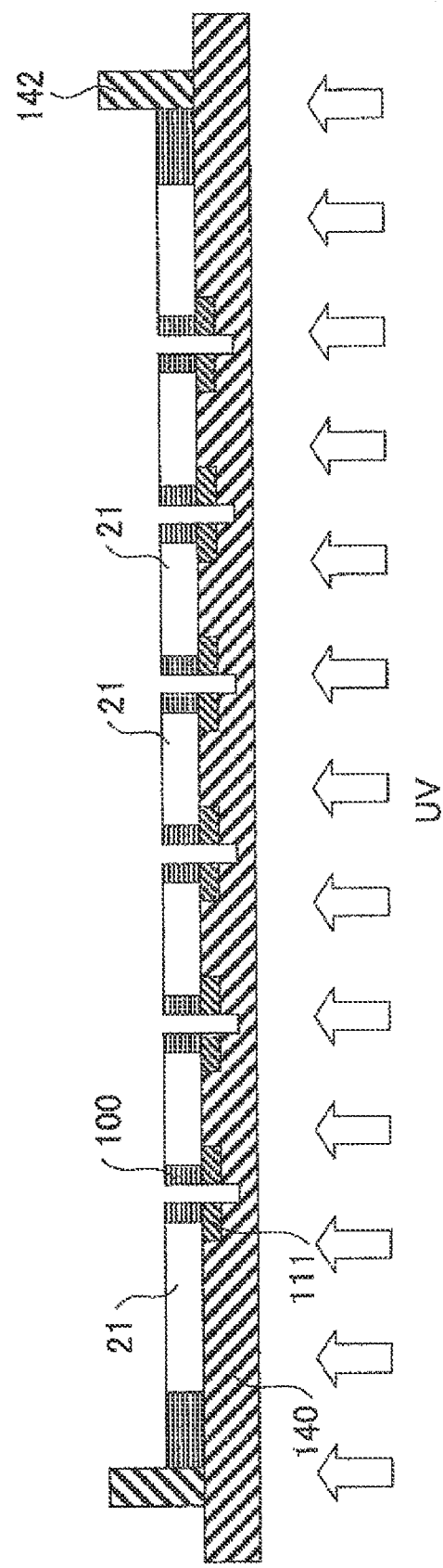
FIG. 27 is a view (part 8) for explaining a manufacturing method of the solid-state image sensing device shown in FIG. 4, of the eighth embodiment of the present invention.

Next, as shown in FIG. 27, ultraviolet rays UV are irradiated from a lower surface side of the dicing tape 140.

As a result of this, the adhesive force of the dicing tape 140 is reduced and therefore the transparent member 21 can b easily peeled off from the dicing tape 140. Thus, plural transparent members 21 having structures shown in FIG. 17 can be obtained.

Figure 28:
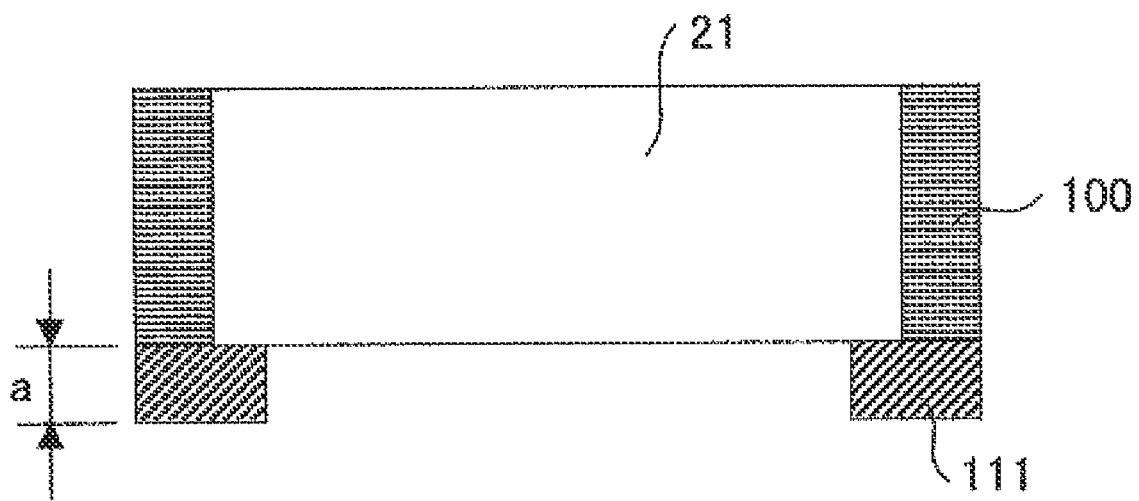
FIG. 28 is a view (part 9) for explaining a manufacturing method of the solid-state image sensing device shown in FIG. 4, of the eighth embodiment of the present invention.

Next, as shown in FIG. 28, the circumferential side surface (edge surface) of the transparent member 21 is covered with the shock-absorbing member 100, and a spacer 111 having a thickness "a" is provided on a circumferential edge part of another main surface of the transparent member 21.

Next, as discussed in the seventh embodiment with reference to FIG. 18, the transparent member 21 is provided and fixed on the light receiving surface of the solid-state image sensor 28 by heating and melting a contact part of the spacer 111 and the solid-state image sensor 28 or by applying another epoxy group adhesive to the contact part.

Next, as discussed in the seventh embodiment with reference to FIG. 19, an electrode of the solid-state image sensor 29 is connected to an electrode on the wiring board 24 by the bonding wire 27.

After that, the solid-state image sensing device 40 is formed via a sealing process using the sealing resin 25, a process for forming an outside connection terminal on another main surface of the wiring board 24, and a packing process using the sealing resin 25 (not shown).

According to the manufacturing method of the solid-state image sensing device 40 of this embodiment, as well as the manufacturing method of the solid-state image sensing device 20 of the seventh embodiment of the present invention, the height of the spacer 111 can be selected by changing a dicing condition, namely a cut amount "a" of the dicing tape 140 by the third cutting blade 165 shown in FIG. 20 in the manufacturing process of the solid state image sensing device 40.

In addition, thickness of the shock-absorbing member 100 and the spacer 111 can be selected by changing a cutting edge of the fifth cutting blade 185 shown in FIG. 26.

Furthermore, even if the size of the solid-state image sensor 28 is changed, it is possible to easily correspond to this by changing a dicing condition, namely, a cutting length or a cutting position where the transparent member 21 and the dicing tape 140 are diced by using the fourth cutting blade 175 shown in FIG. 22.

Thus, according to the manufacturing method of the solid-state image sensing device 40 of this embodiment, it is possible to easily form the shock-absorbing member and the transparent member having the spacer proper for various kinds of solid-state image sensors at low cost by changing the cutting blade and/or the dicing condition.

In the meantime, in the solid-state image sensing device 40 shown in FIG. 4, the shock-absorbing member 100 is provided between the sealing resin 25 and the circumferential side surface (edge surface) of the transparent member 21, and the spacer 111 is provided on the upper surface of the solid-state image sensor 28. On the other hand, in the solid-state image sensing device 60 shown in FIG. 6, the shock-absorbing member having a Young's modulus different from the Young's modulus of the shock-absorbing member 100 provided between the sealing resin 25 and the circumferential side surface (edge surface) of the transparent member 21 is provided as the spacer 113 between the transparent member 21 and the solid-state image sensor 20.

Therefore, it is possible to form the solid-state image sensing device 70 shown in FIG. 6 by implementing the manufacturing method of the seventh embodiment of the present invention wherein the material having the Young's modulus different from the Young's modulus of the shock-absorbing member 100 is used as a material of the spacer 113 instead of the spacer material 167 being a material of the spacer 110.

Next, a manufacturing method of the solid-state image sensing device 30 shown in FIG. 3 is discussed as a ninth embodiment of the present invention with reference to FIG. 20 through FIG. 23 and FIG. 29 through FIG. 32.

For manufacturing the solid-state image sensing device 30, in this embodiment, the processes discussed with reference to FIG. 20 through FIG. 23 are implemented.

That is, as shown in FIG. 20-(A), the dicing tape 140 is cut at a designated depth by using the third cutting blade 165 having the cutting edge thickness "b" so that plural groove forming parts 161 are formed.

FIG. 20-(B) is an enlarged view of a part surrounded by a dotted line in FIG. 20-(A).

Here, the cutting depth of the dicing tape 140 by the third cutting blade 165, namely depth of the groove 161, is the same as a height "a" of the spacer 110 provided between the transparent member 21 and the solid-state image sensor 28, namely a height of a space formed between the transparent member 21 and the solid-state image sensor 28.

Next, as shown in FIG. 21-(A), the transparent plate 200 is adhered on the dicing tape 140 where the grooves 161 are formed so that the grooves 161 are covered by the transparent plate 200.

FIG. 21-(B) is an enlarged view of a part surrounded by a dotted line in FIG. 21-(A). By adhering the transparent plate 200 on the dicing tape 140, a part above the grooves 161 are covered with the dicing tape 140 so that a closed space of the groove 161 is formed.

Next, as shown in FIG. 22-(A), the transparent plate 200 is cut, as corresponding to the grooves 161, by using the fourth cutting blade 175 whose cutting edge thickness "c" is less than the cutting edge thickness "b" of the third cutting blade 165.

FIG. 22-(B) is an enlarged view of a part surrounded by a dotted line in FIG. 22-(A).

The transparent plate 200 shown in FIG. 21 is cut and separated by the fourth cutting blade 175 so that plural cutting members 21 are formed. In addition, the piercing holes 171 of the dicing tape 140 are formed above the grooves 161.

Next, as shown in FIG. 23-(A), the groove 161 is filled with a spacer material 167 forming the spacer 110 and cured. As discussed above, for example, an epoxy group adhesive or the like can be used as the spacer material 167.

FIG. 23-(B) is an enlarged view of a part surrounded by a dotted line in FIG. 23-(A).

While the spacer material 167 fills the groove 161, the spacer material 167 does not fill the piercing hole 171. In other words, a filling amount of the spacer material 167 is selected so that the spacer material 167 fills to height contacting a lower surface of the transparent member 21.

Figure 29:
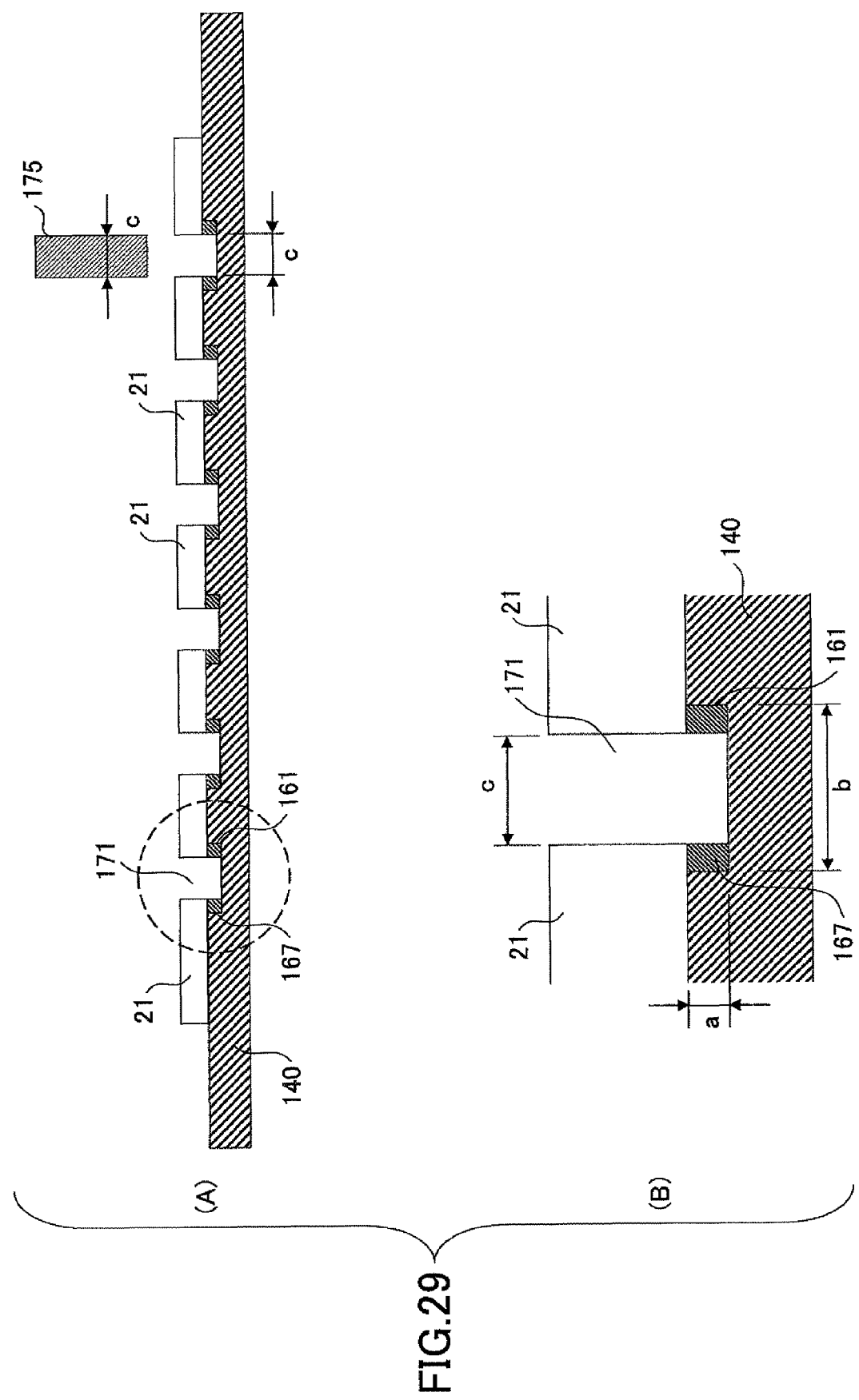
FIG. 29 is a view (part 1) for explaining a manufacturing method of the solid-state image sensing device shown in FIG. 3, of a ninth embodiment of the present invention.

Next, in this embodiment, as shown in FIG. 29-(A), the piercing hole 171 is pierced again by the fourth cutting blade 175 shown in FIG. 22 so that the spacer material filling in the groove 161 is cut.

FIG. 29-(B) is an enlarged view of a part surrounded by a dotted line in FIG. 29-(A). A cutting process is implemented so as to reach the bottom surface of the groove 161 situated in the dicing tape 140, so that the spacer material 167 is cut and separated as corresponding to each of the transparent member 21.

As a result of this, a groove having a width of "c" the same as the width of the piercing hole 171 is formed in the groove 161 having a width of "b" and the spacer material 167 is provided on the inner surface of the groove. The spacer material 167 is positioned in the vicinity of the external circumferential part of the transparent member 21 at the other main surface of the transparent member 21.

Figure 30:
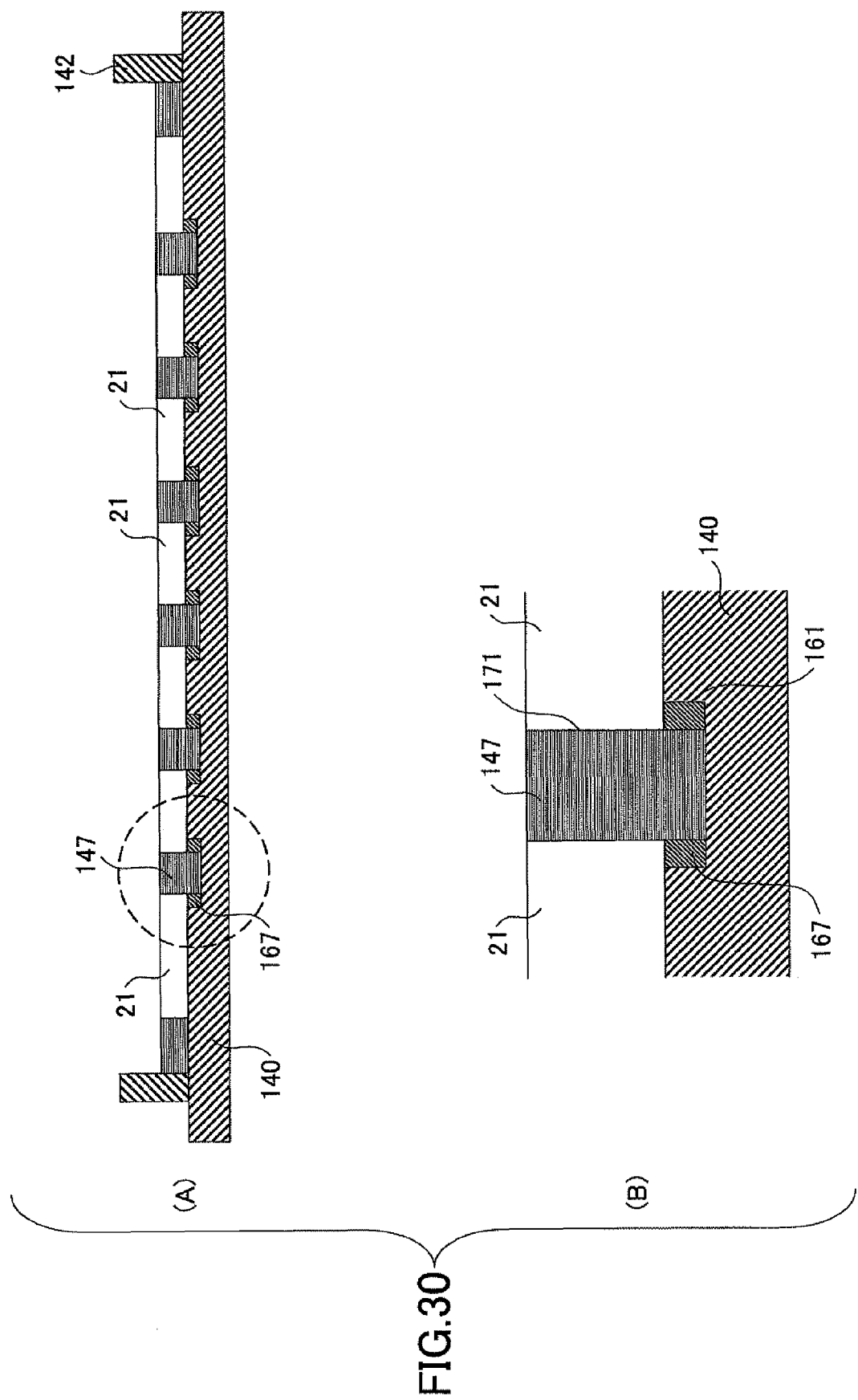
FIG. 30 is a view (part 2) for explaining a manufacturing method of the solid-state image sensing device shown in FIG. 3, of the ninth embodiment of the present invention.

Next, as shown in FIG. 30-(A), the dam 142 for filling the groove 171 with the shock-absorbing part material 147 is provided on the dicing tape 140 and around of the arrangement of the transparent member 21.

After that, the piercing part 171 is filled with the shock-absorbing part material 147. The details of the shock-absorbing part material 147 are as discussed above.

FIG. 30-(B) is an enlarged view of a part surrounded by a dotted line in FIG. 30-(A).

That is, the shock-absorbing part material 147 fills in the piercing part 171 and the groove 161 and is cured. At this time, in the groove 161, the spacer 110 made of the spacer material 167 comes in contact with the circumference of the shock-absorbing part material 147.

Figure 31:
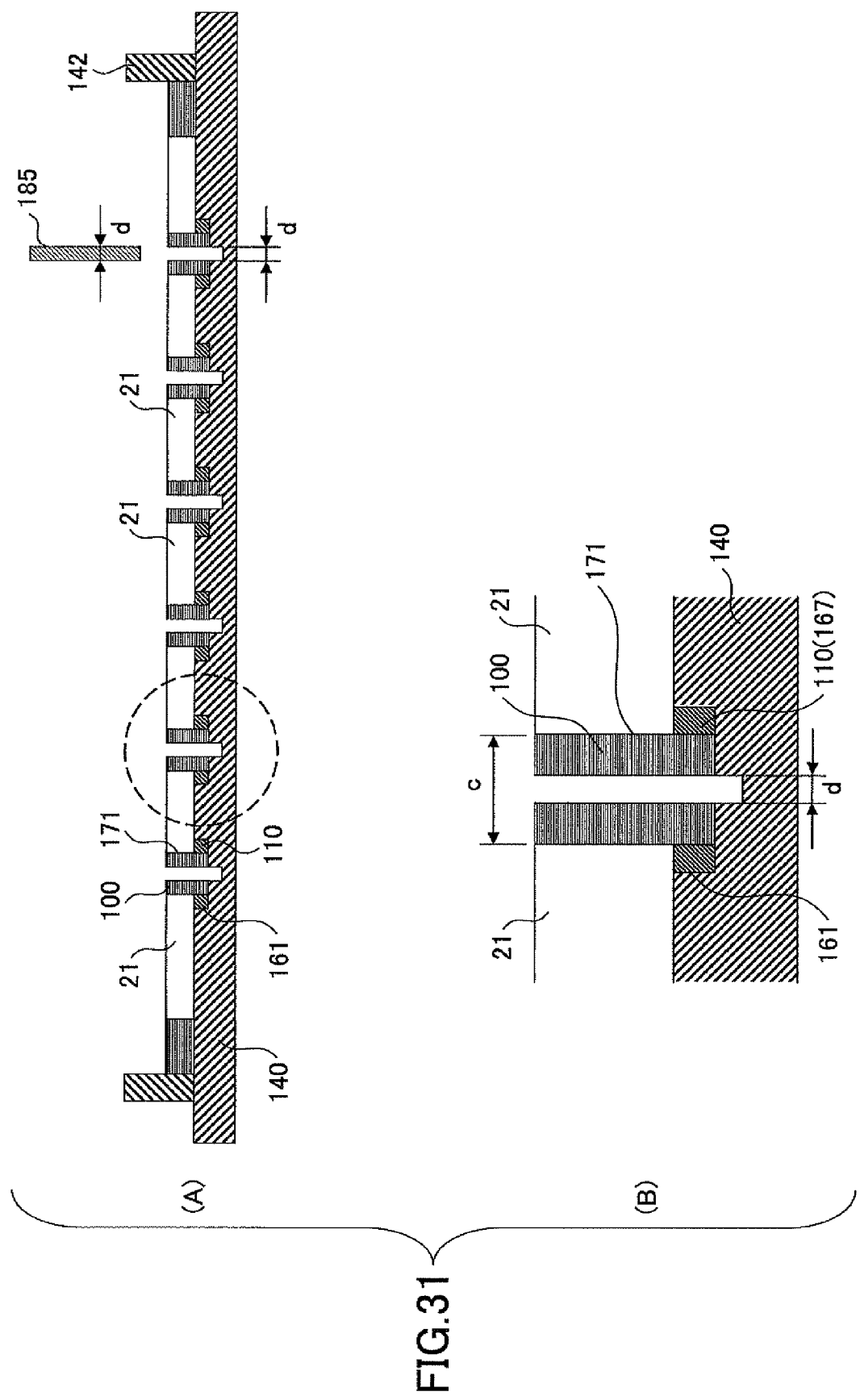
FIG. 31 is a view (part 3) for explaining a manufacturing method of the solid-state image sensing device shown in FIG. 3, of the ninth embodiment of the present invention.

Next, as shown in FIG. 31-(A), the shock-absorbing part material 147 filling in the piercing hole 171 and the groove 161 are cut by using the fifth cutting blade 185 shown in FIG. 29 whose cutting edge thickness "d" is less than the cutting edge thickness "c" of the fourth cutting blade 175.

FIG. 31-(B) is an enlarged view of a part surrounded by a dotted line in FIG. 31-(A).

The cutting process whereby the shock-absorbing part material 147 filling in the piercing hole 171 and the groove 161 is pierced and the dicing tape 140 is cut is implemented. As a result of this, the spacer material 167 filling in the groove 161 forms the spacer 110.

Next, as shown in FIG. 27, ultraviolet rays UV are irradiated from a lower surface side of the dicing tape 140.

As a result of this, the adhesive force of the dicing tape 140 is reduced and therefore the transparent member 21 can be easily peeled off from the dicing tape 140. Thus, plural transparent members 21 having structures shown in FIG. 32 can be obtained.

Figure 32:
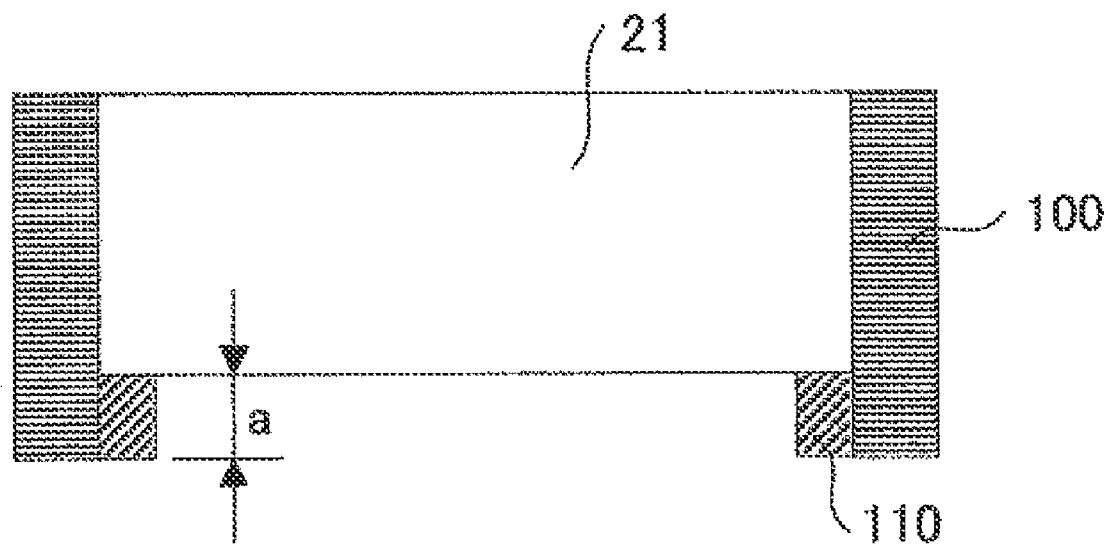
FIG. 32 is a view (part 4) for explaining a manufacturing method of the solid-state image sensing device shown in FIG. 3, of the ninth embodiment of the present invention.

Next, as shown in FIG. 32, the circumferential side surface (edge surface) of the transparent member 21 is covered with the shock-absorbing member 100, and a spacer 111 having a thickness "a" and an extending part (wide width part) of the shock-absorbing member 100 are provided on a circumferential edge part of another main surface of the transparent member 21.

Next, as discussed in the seventh embodiment with reference to FIG. 18, the transparent member 21 is provided and fixed on the light receiving surface of the solid-state image sensor 28 by heating and melting a contact part of the spacer 111 and the solid-state image sensor 28 or by applying another epoxy group adhesive to the contact part.

Next, as discussed in the seventh embodiment with reference to FIG. 19, an electrode of the solid-state image sensor 29 is connected to an electrode on the wiring board 24 by the bonding wire 27.

After that, the solid-state image sensing device 30 is formed via a sealing process using the sealing resin 25, a process for forming an outside connection terminal on another main surface of the wiring board 24, and a packing process using the sealing resin 25 (not shown).

According to the manufacturing method of this embodiment, it is possible to achieve the same effect as the seventh and eighth embodiments.

Next, a manufacturing method of the solid-state image sensing device 50 shown in FIG. 5 is discussed as a tenth embodiment of the present invention with reference to FIG. 20 through FIG. 25 and FIG. 33 through FIG. 35.

In the solid-state image sensing device 50 shown in FIG. 5, the shock-absorbing member having a Young's modulus the same as the Young's modulus of the shock-absorbing member 101 provided between the sealing resin 25 and the circumferential side surface (edge surface) of the transparent member 21 is provided as the spacer between the transparent member 21 and the sealing resin 25.

For manufacturing the solid-state image sensing device 50, in this embodiment, the processes discussed with reference to FIG. 20 through FIG. 22 are implemented.

That is, as shown in FIG. 20-(A), the dicing tape 140 is cut at a designated depth by using the third cutting blade 165 having the cutting edge thickness "b" so that plural groove forming parts 161 are formed.

FIG. 20-(B) is an enlarged view of a part surrounded by a dotted line in FIG. 20-(A).

Here, the cutting depth of the dicing tape 140 by the third cutting blade 165, namely depth of the groove 161, is the same as a height "a" of the spacer 110 provided between the transparent member 21 and the solid-state image sensor 28, namely a height of a space formed between the transparent member 21 and the solid-state image sensor 28.

Next, as shown in FIG. 21-(A), the transparent plate 200 is adhered on the dicing tape 140 where the grooves 161 are formed so that the grooves 161 are covered by the transparent plate 200.

FIG. 21-(B) is an enlarged view of a part surrounded by a dotted line in FIG. 21-(A). By adhering the transparent plate 200 on the dicing tape 140, a part above the grooves 161 are covered with the dicing tape 140 so that a closed space of the grooves 161 is formed.

Next, as shown in FIG. 22-(A), the transparent plate 200 is cut, as corresponding to the grooves 161, by using the fourth cutting blade 175 whose cutting edge thickness "c" is less than the cutting edge thickness "b" of the third cutting blade 165.

FIG. 22-(B) is an enlarged view of a part surrounded by a dotted line in FIG. 22-(A).

The transparent plate 200 shown in FIG. 21 is cut and separated by the fourth cutting blade 175 so that plural cutting members 21 are formed. In addition, the piercing holes 171 of the dicing tape 140 are formed above the grooves 161.

Figure 33:
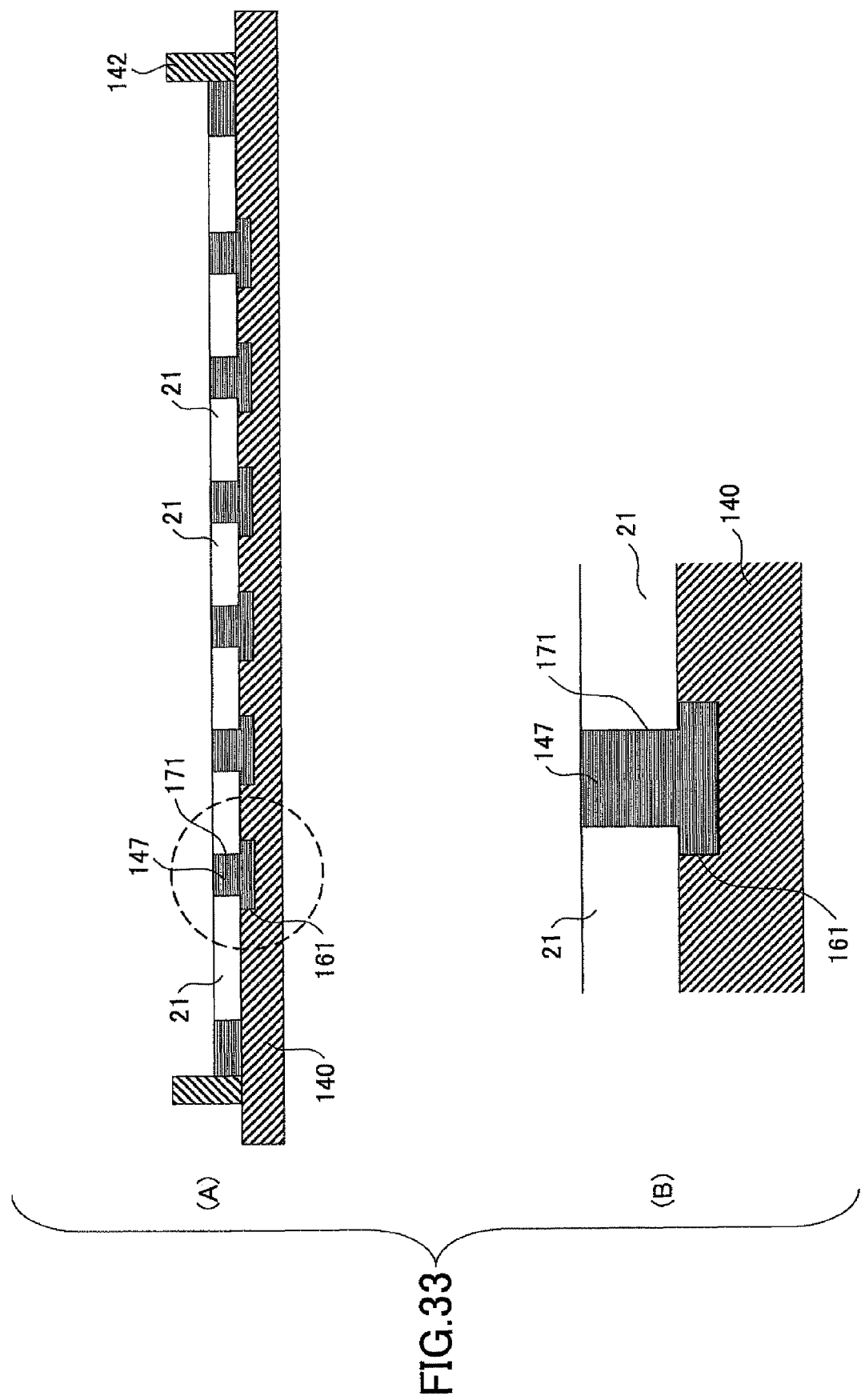
FIG. 33 is a view (part 1) for explaining a manufacturing method of the solid-state image sensing device shown in FIG. 5, of a tenth embodiment of the present invention.

Next, as shown in FIG. 33-(A), a dam 142 for being filled with the shock-absorbing part material 147 is provided on the dicing tape 140 so as to surround the arrangement of the transparent member 21.

After that, the groove 161 and the piercing hole 141 are concurrently (continuously) filled with the shock-absorbing part material 171 and the shock-absorbing part material 171 is cured.

FIG. 33-(B) is an enlarged view of a part surrounded by a dotted line in FIG. 33-(A).

The shock-absorbing part material 171 fills the piercing hole 171 and the groove 161 so as to reach the upper surface of the piercing hole 171, namely at a height the same as the upper surface of the transparent member 21.

Figure 34:
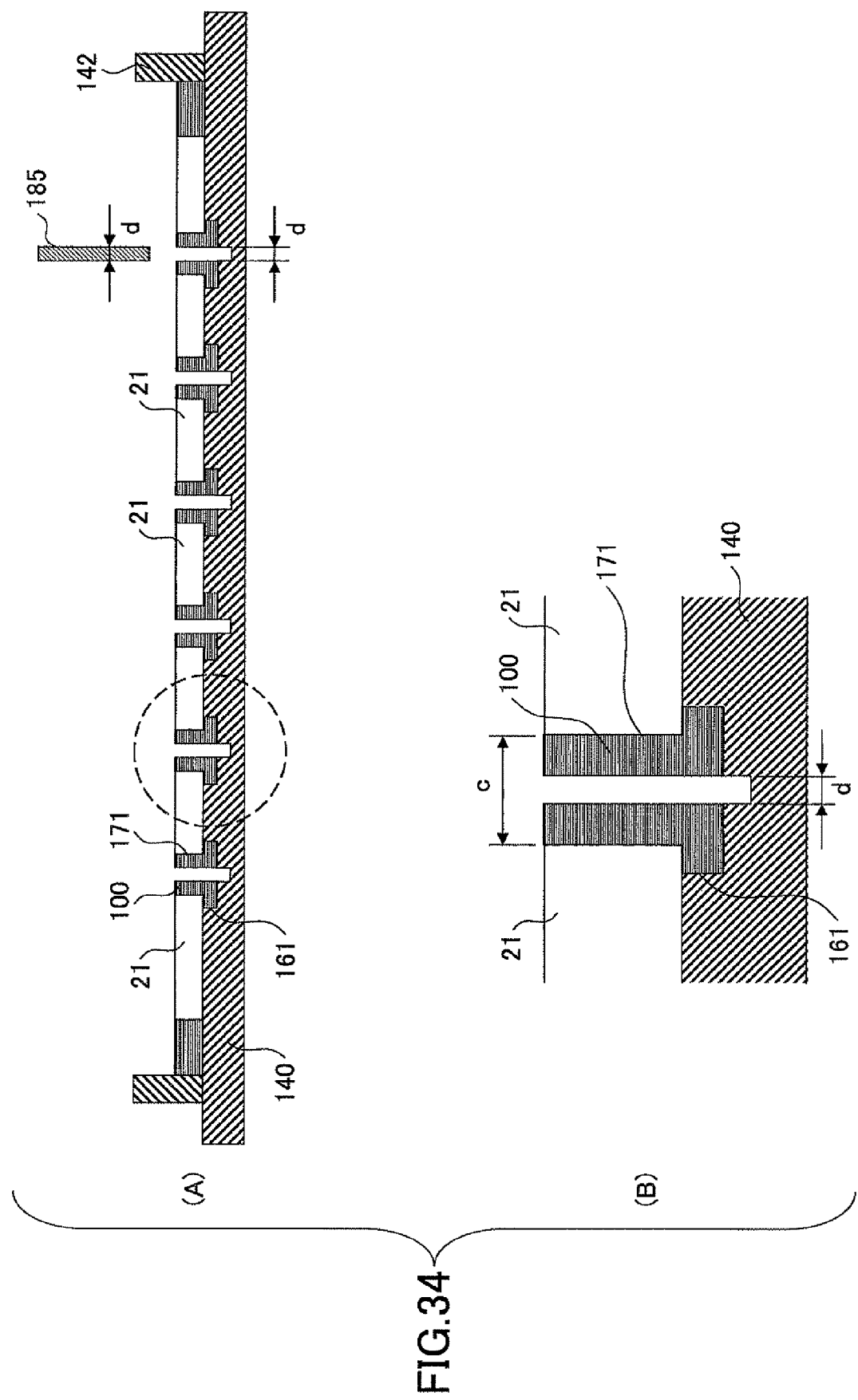
FIG. 34 is a view (part 2) for explaining a manufacturing method of the solid-state image sensing device shown in FIG. 5, of the ninth embodiment of the present invention.

Next, as shown in FIG. 34-(A), the shock-absorbing part material 147 is cut by using the fifth cutting blade 185 whose cutting edge thickness "d" is less than the cutting edge thickness "c" of the fourth cutting blade 175.

FIG. 34-(B) is an enlarged view of a part surrounded by a dotted line in FIG. 34-(A).

A cutting process using the fifth cutting blade 185 is implemented so that the shock-absorbing part material 147 filling in the piercing hole 171 and the groove 161 is pierced and the dicing tape 140 is cut.

As a result of this, the spacer material 167 filling in the groove 161 forms the shock-absorbing member 100 situated on the side surface circumference of the transparent member 21 and forms the spacer situated on another main surface of the transparent member 21.

Next, ultraviolet rays UV are irradiated from a lower surface side of the dicing tape 140.

As a result of this, the adhesive force of the dicing tape 140 is reduced and therefore the transparent member 21 can be easily peeled off from the dicing tape 140. Thus, plural transparent members 21 having structures shown in FIG. 35 can be obtained.

Figure 35:
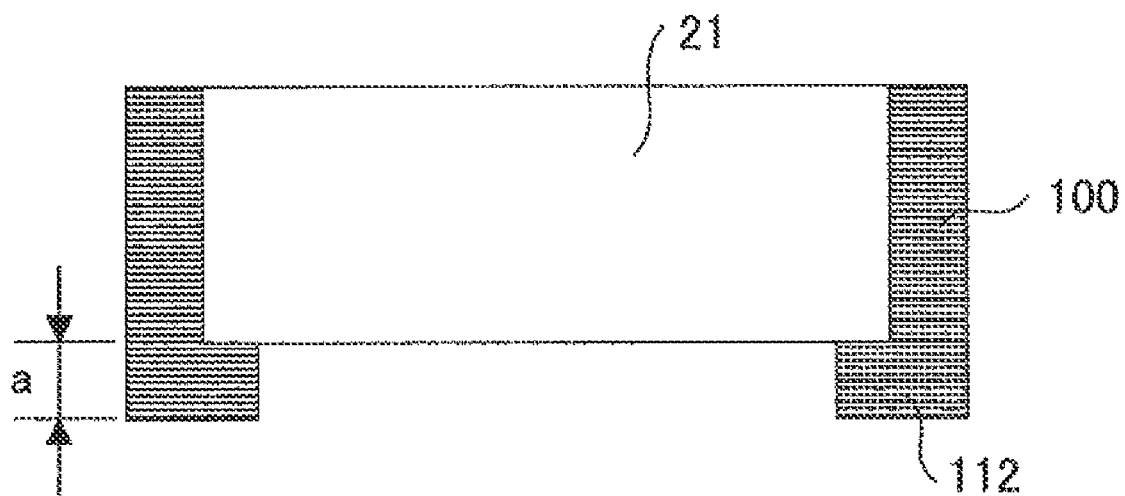
FIG. 35 is a view (part 3) for explaining a manufacturing method of the solid-state image sensing device shown in FIG. 5, of the ninth embodiment of the present invention.

As shown in FIG. 35, the circumferential side surface (edge surface) of the transparent member 21 is covered with the shock-absorbing member 100, and a spacer 112 having a thickness "a" and an extending part (wide width part) of the shock-absorbing member 100 are provided on a circumferential edge part of another main surface of the transparent member 21. The shock-absorbing member 100 and the spacer 112 are formed in a body.

Next, as discussed in the seventh embodiment with reference to FIG. 18, the transparent member 21 is provided and fixed on the light receiving surface of the solid-state image sensor 28 by heating and melting a contact part of the spacer 111 and the solid-state image sensor 28 or by applying another epoxy group adhesive to the contact part.

Next, as discussed in the seventh embodiment with reference to FIG. 19, an electrode of the solid-state image sensor 29 is connected to an electrode on the wiring board 24 by the bonding wire 27.

After that, the solid-state image sensing device 50 shown in FIG. 5 is formed via a sealing process using the sealing resin 25, a process for forming an outside connection terminal on another main surface of the wiring board 24, and a packing process using the sealing resin 25 (not shown).

According to the manufacturing method of this embodiment, the shock-absorbing member 100 provided between the circumferential side surface (edge surface) of the transparent member 21 and the sealing resin 25 and the spacer 112 provided between the transparent member 21 and the solid-state image sensor 20 are made of the same material and formed in a body. Therefore, it is possible to reduce the number of processes and the cost for manufacturing the solid-state image sensing device 50.

Next, a manufacturing method of the solid-state image sensing device 70 shown in FIG. 7 is discussed as an eleventh embodiment of the present invention with reference to FIG. 12, FIG. 13, and FIG. 36 through FIG. 39.

In the solid-state image sensing device 70, the first shock-absorbing member 100 and the second shock-absorbing member 101 whose Young's modulus is different from that of the first shock-absorbing member 100 are between the sealing resin 25 and a circumferential side surface (edge surface) of the transparent member 21.

Referring to FIG. 12-(A), a cutting process using a first cutting blade 145 having a cutting edge thickness "e" is applied to a transparent plate adhered on the main surface of a dicing tape 140 and the dicing tape 140, so that the transparent member is divided into plural transparent members 21 by piercing holes 141 and plural grooves 148 are formed in the dicing tape 140.

FIG. 12-(B) is an enlarged view of a part surrounded by a dotted line in FIG. 12-(A).

The transparent plate is pierced and cut by the first cutting blade 145 such as a diamond blade (diamond saw) rotated at high speed so that the piercing hole 141 is formed. In addition, the dicing tape 140 is cut to a separate depth "a" between the transparent member 21 and the solid-state image sensor 28 shown in FIG. 2, namely a height "a" of the space formed between the transparent member 21 and the solid-state image sensor 28, so that the groove 148 is formed.

Next, as shown in FIG. 13.-(A), the piercing hole 141 and the groove 148 are filled with a material of the shock-absorbing member 100 (hereinafter "shock-absorbing part material") 147.

At this time, a dam 142 is provided on the dicing tape 140 so as to surround the arrangement of the transparent member 21 in advance and therefore the shock-absorbing part material 147 is provided at the circumferential side surface (edge surface) of the transparent member 21 situated at the outermost of the arrangement of the transparent member 21.

After that, the piercing hole 141 and the groove 148 are filled with the shock-absorbing part material 147. Details of the shock-absorbing part material 147 are as discussed above.

FIG. 13.-(B) is an enlarged view of a part surrounded by a dotted line in FIG. 13.-(A).

Figure 36:
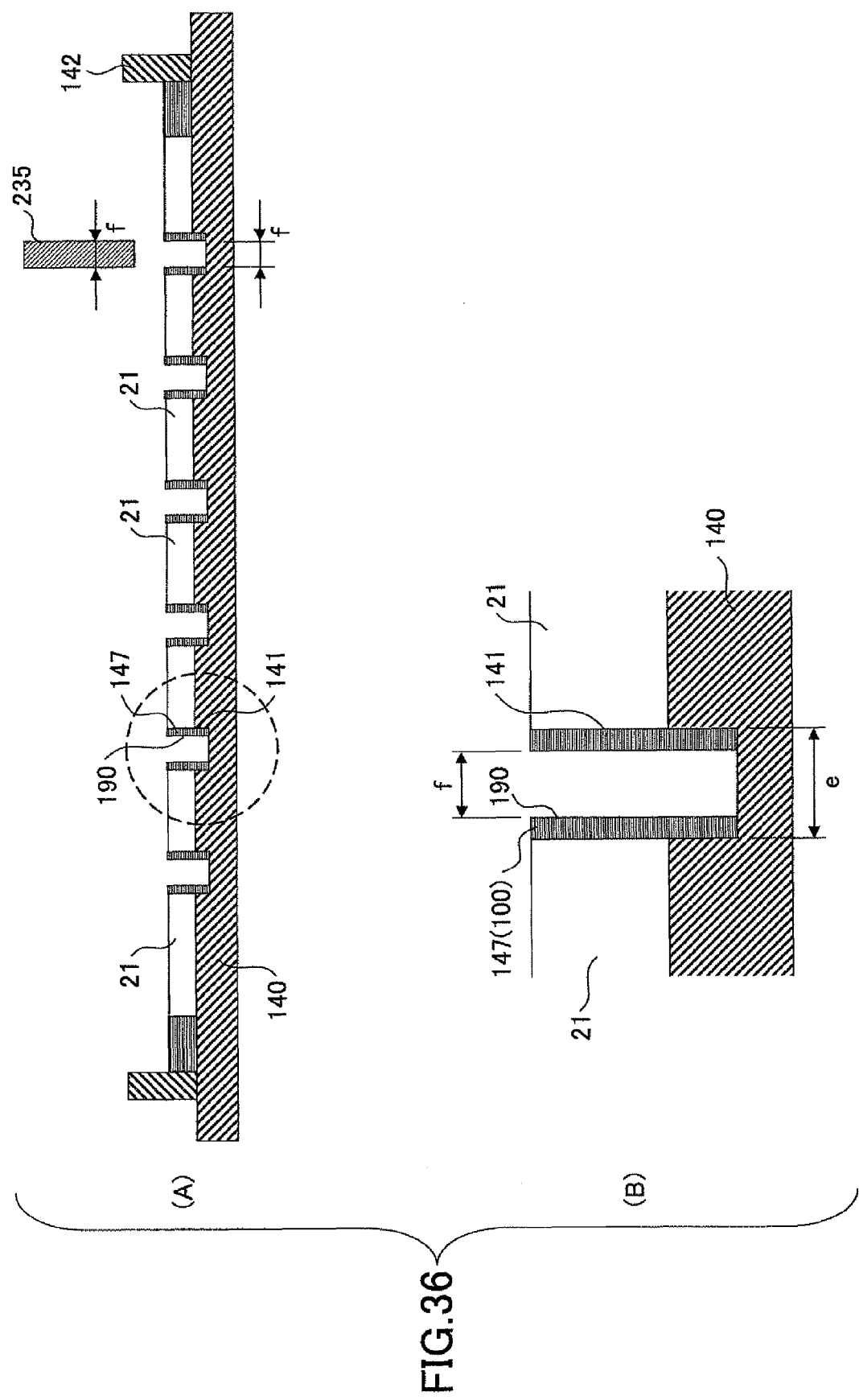
FIG. 36 is a view (part 1) for explaining a manufacturing method of the solid-state image sensing device shown in FIG. 7, of an eleventh embodiment of the present invention.

Next, as shown in FIG. 36.-(A), the shock-absorbing part material 147 filling in the groove 141 is cut by using the sixth cutting blade 235 whose cutting edge thickness "f" is less than the cutting edge thickness of the first cutting blade 145.

FIG. 36.-(B) is an enlarged view of a part surrounded by a dotted line in FIG. 36.-(A).

As shown in FIG. 36.-(B), the circumferential side surface (edge surface) of the transparent member 21 and the inside surface of the groove 148 formed in the dicing tape 140 are covered with the first shock-absorbing part material 100. A second groove 190 having a width "f" is formed between the first shock-absorbing part materials 100 neighboring each other.

Figure 37:
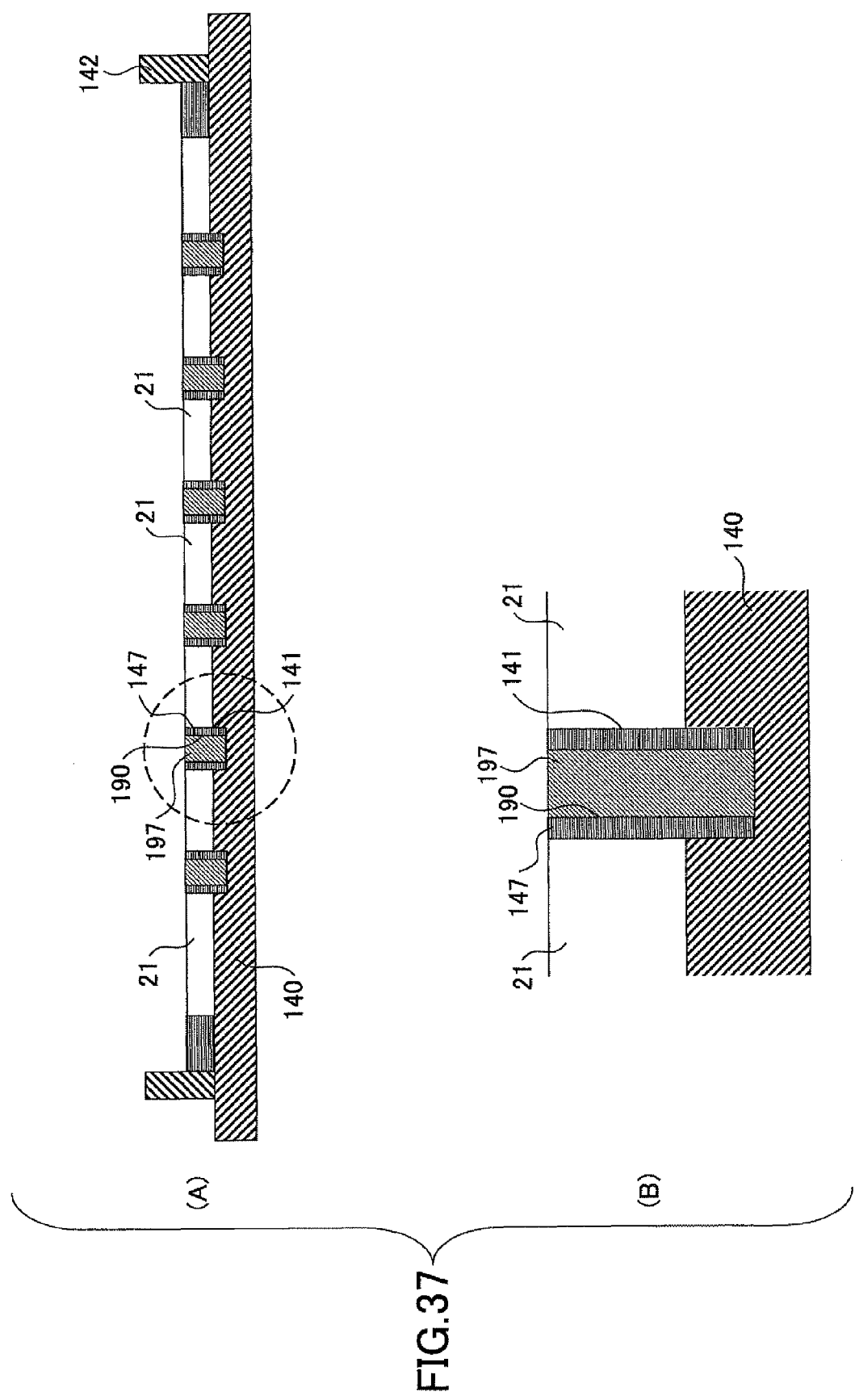
FIG. 37 is a view (part 2) for explaining a manufacturing method of the solid-state image sensing device shown in FIG. 7, of the eleventh embodiment of the present invention.

Next, as shown in FIG. 37.-(A), the second groove 190 is filled with a material of the second shock-absorbing member (hereinafter "second shock-absorbing part material") 197.

FIG. 37.-(B) is an enlarged view of a part surrounded by a dotted line in FIG. 37.-(A).

The second shock-absorbing part material 197 filling in the second groove 190 is cured. Details of the shock-absorbing part material 147 and second shock-absorbing part material 197 are as discussed above.

Figure 38:
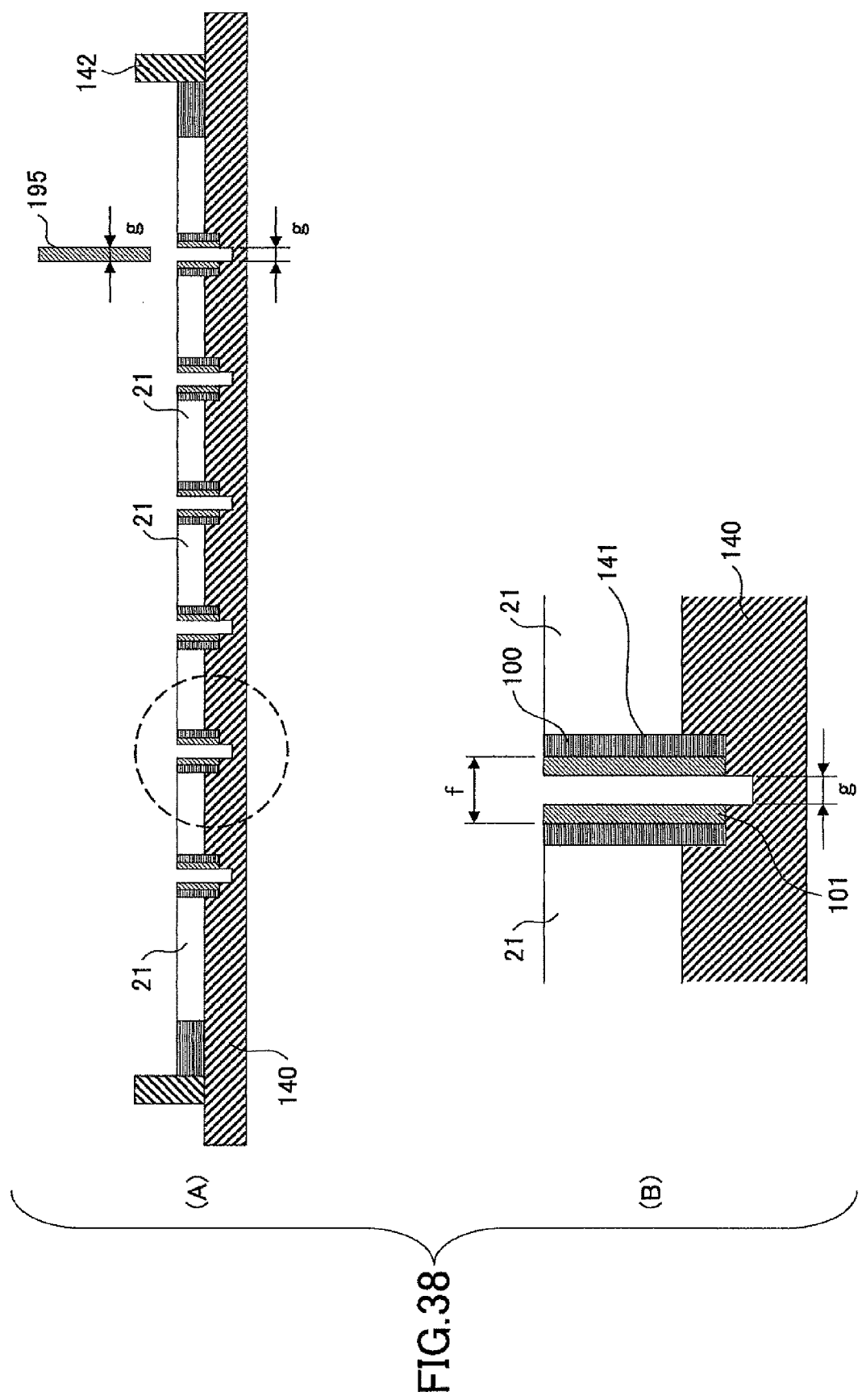
FIG. 38 is a view (part 3) for explaining a manufacturing method of the solid-state image sensing device shown in FIG. 7, of the eleventh embodiment of the present invention.

Next, as shown in FIG. 38.-(A), the second shock-absorbing part material 197 is cut by using the seventh cutting blade 195 whose cutting edge thickness "g" is less than the cutting edge thickness of the sixth cutting blade 235.

FIG. 38.-(B) is an enlarged view of a part surrounded by a dotted line in FIG. 38.-(A).

A cutting process using the seventh cutting blade 195 is implemented so that the second shock-absorbing part material 197 filling in the second groove 195 is pierced and the dicing tape 140 is cut, and thereby the second shock-absorbing part 101 is formed.

Next, ultraviolet rays UV are irradiated from a lower surface side of the dicing tape 140.

As a result of this, the adhesive force of the dicing tape 140 is reduced and therefore the transparent member 21 can be easily peeled off from the dicing tape 140. Thus, plural transparent members 21 having structures shown in FIG. 39 can be obtained.

Figure 39:
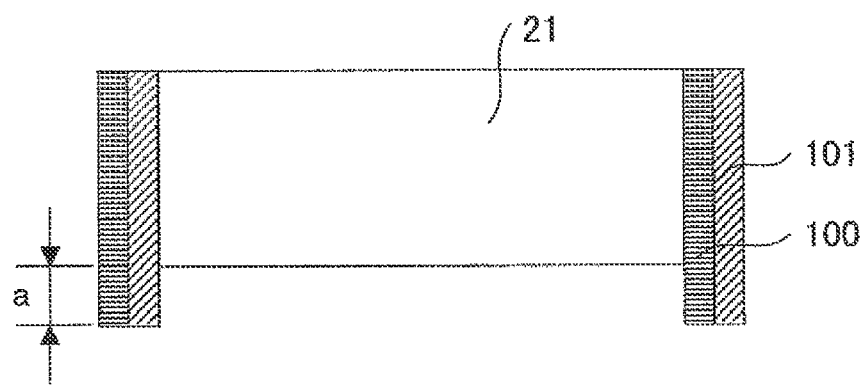
FIG. 39 is a view (part 4) for explaining a manufacturing method of the solid-state image sensing device shown in FIG. 7, of an eleventh embodiment of the present invention.

As shown in FIG. 39, the circumferential side surface (edge surface) of the transparent member 21 is covered with the first shock-absorbing member 100 and the second shock-absorbing member 101, and a double extending part (wide width part) having thickness "a" of the shock-absorbing members 100 and 101 are provided on a circumferential edge part of another main surface of the transparent member 21.

Next, as discussed in the seventh embodiment with reference to FIG. 18, the transparent member 21 is provided and fixed on the light receiving surface of the solid-state image sensor 28 by heating and melting a contact part of the spacer 111 and the solid-state image sensor 28 or by applying another epoxy group adhesive to the contact part.

Next, as discussed in the seventh embodiment with reference to FIG. 19, an electrode of the solid-state image sensor 29 is connected to an electrode on the wiring board 24 by the bonding wire 27.

After that, the solid-state image sensing device 50 shown in FIG. 5 is formed via a sealing process using the sealing resin 25, a process for forming an outside connection terminal on another main surface of the wiring board 24, and a packing process using the sealing resin 25 (not shown).

According to the manufacturing method of this embodiment, it is possible to obtain the same effect as the above-discussed other embodiments.

Figure 40:
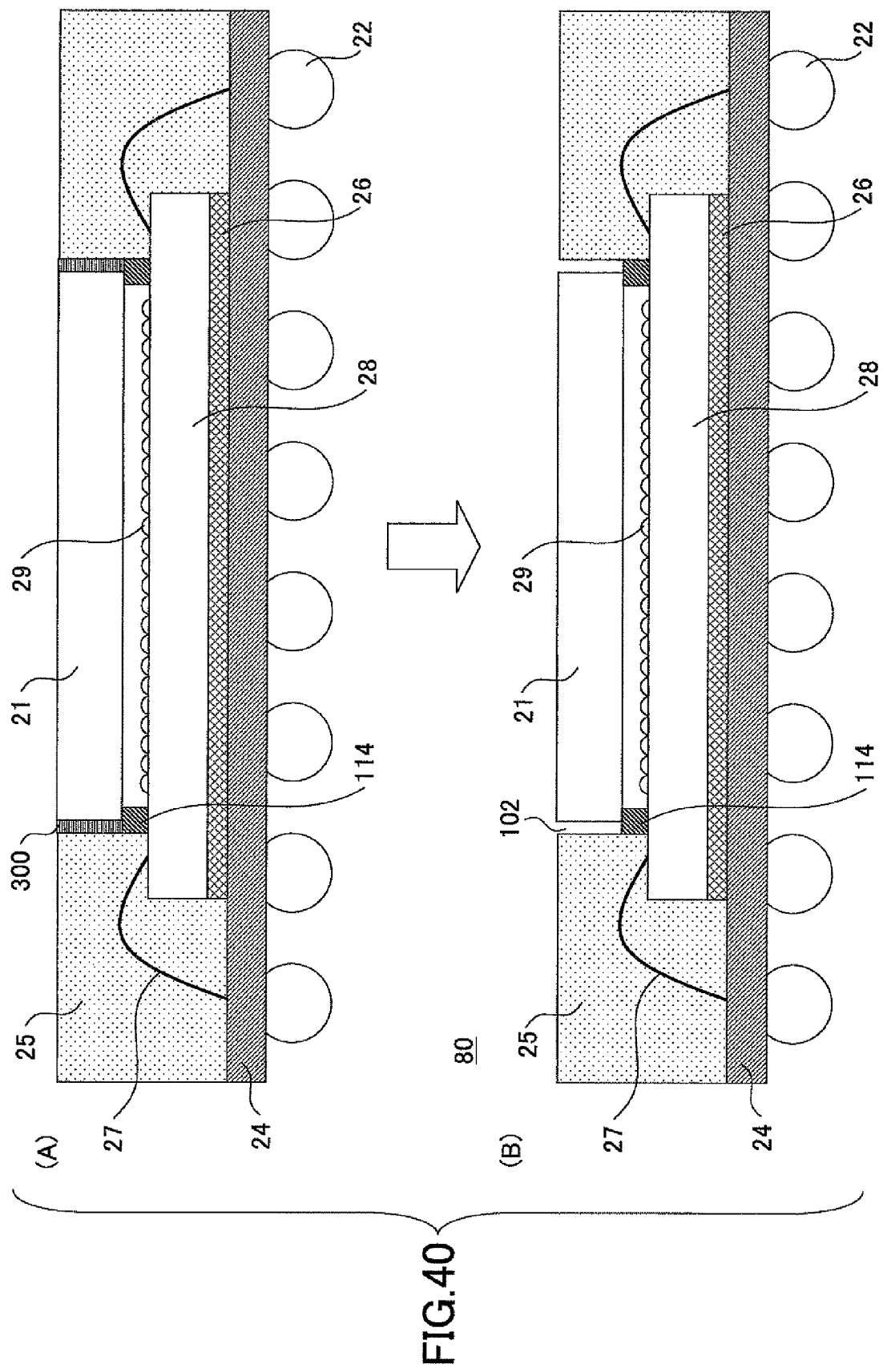
FIG. 40 is a view for explaining a manufacturing method of the solid-state image sensing device shown in FIG. 8, of a twelfth embodiment of the present invention.

Next, a manufacturing method of the solid-state image sensing device 80 shown in FIG. 8 is discussed as a twelfth embodiment of the present invention with reference to FIG. 40.

In the solid-state image sensing device 80 shown in FIG. 8, the shock-absorbing member 100 is not provided between the sealing resin 25 and the circumferential side surface (edge surface) of the transparent member 21. Instead, a groove-shaped air space 102 is formed along the circumferential side surface (edge surface) of the transparent member 21 between the sealing resin 25 and the circumferential side surface (edge surface) of the transparent member 21.

The manufacturing method of the solid-state image sensing device 80 is a modified method of the manufacturing method of the solid-state image sensing device 40 that is the eighth embodiment of the present invention.

In the eighth embodiment, in the process shown in FIG. 24, the piercing hole is filled with the shock-absorbing part material 147. On the other hand, in the twelfth embodiment, as shown in FIG. 40.-(A), the piercing hole 171 is filled with the resist 300 and the resist 300 is cured. Other than this process, the same processes as the processes of the eighth embodiment are applied.

After the packing process using the sealing resin 25, the resist 300 is removed by a solvent. As a result of this, as shown in FIG. 40.-(B), the groove-shaped air space 102 is formed between the sealing resin 25 and the circumferential side surface (edge surface) of the transparent member 21.

According to the manufacturing method of this embodiment, it is possible to form the solid-state image sensing device 80 at low cost by using the cutting blades having different cutting edge widths and/or changing the dicing condition.

It is also possible to easily form the air space 102 between the circumferential side surface (edge surface) of the transparent member 21 and the sealing resin 25 by removing the resist 300 filling in the piercing hole 171.

Figure 41:
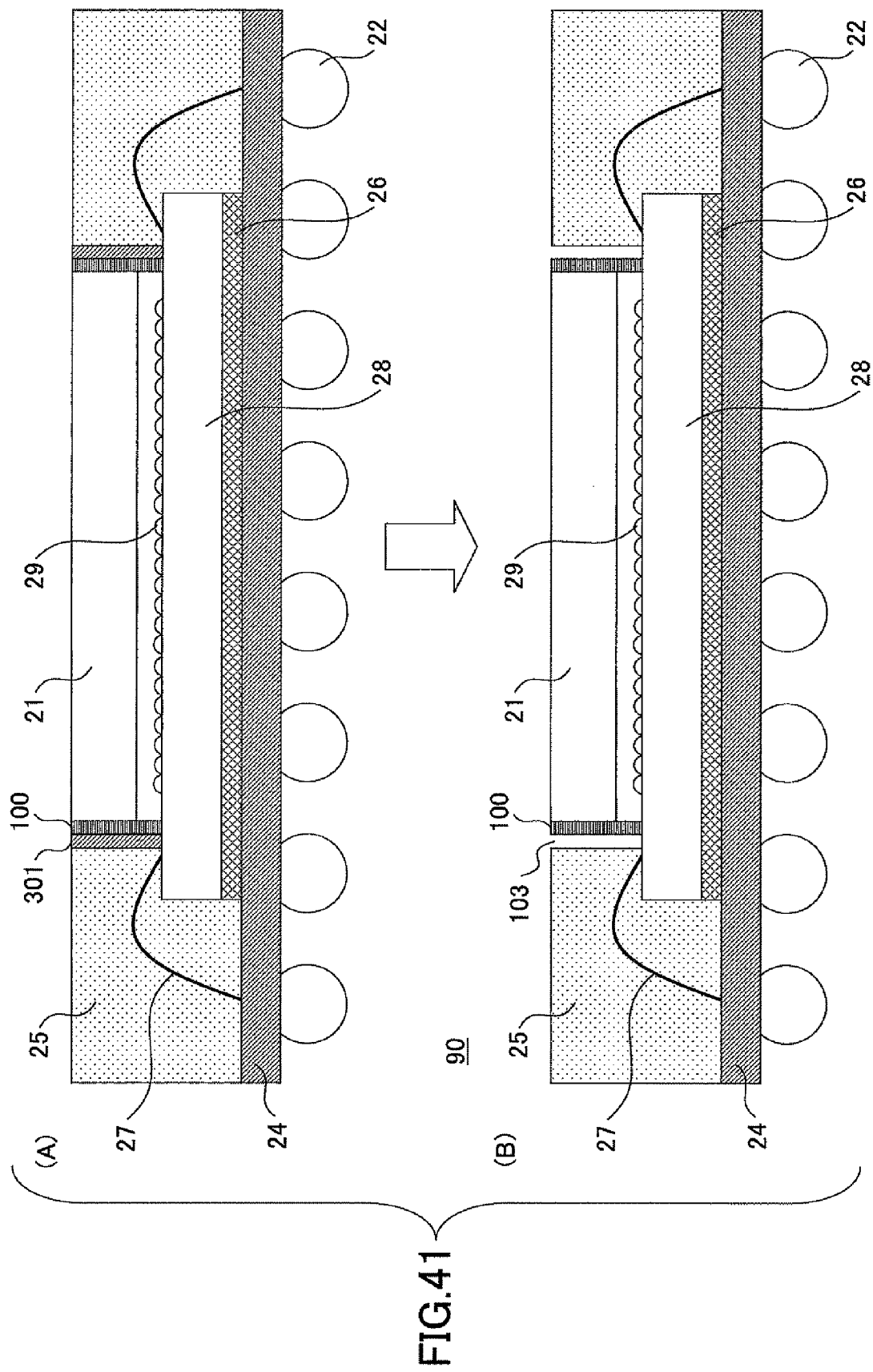
FIG. 41 is a view for explaining a manufacturing method of the solid-state image sensing device shown in FIG. 9, of a thirteenth embodiment of the present invention.

Next, a manufacturing method of the solid-state image sensing device 90 shown in FIG. 9 is discussed as a thirteenth embodiment of the present invention with reference to FIG. 41.

In the solid-state image sensing device 90 shown in FIG. 9, the second shock-absorbing part material 102 provided in the solid-state image sensing device 70 shown in FIG. 7 is not provided. Instead, groove-shaped air space 103 is formed between the sealing resin 25 and the shock-absorbing part material 100.

The manufacturing method of the solid-state image sensing device 90 is a modified method of the manufacturing method of the solid-state image sensing device 70 that is the eleventh embodiment of the present invention.

In the eleventh embodiment, after the processes shown in FIG. 12, FIG. 13 and FIG. 36, in the process shown in FIG. 37-(A), the second groove 190 is filled with the shock-absorbing part material 197 being a material of the second shock-absorbing member 102.

In this embodiment, as shown in FIG. 41-(A), instead of the shock-absorbing part material 197, a resist fills in the second groove 190 and is cured. Other than this process, the same processes as the processes of the eleventh embodiment are applied.

After the packing process using the sealing resin 25, the resist 301 is removed by a solvent. As a result of this, as shown in FIG. 41-(B), the air space 103 is formed between the sealing resin 25 and the shock-absorbing part material 100 provided on the circumferential side surface (edge surface) of the transparent member 21.

According to the manufacturing method of this embodiment, it is possible to form the solid-state image sensing device 90 at low cost by using the cutting blades having different cutting edge widths and/or changing the dicing condition.

It is also possible to easily form the air space 103 between the sealing resin 25 and the shock-absorbing part material 100 provided on the circumferential side surface (edge surface) of the transparent member 21 by removing the resist 301 filling in the piercing hole 171.

Next, a manufacturing method of the solid-state image sensing device 120 shown in FIG. 10 is discussed as a fourteenth embodiment of the present invention with reference to FIG. 42 through FIG. 46.

In the solid-state image sensing device 120 shown in FIG. 10, an external circumferential side surface of the transparent member 210 is tilted upward toward the center of the transparent member 210. In addition, the shock-absorbing member 100 is provided along the inclination of the transparent member 210 between the sealing resin 25 and the transparent member 210.

Figure 42:
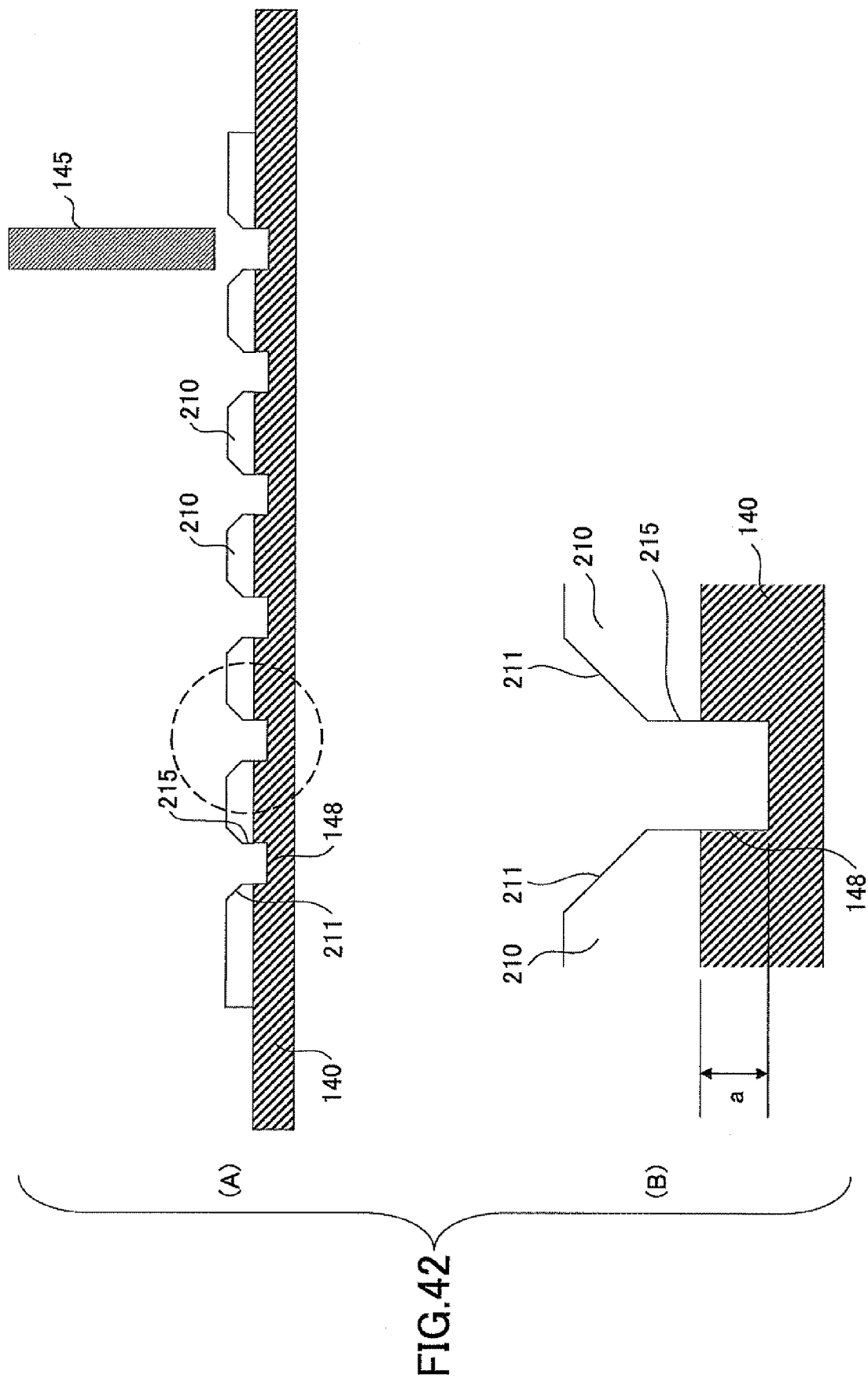
FIG. 42 is a view (part 1) for explaining a manufacturing method of the solid-state image sensing device shown in FIG. 10, of a fourteenth eighth embodiment of the present invention.

Referring to FIG. 42-(A), in this embodiment, a transparent plate, which is adhered on the dicing tape 140, and the dicing tape 140 are cut by the first dicing blade at a designated depth so that plural transparent members 210 are formed. As a result of this, the grooves 148 reaching into the dicing tape 140 are formed at the circumference of the transparent members 210.

When the transparent member 210 is formed, before or after cutting by the first cutting blade, the transparent member 210 is cut as corresponding to the groove 148 by using another cutting blade (not shown) wherein the cutting surface is an inclination surface (taper), so that a taper part 211 is formed on the circumferential side surface (edge surface) of the transparent member 210. The depth of the taper part 211 does not reach from the surface to the bottom surface of the transparent member 210. A cutting part by the cutting blade 145 is formed at a lower part of the transparent member 210, namely in the vicinity of the dicing tape 140.

In the meantime, FIG. 42-(A) shows a state where the taper is not formed at the external circumferential part of the transparent member situated at an outermost past of the arrangement of the transparent members 210. However, as discussed above, if the outermost transparent member has a measurement or configuration capable for being used, a taper is formed at the external circumferential part of the transparent member situated at an outermost past of the arrangement of the transparent members 210.

FIG. 42-(B) is an enlarged view of a part surrounded by a dotted line in FIG. 42-(A).

The transparent plate is pierced and cut by the first cutting blade 145 so that the piercing hole 215 is formed. In addition, the dicing tape 140 is cut at a separate distance "a" between the transparent member 210 and the solid-state image sensor 28 shown in FIG. 10, namely a height "a" of the space formed between the transparent member 210 and the solid-state image sensor 28, so that the groove 148 is formed.

As discussed above, since the taper 211 is formed on the circumferential side surface (edge surface) of the transparent member 210, an upper part of the piercing hole 215 is opened larger than a lower part of the piercing hole 215.

Figure 43:
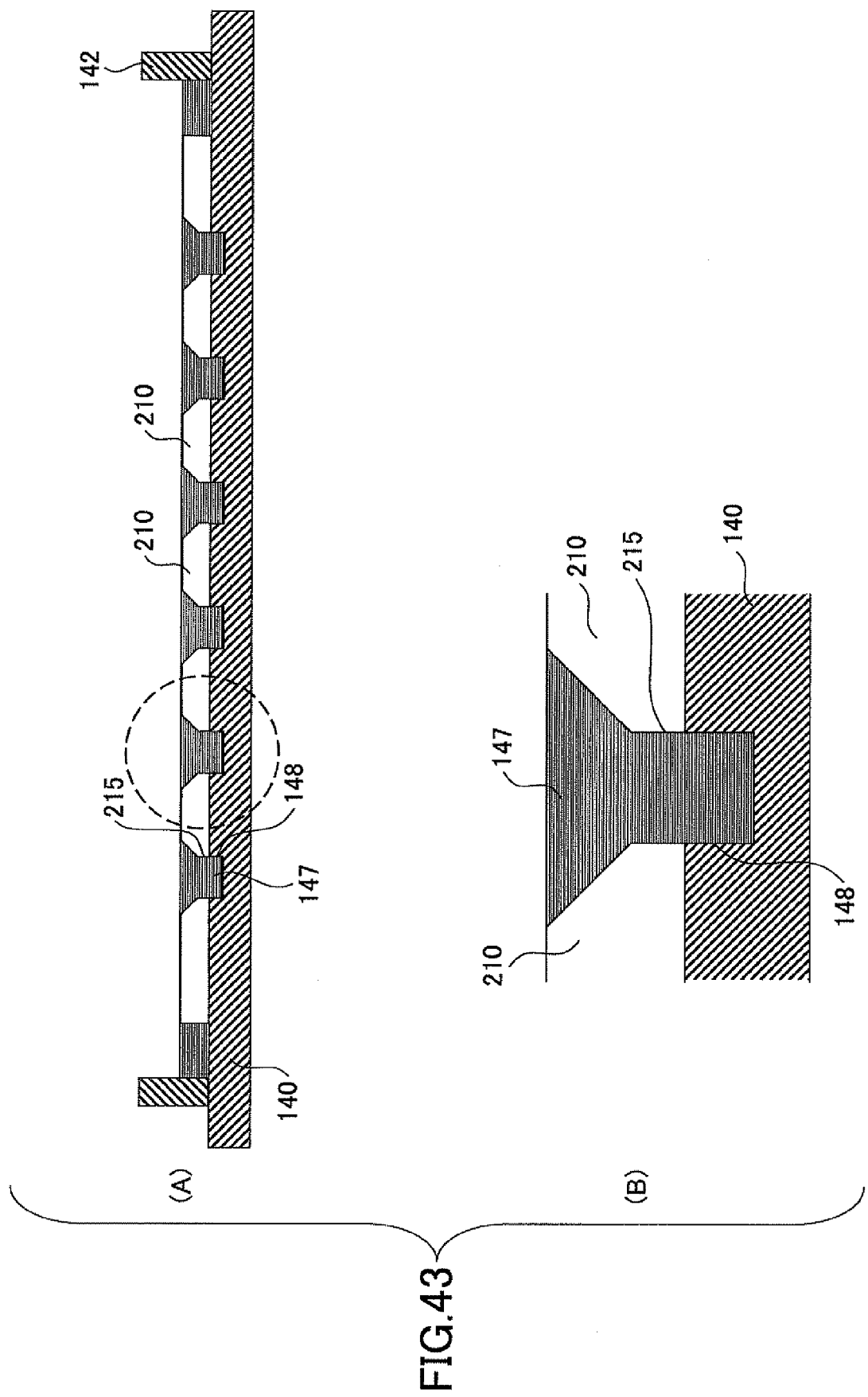
FIG. 43 is a view (part 2) for explaining a manufacturing method of the solid-state image sensing device shown in FIG. 10 of the fourteenth embodiment of the present invention.

Next, as shown in FIG. 43-(A), a dam 142 is provided on the dicing tape 140 so as to surround the arrangement of the transparent members 210 in advance. After that, the piercing hole 215 and the groove 148 are filled with the shock-absorbing part material 147.

FIG. 43-(B) is an enlarged view of a part surrounded by a dotted line in FIG. 43-(A).

The shock-absorbing part material 147 fills in the piercing hole 215 and the groove 148 at a height the same as an upper surface of the transparent member 210 and is cured.

Figure 44:
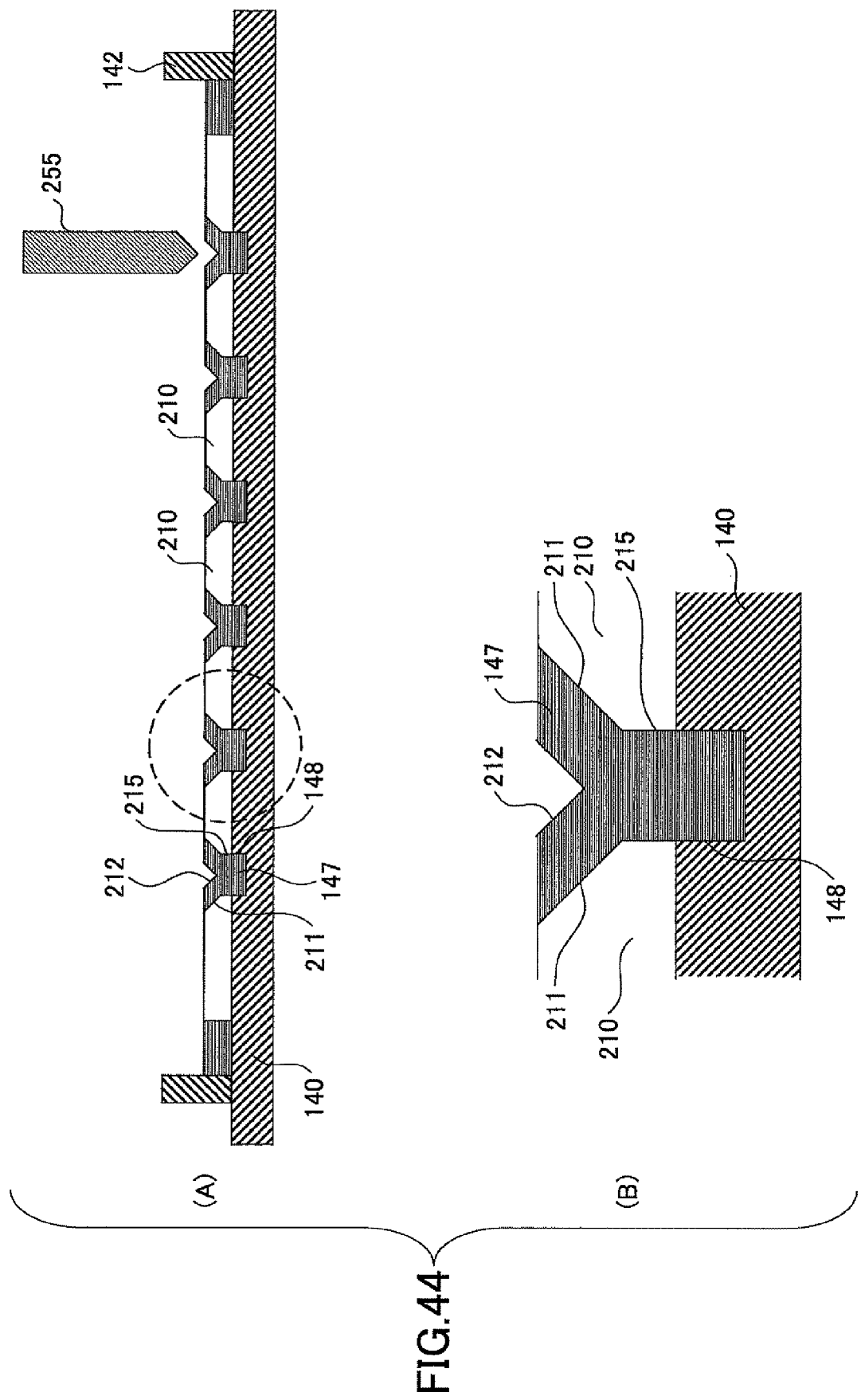
FIG. 44 is a view (part 3) for explaining a manufacturing method of the solid-state image sensing device shown in FIG. 10, of the fourteenth embodiment of the present invention.

Next, as shown in FIG. 44-(A), the surface part of the shock-absorbing part material 147 is cut by an eighth cutting blade 255 wherein a cutting edge thickness (width) of the eighth cutting blade 225 is smaller than that of the first cutting blade 145 and a taper having the same inclination angle as the taper part 211 of the transparent member 210 is formed at a head end of the eighth cutting blade 225.

FIG. 44-(B) is an enlarged view of a part surrounded by a dotted line in FIG. 44-(A).

As a result of the above-mentioned cutting by the eighth cutting blade 255, a V-shaped taper groove 212 is formed in the substantially center in the upper part of the shock-absorbing part material 147.

Figure 45:
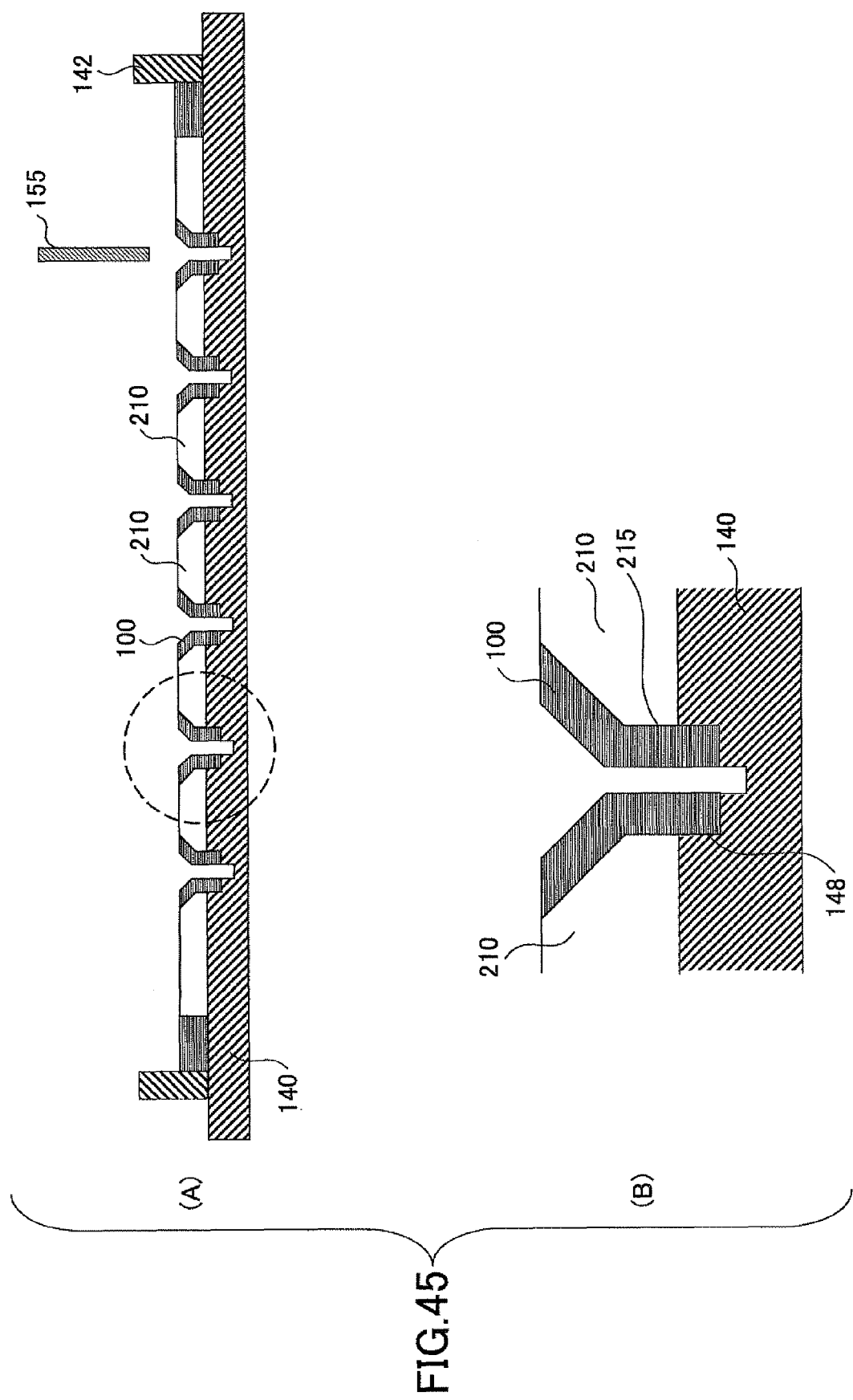
FIG. 45 is a view (part 4) for explaining a manufacturing method of the solid-state image sensing device shown in FIG. 10, of the fourteenth embodiment of the present invention.

Next, as shown in FIG. 45-(A), the shock-absorbing part material 147 is cut by using the second cutting blade 155 whose cutting edge thickness is less than the cutting edge thickness of the first cutting blade 145.

FIG. 45-(B) is an enlarged view of a part surrounded by a dotted line in FIG. 45-(A).

A cutting process using the second cutting blade 155 is implemented so that the shock-absorbing part material 147 (See FIG. 44) filling in the groove 141 is pierced and the dicing tape 140 is cut.

Next, ultraviolet rays UV are irradiated from a lower surface side of the dicing tape 140.

As a result of this, the adhesive force of the dicing tape 140 is reduced and therefore the transparent member 21 can be easily peeled off from the dicing tape 140. Thus, plural transparent members 210 having structures shown in FIG. 46 can be obtained.

Figure 46:
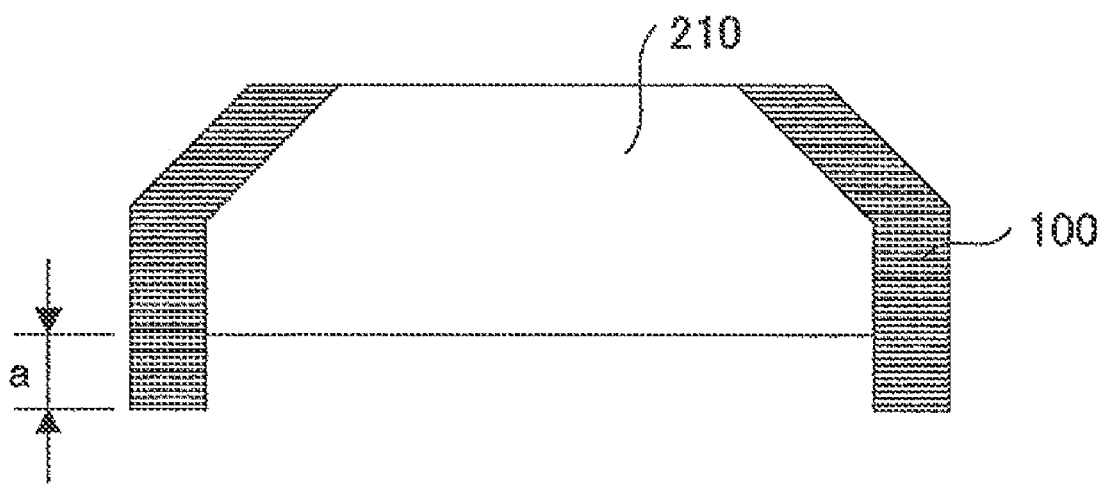
FIG. 46 is a view (part 5) for explaining a manufacturing method of the solid-state image sensing device shown in FIG. 10, of the fourteenth embodiment of the present invention.

Next, as shown in FIG. 46, the circumferential side surface (edge surface) including the inclination surface of the transparent member 210 is covered with the shock-absorbing member 104, and an extending part (wide width part) of the shock-absorbing member 104 is provided on a circumferential edge part of another main surface of the transparent member 21.

Next, as discussed in the seventh embodiment with reference to FIG. 18, the transparent member 210 is provided and fixed on the light receiving surface of the solid-state image sensor 28 by heating and melting a contact part of the spacer 111 and the solid-state image sensor 28 or by applying another epoxy group adhesive to the contact part.

Next, as discussed in the seventh embodiment with reference to FIG. 19, an electrode of the solid-state image sensor 29 is connected to an electrode on the wiring board 24 by the bonding wire 27.

After that, the solid-state image sensing device 70 shown in FIG. 7 is formed via a sealing process using the sealing resin 25, a process for forming an outside connection terminal on another main surface of the wiring board 24, and a packing process using the sealing resin 25 (not shown).

According to the manufacturing method of this embodiment, it is possible to form the solid-state image sensing device 120 at low cost by using the cutting blades having different cutting edge widths and/or changing the dicing condition.

Furthermore, it is possible to form the shock-absorbing member 104 along the circumferential side surface (edge surface) of the transparent member 210 by using the cutting blade wherein an inclination (taper) is formed at the head end.

According to the manufacturing method of this embodiment, it is possible to achieve the same effect as the above-discussed embodiments.

The present invention is not limited to these embodiments, but variations and modifications may be made without departing from the scope of the present invention.

For example, materials of the transparent member 21 or 210 and the solid-state image sensor 28 may be selected so that the coefficient of thermal expansion of the transparent member 21 or 210 is the same as the coefficient of thermal expansion of the solid-state image sensor 28. In a case where the spacer 110 provided between the transparent member 21 or 210 and the solid-state image sensor 28 is made of, for example, an adhesive, if the coefficient of thermal expansion of the transparent member 21 or 210 is different from the coefficient of thermal expansion of the solid-state image sensor 28, stress is concentrated on the adhesive, namely the spacer 110, so that the adhesive may be peeled off. However, it is possible to prevent the stress from being generated by making the coefficient of thermal expansion of the transparent member 21 or 210 equal to the coefficient of thermal expansion of the solid-state image sensor 28.

In addition, in the above-discussed embodiments, the solid-state image sensing device is explained as an example of the semiconductor device of the present invention, and the solid-state image sensor is explained as an example of the semiconductor element forming the semiconductor device of the present invention. However, the present invention is not limited to this.

The semiconductor element is not limited to the solid-state image sensor such as an image sensor but may be, for example, a fingerprint sensor using glass.

Furthermore, as long as a semiconductor device is packaged or forms a module by sealing the semiconductor element by using the sealing resin, the semiconductor device is not limited to the semiconductor devices of the above-mentioned embodiments. For example, the present invention can be applied to a semiconductor device such as an optical module or Erasable Programmable Read Only Memory (EPROM).

This patent application is based on Japanese Priority Patent Application No. 2005-330499 filed on Nov. 15, 2005, the entire contents of which are hereby incorporated by reference.

What is claimed is:

1. A manufacturing method of a semiconductor device, the semiconductor device including a semiconductor element and a transparent member separated from the semiconductor element by a designated length and facing the semiconductor element, the manufacturing method comprising the steps of:
   a) forming a piercing part in the transparent member adhered on an adhesive tape and forming a groove by cutting a part of the adhesive tape corresponding to the piercing part;
   b) filling in the piercing part and the groove with a material of a shock-absorbing part configured to ease a stress in the transparent member, and curing the material of the shock-absorbing part;
   c) cutting the material of the shock-absorbing part provided in the piercing part and the groove; and
   d) peeling off the transparent member from the adhesive tape.

* * * * *